(12) United States Patent
Takahashi et al.

(10) Patent No.: US 11,988,720 B2
(45) Date of Patent: May 21, 2024

(54) SEMICONDUCTOR DEVICE AND BATTERY PACK

(71) Applicant: Semiconductor Energy Laboratory Co., Ltd., Atsugi (JP)

(72) Inventors: Kei Takahashi, Isehara (JP); Takayuki Ikeda, Atsugi (JP); Ryota Tajima, Isehara (JP); Mayumi Mikami, Atsugi (JP); Yohei Momma, Isehara (JP); Munehiro Kozuma, Atsugi (JP); Takanori Matsuzaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 517 days.

(21) Appl. No.: 17/312,475

(22) PCT Filed: Dec. 13, 2019

(86) PCT No.: PCT/IB2019/060740
§ 371 (c)(1),
(2) Date: Jun. 10, 2021

(87) PCT Pub. No.: WO2020/128743
PCT Pub. Date: Jun. 25, 2020

(65) Prior Publication Data
US 2022/0052387 A1 Feb. 17, 2022

(30) Foreign Application Priority Data

Dec. 20, 2018 (JP) .................................. 2018-238529
Jul. 2, 2019 (JP) .................................. 2019-123810

(51) Int. Cl.
*G01R 31/392* (2019.01)
*H01M 10/44* (2006.01)
*H01M 10/48* (2006.01)
*H02J 7/00* (2006.01)
*H01L 29/786* (2006.01)

(52) U.S. Cl.
CPC .......... *G01R 31/392* (2019.01); *H01M 10/44* (2013.01); *H01M 10/48* (2013.01); *H02J 7/005* (2020.01);
(Continued)

(58) Field of Classification Search
CPC ...... G01R 31/392; H02J 7/005; H01M 10/44; H01M 10/48; H01M 2220/20; H01L 29/7869
(Continued)

(56) References Cited

U.S. PATENT DOCUMENTS 5,218,607 A 6/1993 Saito et al.
5,378,912 A 1/1995 Pein
(Continued)

FOREIGN PATENT DOCUMENTS

| EP | 3264120 A | 1/2018 |
| JP | 2011-004509 A | 1/2011 |
| JP | 2011-054413 A | 3/2011 |
| JP | 2014-166071 A | 9/2014 |
| WO | WO-2016/136788 | 9/2016 |

OTHER PUBLICATIONS

International Search Report (Application No. PCT/IB2019/060740) dated Mar. 3, 2020.
(Continued)

*Primary Examiner* — Nathaniel R Pelton
(74) *Attorney, Agent, or Firm* — Eric J. Robinson; Robinson Intellectual Property Law Office, P.C.

(57) ABSTRACT

A semiconductor device that detects deterioration of a secondary battery is provided. The semiconductor device includes a power gauge, an anomalous current detection circuit, and a control circuit. The power gauge includes a current divider circuit and an integrator circuit. The anomalous current detection circuit includes a first memory, a second memory, and a first comparator. The integrator circuit can convert a detection current detected at the current
(Continued)

divider circuit into a detection voltage by integrating the detection current. The anomalous current detection circuit is supplied with the detection voltage, a first signal at a first time, and a second signal at a second time. The first signal can make the detection voltage at the first time be stored in the first memory and the second signal can make the detection voltage at the second time be stored in the second memory. The first comparator outputs a change from the detection voltage at the first time to the detection voltage at the second time as a first output signal to the control circuit.

8 Claims, 34 Drawing Sheets

(52) U.S. Cl.
CPC ..... *H01L 29/7869* (2013.01); *H01M 2220/20* (2013.01)

(58) Field of Classification Search
USPC .......................................... 320/159
See application file for complete search history.

(56) References Cited

U.S. PATENT DOCUMENTS

| | | |
|---|---|---|
| 5,498,988 A | 3/1996 | Reyes et al. |
| 5,731,856 A | 3/1998 | Kim et al. |
| 5,744,864 A | 4/1998 | Cillessen et al. |
| 5,936,879 A | 8/1999 | Brouwer et al. |
| 6,046,606 A | 4/2000 | Chu et al. |
| 6,294,274 B1 | 9/2001 | Kawazoe et al. |
| 6,563,174 B2 | 5/2003 | Kawasaki et al. |
| 6,639,827 B2 | 10/2003 | Clark et al. |
| 6,727,522 B1 | 4/2004 | Kawasaki et al. |
| 6,775,180 B2 | 8/2004 | Biyani et al. |
| 7,061,014 B2 | 6/2006 | Hosono et al. |
| 7,105,868 B2 | 9/2006 | Nause et al. |
| 7,211,825 B2 | 5/2007 | Shih et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,087 B2 | 11/2008 | Iwasaki |
| 7,501,293 B2 | 3/2009 | Ito et al. |
| 7,612,594 B2 | 11/2009 | Fukuoka |
| 7,626,434 B2 | 12/2009 | Aksamit |
| 7,674,650 B2 | 3/2010 | Akimoto et al. |
| 8,053,836 B2 | 11/2011 | Yeh et al. |
| 8,188,477 B2 | 5/2012 | Miyairi et al. |
| 8,362,478 B2 | 1/2013 | Yamazaki et al. |
| 10,379,170 B2 | 8/2019 | Nagaoka et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0051574 A1 | 3/2004 | Ko et al. |
| 2004/0090256 A1 | 5/2004 | Cho |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119406 A1 | 6/2006 | Henzler et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara. et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0085585 A1 | 4/2007 | Frederick |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0218234 A1 | 9/2008 | Jain |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315932 A1 | 12/2008 | Tower et al. |
| 2009/0073325 A1 | 3/2009 | Kuwabara et al. |
| 2009/0108896 A1 | 4/2009 | Yasuda et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189664 A1 | 7/2009 | Remington |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0252832 A1 | 10/2010 | Asano et al. |
| 2011/0248759 A1 | 10/2011 | Chi et al. |
| 2011/0267009 A1 | 11/2011 | Nakatsuji et al. |
| 2012/0132910 A1 | 5/2012 | Yamazaki et al. |
| 2012/0161868 A1 | 6/2012 | Yayama et al. |
| 2012/0170355 A1 | 7/2012 | Ohmaru et al. |
| 2012/0229187 A1 | 9/2012 | Choudhury et al. |
| 2013/0162197 A1 | 6/2013 | Takahashi et al. |
| 2013/0222033 A1 | 8/2013 | Kato et al. |
| 2013/0229218 A1 | 9/2013 | Nishijima |
| 2013/0242639 A1 | 9/2013 | Koyama |
| 2013/0265010 A1 | 10/2013 | Nomura et al. |
| 2013/0293138 A1 | 11/2013 | Takahashi |
| 2014/0009198 A1 | 1/2014 | Ohmaru |
| 2014/0009199 A1 | 1/2014 | Ohmaru et al. |
| 2014/0126271 A1 | 5/2014 | Aoki et al. |
| 2015/0034945 A1 | 2/2015 | Sakakura et al. |
| 2017/0315176 A1* | 11/2017 | Yanagawa .......... G01R 31/3835 |
| 2018/0038918 A1* | 2/2018 | Nagaoka ................... H02J 7/00 |

OTHER PUBLICATIONS

Written Opinion (Application No. PCT/IB2019/060740) dated Mar. 3, 2020.

(56) References Cited

OTHER PUBLICATIONS

Xu.J et al., "Coupling Effect of State-of-Health and State-of-Charge on the Mechanical Integrity of Lithium-Ion Batteries", Experimental Mechanics, Mar. 12, 2018, vol. 58, No. 4, pp. 633-643.
Wu.H et al., "Improving battery safety by early detection of internal shorting with a bifunctional separator", Nature Communications, Oct. 13, 2014, vol. 5, pp. 5193-1-5193-6.

* cited by examiner

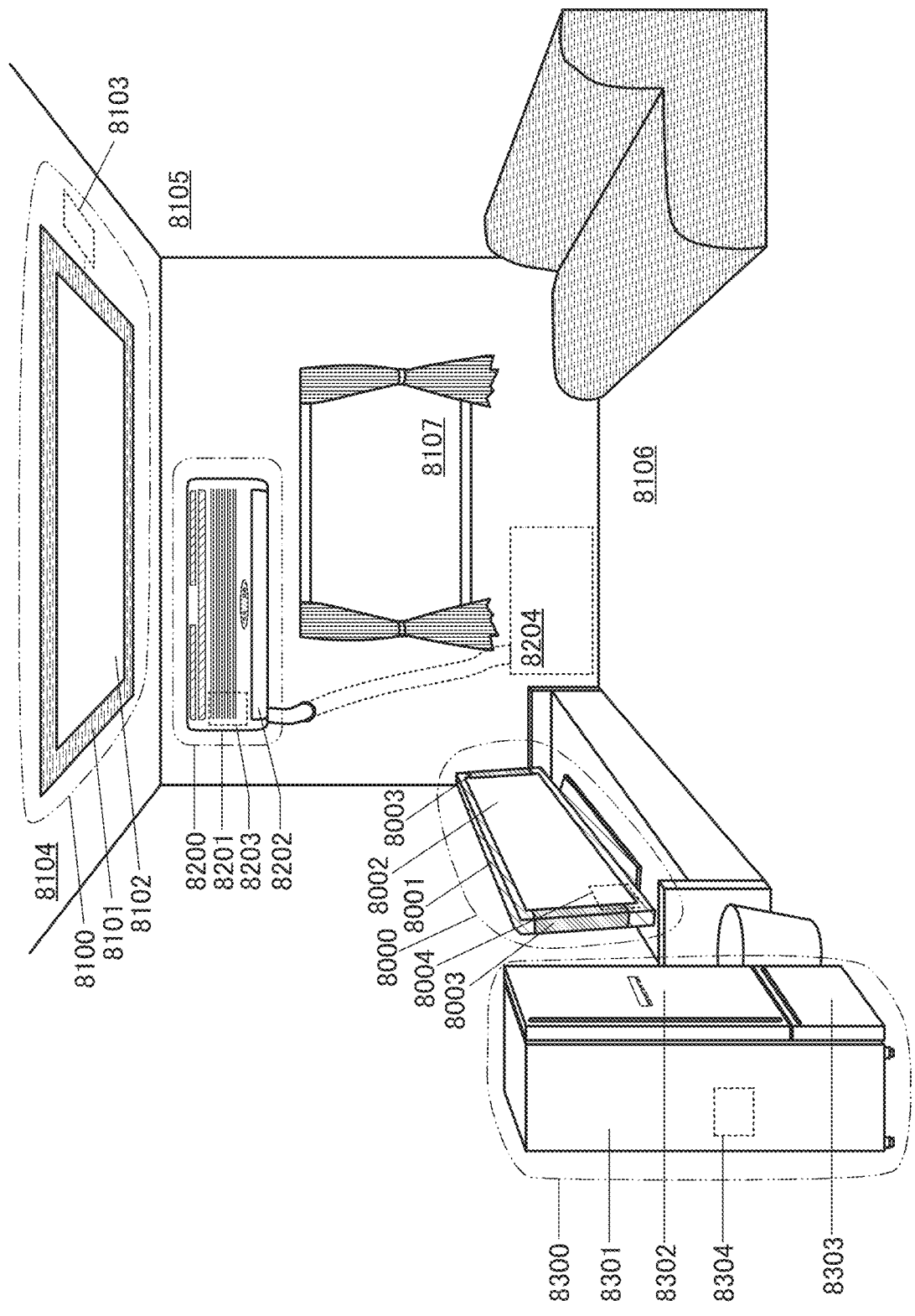

SEMICONDUCTOR DEVICE AND BATTERY PACK

TECHNICAL FIELD

One embodiment of the present invention relates to a semiconductor device and a method of operating the semiconductor device. One embodiment of the present invention relates to a charge control circuit, an anomaly detection circuit, a secondary battery control system, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an imaging device, an electronic device, and the like are referred to as a semiconductor device in some cases.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry for portable information terminals such as mobile phones, smartphones, tablets, or laptop computers; game machines; portable music players; digital cameras; medical equipment; next-generation clean energy vehicles such as hybrid electric vehicles (HEVs), electric vehicles (EVs), and plug-in hybrid electric vehicles (PHEVs); electric bikes; or the like, and lithium-ion secondary batteries have become essential as rechargeable energy supply sources for modern information societies.

Patent Document 1 discloses a charge control circuit capable of reducing deterioration of a secondary battery during constant current charging by CCCV (Constant Current Constant Voltage) charging.

REFERENCE

Patent Document

[Patent Document 1] Japanese Published Patent Application No. 2011-4509

SUMMARY OF THE INVENTION

Problems to be Solved by the Invention

Patent Document 1 discloses a charge control circuit which reduces deterioration of a secondary battery during charging by CCCV charging. However, it is known that a secondary battery deteriorates due to repetitions of charging and discharging. In addition, it is known that a secondary battery suffers anomalies such as a micro short-circuit due to repetitions of charging and discharging.

An object of one embodiment of the present invention is to provide a semiconductor device or the like that detects anomalies of a secondary battery by monitoring charging characteristics of a secondary battery. Another object is to provide a semiconductor device with reduced power consumption. Another object is to provide a semiconductor device that has excellent sensing accuracy on charging characteristics, or the like. Another object is to provide a semiconductor device which stably operates, or the like. Another object is to provide a semiconductor device with high reliability, or the like. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

First, charging and discharging methods of a secondary battery are briefly described. Charging and discharging of a secondary battery can be performed in the following manner, for example.

<CC Charging>

First, constant current (CC) charging, one of charging methods, is described. CC charging is a charging method in which a constant current flows to a secondary battery in the whole charging period and charging is stopped when the voltage reaches a predetermined voltage. The secondary battery is assumed to be an equivalent circuit with internal resistance R and secondary battery capacitance C as shown in FIG. 1A. In this case, a secondary battery voltage $V_B$ is the sum of a voltage $V_R$ applied to the internal resistance R and a voltage $V_C$ applied to the secondary battery capacitance C.

While CC charging is performed, a switch is on as shown in FIG. 1A, so that a constant current I flows to the secondary battery. During the period, the current I is constant; thus, in accordance with the Ohm's law ($V_R = R \times I$), the voltage $V_R$ applied to the internal resistance R is also constant. In contrast, the voltage $V_C$ applied to the secondary battery capacitance C increases over time. Accordingly, the secondary battery voltage $V_B$ increases over time.

When the secondary battery voltage $V_B$ reaches a predetermined voltage, e.g., 4.3 V, the charging is stopped. When the CC charging is stopped, the switch is turned off as shown in FIG. 1B, and the current I becomes 0. Thus, the voltage $V_R$ applied to the internal resistance R becomes 0 V. Thus, the secondary battery voltage $V_B$ decreases. Thus, the secondary battery voltage $V_B$ becomes equal to the voltage $V_C$ applied to the secondary battery capacitance C.

FIG. 1C shows an example of the secondary battery voltage $V_B$ and a charging current during CC charging and after CC charging is stopped. The secondary battery voltage $V_B$ increases during CC charging, and slightly decreases after CC charging is stopped.

<CCCV Charging>

Next, constant current constant voltage (CCCV) charging, which is a charging method different from the above-described method, is described. CCCV charging is a charge method in which CC charging is performed until the voltage reaches a predetermined voltage and then CV (constant voltage) charging is performed until the amount of current flow becomes small, specifically, a termination current value.

While CC charging is performed, the switch of a constant current power source is on and the switch of a constant voltage power source is off as shown in FIG. 2A, so that a constant current I flows to the secondary battery. During the period, the current I is constant; thus, in accordance with the Ohm's law ($V_R$=R×I), the voltage $V_R$ applied to the internal resistance R is also constant. In contrast, the voltage $V_C$ applied to the secondary battery capacitance C increases over time. Accordingly, the secondary battery voltage $V_B$ increases over time.

When the secondary battery voltage $V_B$ reaches a predetermined voltage, e.g., 4.3 V, CC charging is changed to CV charging. While CV charging is performed, the switch of the constant voltage power source is on and the switch of the constant current power source is off as shown in FIG. 2B; thus, the secondary battery voltage $V_B$ is constant. In contrast, the voltage $V_C$ applied to the secondary battery capacitance C increases over time. Since $V_B$=$V_R$+$V_C$ is satisfied, the voltage $V_R$ applied to the internal resistance R decreases over time. As the voltage $V_R$ applied to the internal resistance R decreases, the current I flowing to the secondary battery also decreases in accordance with the Ohm's law ($V_R$=R×I).

When the current I flowing to the secondary battery becomes a predetermined current, e.g., approximately 0.01 C, charging is stopped. When CCCV charging is stopped, all the switches are turned off as shown in FIG. 2C, so that the current I becomes 0. Thus, the voltage $V_R$ applied to the internal resistance R becomes 0 V. However, the voltage $V_R$ applied to the internal resistance R becomes sufficiently small by the CV charging; thus, even when a voltage drop no longer occurs in the internal resistance R, the secondary battery voltage $V_B$ hardly decreases. Thus, the secondary battery voltage $V_B$ is equal to the voltage $V_C$ applied to the secondary battery capacitance C.

FIG. 2D shows an example of the secondary battery voltage $V_B$ and charging current during CCCV charging and after CCCV charge is stopped. The secondary battery voltage $V_B$ hardly decreases even after CCCV charging is stopped.

<CC Discharging>

Next, CC discharging, which is one of discharging methods, is described. CC discharging is a discharging method in which a constant current flows from the secondary battery in the whole discharging period, and discharging is stopped when the secondary battery voltage $V_B$ reaches a predetermined voltage, e.g., 2.5 V.

Next, a discharging rate and a charging rate are described. The discharging rate refers to a relative ratio of discharging current to a battery capacity and is expressed in a unit C.

A current corresponding to 1 C in a battery with a rated capacity X is X. The case where discharging is performed at a current of 2 X is rephrased as to perform discharging at 2 C, and the case where discharging is performed at a current of 0.2 X is rephrased as to perform discharging at 0.2 C. The same applies to a charging rate; the case where charging is performed at a current of 2 X is rephrased as to perform charging at 2 C, and the case where charging is performed at a current of 0.2 X is rephrased as to perform charging at 0.2 C.

When an anomaly such as a micro short-circuit occurs, a charging voltage of a secondary battery suddenly drops. An anomalous current flows through a path (inside a battery) different from a protection circuit in a battery. FIG. 32 shows a graph showing a micro-short circuit at approximately 20 minutes during charging, where the vertical axis represents voltage and the horizontal axis represents time, for example. One embodiment of the present invention can detect an anomalous operation, transmit the result to a control circuit or a processor, turn a power cut switch off, and stop supplying power to the secondary battery.

When the charging is performed with the above charging method, one embodiment of the present invention can detect deterioration of the secondary battery from charging characteristics of the secondary battery. The deterioration of a secondary battery includes anomalies such as a micro short-circuit.

One embodiment of the present invention is a semiconductor device including a first circuit and a second circuit. The first circuit includes a power gauge and an anomalous current detection circuit. The power gauge includes a current divider circuit and an integrator circuit. The anomalous current detection circuit includes a first memory, a second memory, and a first comparator. The integrator circuit has a function of converting a detection current detected at the current divider circuit into a detection voltage by integrating the detection current. The anomalous current detection circuit is supplied with the detection voltage, a first signal at a first time, and a second signal at a second time. The anomalous current detection circuit has a function of storing the detection voltage at the first time in the first memory using the first signal. The anomalous current detection circuit has a function of storing the detection voltage at the second time in the second memory using the second signal. The first comparator outputs a change from the detection voltage at the first time to the detection voltage at the second time as a first output signal to the second circuit.

In the above structure, the first comparator outputs the first output signal to the second circuit when the detection voltage stored in the first memory is larger than the detection voltage stored in the second memory. The first comparator inverts the first output signal to output it to the second circuit when the detection voltage stored in the second memory is larger than the detection voltage stored in the first memory In the above structures, the power gauge includes a second comparator having a hysteresis property. The second comparator has a function of judging the detection voltage using a first judge voltage and a second judge voltage. An output signal of the second comparator inverts an output polarity of the current divider circuit when the detection voltage is smaller than the first judge voltage. The output signal of the second comparator inverts the output polarity of the current divider circuit when the detection voltage is larger than the second judge voltage. The output signal of the second comparator is output to the second circuit.

In the above structures, the second circuit generates the first signal and the second signal from the output signal of the second comparator.

In the above structures, the second circuit has a function of setting a predetermined time. The second circuit has a function of outputting the first signal or the second signal after the predetermined time from a change moment of the output signal of the second comparator.

In the above structures, the second circuit is a control circuit or a processor.

In the above structures, the semiconductor device includes a transistor. The transistor preferably includes an oxide semiconductor in its channel formation region Another embodiment of the present invention is a battery pack including a semiconductor device provided over a flexible substrate, an insulating sheet, and a secondary battery.

Effect of the Invention

One embodiment of the present invention can provide a semiconductor device or the like that detects anomalies of a secondary battery by monitoring charging characteristics of the secondary battery. Alternatively, a semiconductor device or the like with reduced power consumption can be provided. A semiconductor device or the like that has excellent sensing accuracy on charging characteristics can be provided. A semiconductor device or the like which stably operates can be provided. A semiconductor device or the like with high reliability can be provided. A novel semiconductor device or the like can be provided.

Note that the description of the effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 23 is a diagram showing examples of electronic devices.

MODE FOR CARRYING OUT THE INVENTION

Figure 1A:
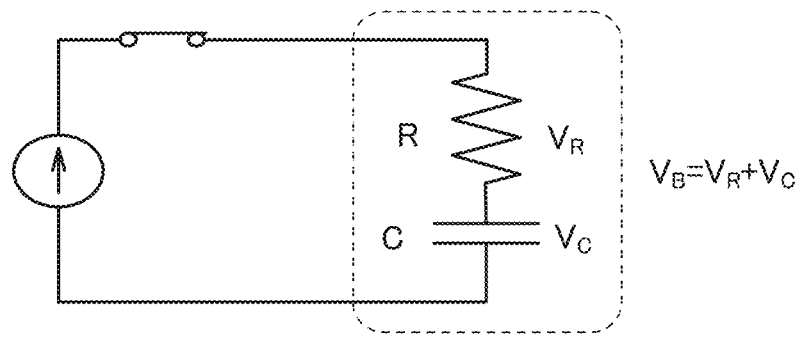
FIG. 1A to FIG. 1C are diagrams showing a charging method of a secondary battery.
Figure 1B:
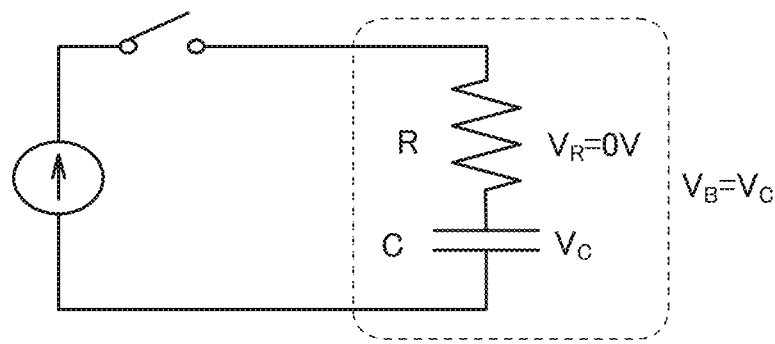
Figure 1C:
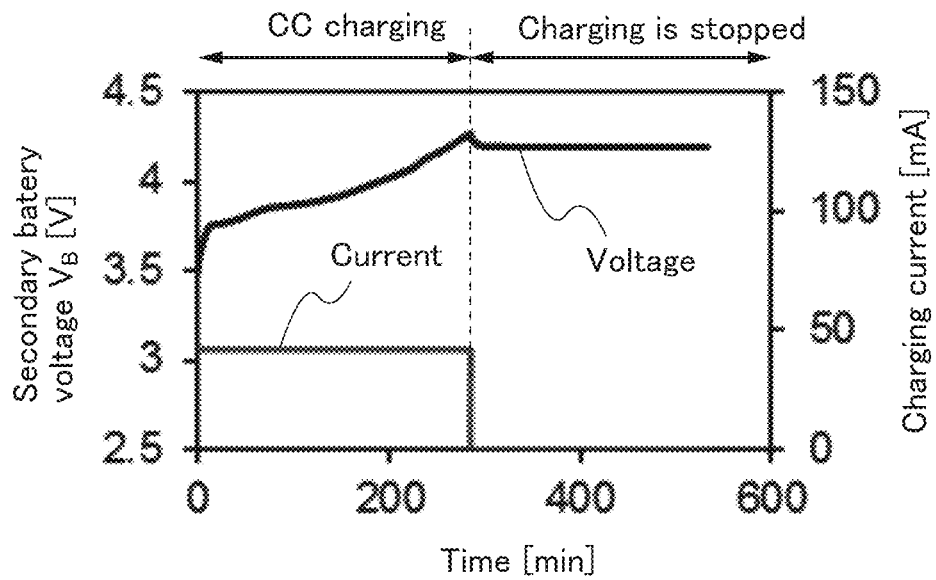
Figure 2A:
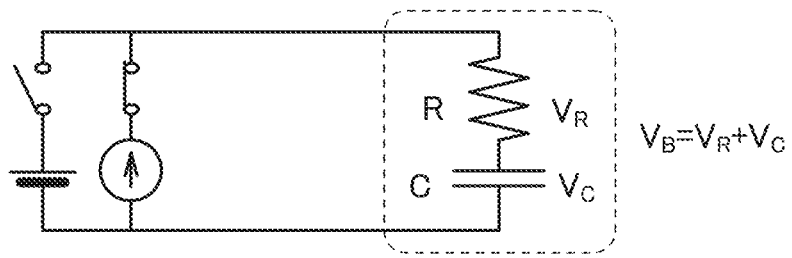
FIG. 2A to FIG. 2D are diagrams showing a charging method of a secondary battery.
Figure 2B:
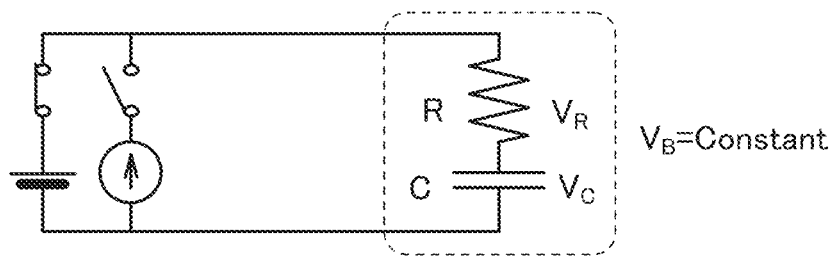
Figure 2C:
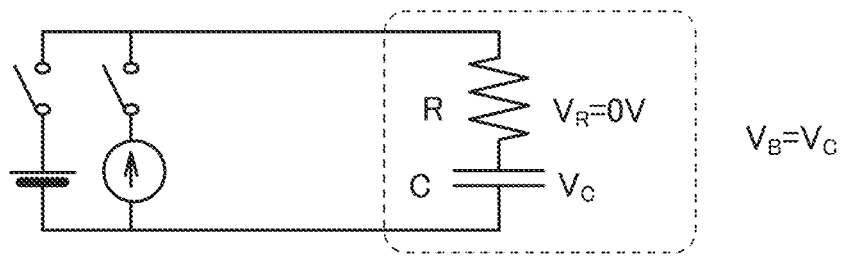
Figure 2D:
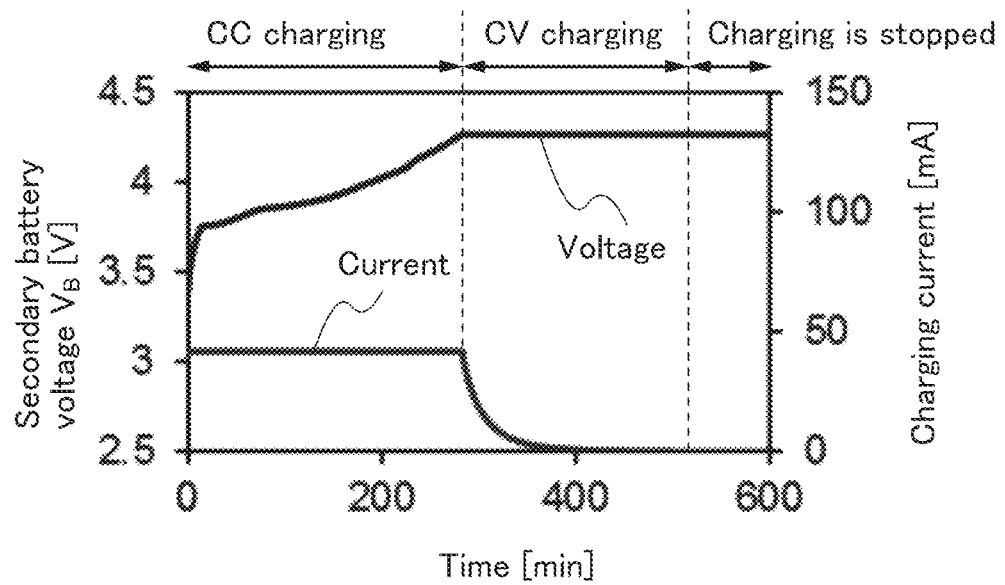

Embodiments are described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the descriptions of embodiments below. Note that in the structures of the present invention described below, the same portions or portions having similar functions are denoted by the same reference numerals in different drawings, and description thereof is not repeated.

The position, size, range, and the like of each component illustrated in the drawings and the like are not accurately represented in some cases to facilitate understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example. When a circuit is described, a "wiring" includes the case where a resistor is formed in an integrated manner.

In this specification and the like, a "terminal" in an electric circuit refers to a portion that inputs or outputs a current, inputs or outputs a voltage, and/or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit. In addition, the expression "directly connected" includes the case where different conductive layers are connected to each other through a contact. Note that a wiring may be formed of conductive layers that contain one or more of the same elements or may be formed of conductive layers that contain different elements.

In this specification and the like, "parallel" indicates a state where two straight lines are placed at an angle of greater than or equal to −10° and less than or equal to 10°, for example. Thus, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Thus, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

Furthermore, in this specification, in the case where an etching treatment is performed after a resist mask is formed, the resist mask is removed after the etching treatment, unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of a transistor refers to a state in which a source and a drain of the transistor are electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

A semiconductor device of one embodiment of the present invention is described with reference to FIG. 3 to FIG. 7.

Figure 3:
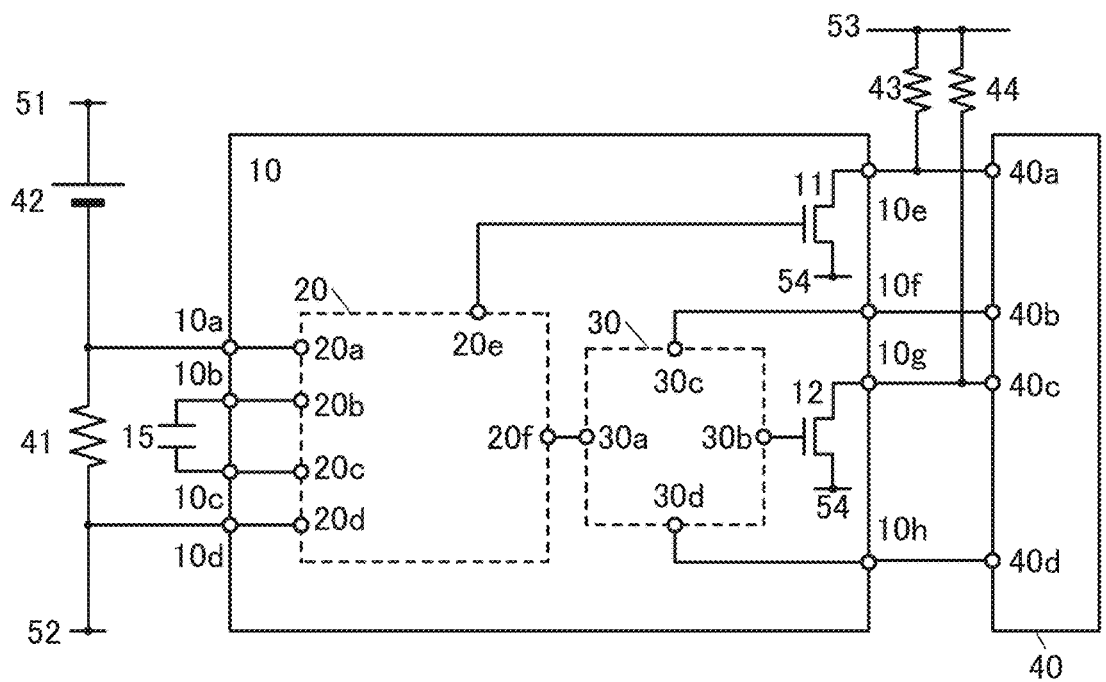
FIG. 3 is a diagram showing a structure example of a semiconductor device.

One embodiment of the present invention is a semiconductor device that detects deterioration of a secondary battery. FIG. 3 is a structure example showing a semiconductor device. The semiconductor device includes a circuit 10 and a circuit 40. The circuit 10 includes a power gauge 20, an anomalous current detection circuit 30, an output circuit 11, an output circuit 12, and a terminal 10a to a terminal 10h. The power gauge 20 includes a terminal 20a to a terminal 20f. The anomalous current detection circuit 30 includes a terminal 30a to a terminal 30d. The circuit 40 includes a terminal 40a to a terminal 40d.

A secondary battery 42 is electrically connected to a wiring 52 through a monitoring resistor 41 to detect a secondary battery current of the secondary battery 42. One electrode of the resistor 41 is electrically connected to the terminal 20a through the terminal 10a. The other electrode of the resistor 41 is electrically connected to the terminal 20d through the terminal 10d. The terminal 10b is electrically connected to the terminal 10c through a capacitor 15. The terminal 10b is electrically connected to the terminal 20b. The terminal 10c is electrically connected to the terminal 20c. The terminal 20e is electrically connected to the terminal 10e through the output circuit 11. The terminal 20f is electrically connected to the terminal 30a. The terminal 30b is electrically connected to the terminal 10g through the output circuit 12.

The terminal 10e is electrically connected to the terminal 40a and one electrode of a resistor 43. The terminal 10g is electrically connected to the terminal 40c and one electrode of the resistor 44. Note that the other electrode of the resistor 43 and the other electrode of the resistor 44 are electrically connected to a wiring 53.

The terminal 40b is electrically connected to the terminal 30c through the terminal 10f. The terminal 40d is electrically connected to the terminal 30d through the terminal 10h.

The power gauge 20 includes a current divider circuit, which divides a current from the secondary battery 42, an integrator circuit, which converts the detected current into a voltage by integrating it, and the first comparator circuit, which compares the converted voltage. The current divider circuit can detect a current change from the voltage of the secondary battery 42 and generate a reference potential. The integrator circuit can integrate a current of the secondary battery 42 to generate a detection voltage. The integrator circuit can give the detection voltage to the anomalous current detection circuit 30. The first comparator circuit can compare the detection voltage with a reference voltage to output the result. The first comparator circuit uses hysteresis characteristics to compare the detection voltage. The hysteresis characteristics have a hysteresis width. The hysteresis width is set by the first judge voltage and the second judge voltage. The first judge voltage and the second judge voltage are preferably set by the circuit 40. When the detection voltage is out of the hysteresis width, the power gauge 20 uses the first output signal to inform the circuit 40. When the detection voltage is out of the hysteresis width, the anomalous current detection circuit can invert the output polarity of the secondary battery 42 by the first output signal.

The output circuit 11 or the output circuit 12 can use an open drain output mode. As an example, details of the output circuit 11 are described. An Nch-transistor is used in the output circuit 11. The gate of the transistor is supplied with the first output signal through the terminal 20e of the power gauge 20. The source of the transistor is electrically connected to a wiring 54. The resistor 43, which is connected to the drain of the transistor, functions as a pull-up resistor. The voltage applied to the wiring 53 is preferably the power supply voltage to the input/output interface of the circuit 40. An open drain output mode is preferable for outputting a signal to the circuit 40 which is operated with a power voltage different from the power voltage supplied to the circuit 10.

As a transistor used for an open drain output mode, a transistor including an oxide semiconductor, which is a kind of a metal oxide, in a semiconductor layer where a channel is formed (also referred to as an "OS transistor") can be used.

An OS transistor can have extremely low off-state current. Specifically, the off-state current per micrometer of channel width at room temperature can be lower than $1 \times 10^{-20}$ A, preferably lower than $1 \times 10^{-22}$ A, further preferably lower than $1 \times 10^{-24}$ A.

The off-state current of an OS transistor hardly increases even in a high temperature environment. Specifically, the off-state current hardly increases even at an environment temperature higher than or equal to room temperature and lower than or equal to 200° C. When OS transistors are used as transistors included in a semiconductor device, the semiconductor device achieves stable operation and high reliability even in a high temperature environment.

Using an OS transistor in the output circuit 11 or the output circuit 12 can suppress a current flow through the pull-up resistor to the wiring 54, which can reduce power consumption. An OS transistor has high withstand voltage between its source and drain. Using an OS transistor can provide a highly reliable semiconductor device or the like.

When the circuit 40 detects the change from "H" to "L" of the first output signal, the circuit 40 can output a first signal or a second signal after a predetermined period. The circuit 40 can set the predetermined period. The period from the change of "H" to "L" of the first output signal to the output of the first signal can be set as the first period. The period from the change of "H" to "L" of the first output signal to the output of the second signal can be set as the second period.

The anomalous current detection circuit 30 includes the first memory, the second memory, and the second comparator circuit. The anomalous current detection circuit 30 is supplied with the detection voltage, the first signal supplied after the first period, and the second signal supplied after the second period. The first signal can make the first memory store the detection voltage after the first period. The second signal can make the second memory store the detection voltage after the second period. The moment when the detection voltage is stored in the first memory can be called the first moment and the moment when the detection voltage is stored in the second memory can be called the second moment. The second comparator circuit can output the large-small relation between the detection voltage at the first moment and the detection voltage at the second moment as the second output signal to the circuit 40 through the output circuit 12.

The anomalous current detection circuit 30 can output the second output signal to the circuit 40 when the detection voltage stored in the first memory is larger than the detection voltage stored in the second memory. The anomalous current detection circuit 30 can invert the second output signal to output it to the circuit 40 when the detection voltage stored in the second memory is larger than the detection voltage stored in the first memory.

A processor can be used as the circuit 40. Alternatively, a control circuit composed of an FPGA (Field Programmable Gate Array) or a PLD (Programmable Logic Device) can be used as the circuit 40. Alternatively, the circuit 10 may include the circuit 40. The circuit 10 including the circuit 40 does not need the output circuit 11, the output circuit 12, or the pull-up resistor. Thus, the number of components can be reduced.

Figure 4:
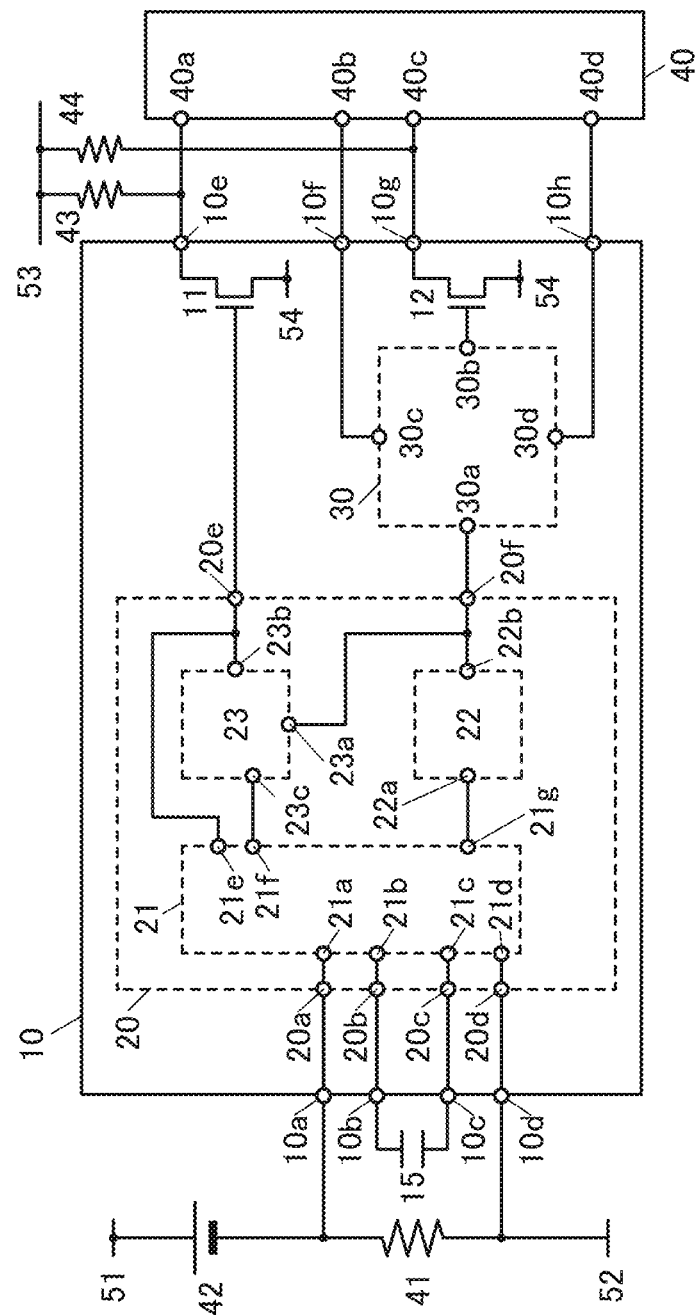
FIG. 4 is a diagram showing a structure example of a semiconductor device.

FIG. 4 is a diagram showing in detail the structure example of the semiconductor device described in FIG. 3. In FIG. 4, different points from FIG. 3 are described; in the structures of the invention (or the structure in Example), the same portions or portions having similar functions are denoted by the same reference numerals in different drawings, and a repetitive description of such portions is omitted.

The power gauge 20 includes a current divider circuit 21, an integrator circuit 22, and a comparator 23. The current divider circuit 21 can detect a current of the secondary battery 42. The integrator circuit 22 can convert the detected current into a voltage by integrating it. The comparator 23 can compare the integrated voltage. The comparator 23 corresponds to the first comparator circuit.

The current divider circuit 21 includes a terminal 21a to a terminal 21g. The integrator circuit 22 includes a terminal 22a and a terminal 22b. The comparator 23 includes a terminal 23a to a terminal 23c.

The terminal 20a is electrically connected to the terminal 21a. The terminal 20b is electrically connected to the terminal 21b. The terminal 20c is electrically connected to the terminal 21c. The terminal 20d is electrically connected to the terminal 21d. The terminal 21g is electrically connected to the terminal 22a. The terminal 22b is electrically connected to the terminal 23a and the terminal 20f. The terminal 23b is electrically connected to the terminal 21e. The terminal 23c is electrically connected to the terminal 21f.

The current divider circuit 21 can detect a current change of the secondary battery 42. The integrator circuit 22 can generate a detection voltage by integrating the current of the secondary battery 42. The integrator circuit 22 can supply the detection voltage to the anomalous current detection circuit 30 through the terminal 22b of the integrator circuit 22 and the terminal 20f of the power gauge 20.

The comparator 23 is supplied with a judge voltage Bias1 and a judge voltage Bias2. The comparator 23 has hysteresis characteristics, and the hysteresis width can be determined by the judge voltage Bias1 and the judge voltage Bias2. The judge voltage Bias1 and the judge voltage Bias2 are preferably determined by the circuit 40. An output signal of the comparator 23 is supplied to the terminal 20e and the terminal 21e through the terminal 23b. An output signal of the comparator 23 supplied to the terminal 20e is supplied to the circuit 40 through the output circuit 11. When the detection voltage is out of the hysteresis width, the comparator 23 uses the output signal of the comparator 23 to inform the circuit 40. In addition, when the detection voltage is out of the hysteresis width, the output signal of the comparator 23 supplied to the terminal 21e of the current divider circuit 21 can invert the output polarity of the current divider circuit 21.

Figure 5:
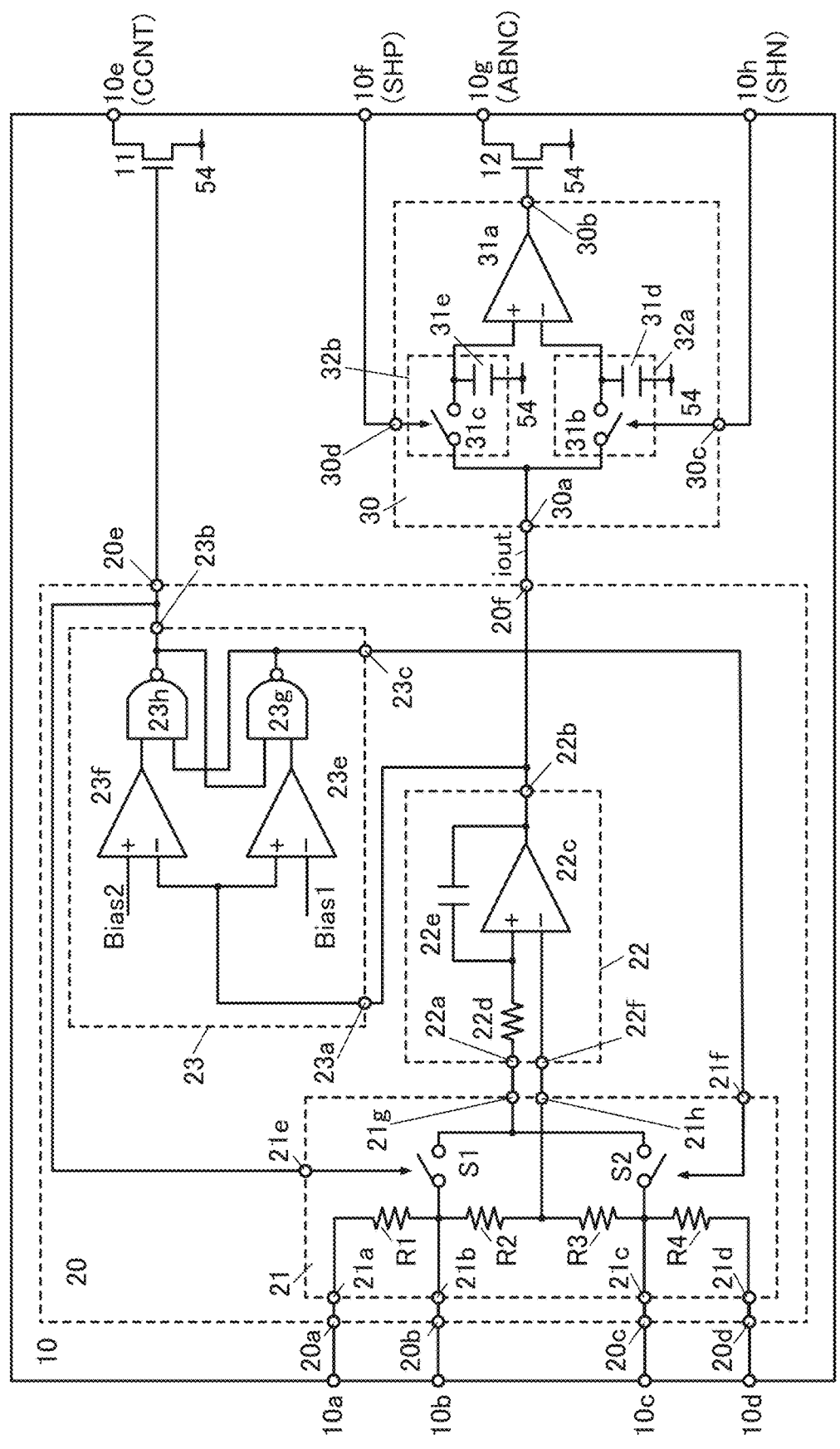
FIG. 5 is a diagram showing a circuit example of a semiconductor device.

FIG. 5 is a diagram showing a circuit example of a circuit 10 included in the semiconductor device of one embodiment of the present invention. FIG. 5 describes the circuit 10 in detail described in FIG. 4; when the structure of the invention (or the structure of an example) has the same part or a similar functional part, the same reference numerals are used between different diagrams to omit overlapping descriptions.

The current divider circuit 21 includes a resistor R1 to a resistor R4, a switch S1, and a switch S2. The resistance of the resistor can be calculated from the length of the wiring. The resistor can be formed by connecting the wiring through a contact to a conductive layer whose conductivity is different from that of the conductive layer used as the wiring.

One electrode of the resistor R1 is electrically connected to the terminal 21a. The other electrode of the resistor R1 is electrically connected to one electrode of the resistor R2, one electrode of the switch S1, and the terminal 21b. The other electrode of the resistor R2 is electrically connected to one electrode of the resistor R3 and the terminal 21h. The other electrode of the resistor R3 is electrically connected to one electrode of the resistor R4, one electrode of the switch S2, and the terminal 21c. The other electrode of the resistor R4 is electrically connected to the terminal 21d. The other electrode of the switch S1 is electrically connected to the other electrode of the switch S2 and the terminal 21g.

The resistor R1 has preferably the same resistivity as the resistor R4. The resistor R2 has preferably the same resistivity as the resistor R3. The resistivity includes fluctuation. For example, the resistivity is within the fluctuation range of −5% to +5%, preferably within the fluctuation range of −3% to +3%, more preferably within the fluctuation range of −1% to +1%.

The output voltage supplied to the terminal 21h is supplied to the terminal 22f as the reference voltage of the integrator circuit 22. The detection current supplied to the terminal 21g is supplied to the terminal 22a as the input signal of the integrator circuit 22. The switch S1 is controlled by the output signal of the comparator 23 supplied to the terminal 21e. The switch S2 is controlled by the inverted signal of the output signal of the comparator 23 supplied to the terminal 21f. Thus, when the switch S1 is in the on state and the switch S2 is in the off state during charging, the detection current supplied to the terminal 21g is a positive current with respect to the reference voltage. When the switch S2 is in the on state and the switch S1 is in the off state, the detection current supplied to the terminal 21g is a negative current with respect to the reference voltage.

Next, the integrator circuit 22 is described. The integrator circuit includes an amplifier circuit 22c, a resistor 22d, and a capacitor 22e. The amplifier circuit 22c includes a non-inverting input terminal, an inverting input terminal, and an output terminal. The terminal 22a is electrically connected to one electrode of the resistor 22d. The other electrode of the resistor 22d is electrically connected to a non-inverting input terminal of the amplifier circuit 22c and one electrode of the capacitor 22e. The terminal 22f is electrically connected to the inverting input terminal of the amplifier circuit 22c. The output terminal of the amplifier circuit 22c is electrically connected to the other electrode of the capacitor 22e and the terminal 22b.

A current supplied to the terminal 22a is integrated by the integrating circuit 22 to generate a detection voltage. When the switch S1 is in the on state and the switch S2 is in the off state, a positive voltage with respect to the reference voltage supplied to the terminal 22f is added to the detection voltage supplied to the terminal 22b. When the switch S2 is in the on state and the switch S1 is in the off state, a negative voltage with respect to the reference voltage supplied to the terminal 22f is added to the detection voltage supplied to the terminal 22b.

In general, a capacitor has a structure in which two electrodes face each other with a dielectric therebetween. A capacitance value is proportional to the area where the facing electrodes overlap with each other and a relative permittivity of the dielectric and inversely proportional to the distance between the two electrodes. In the case where the capacitor 22e is provided and the capacitance value is too large, the area occupied by the semiconductor device tends to be large, which is not preferable. When the capacitance of the capacitor 22e is large, response of the integrator circuit becomes poor.

In the case where the capacitor 22e is provided, the capacitance value of the capacitor 22e is preferably within the range of 0.01 fF to 100 pF, further preferably within the range of 0.05 fF to 10 pF, still further preferably within the range of 0.1 fF to 1 pF.

The detection voltage generated by the integrator circuit 22 is supplied to the terminal 30a of the anomalous current detection circuit 30 through the terminal 23a of the comparator 23 and the terminal 20f.

The comparator 23 includes an amplifier circuit 23e, an amplifier circuit 23f, a circuit 23g, and a circuit 23h. The circuit 23g and the circuit 23h each include the first input terminal, the second input terminal, and the output terminal; the circuit 23g and the circuit 23h are logic gates functioning as NAND.

The terminal 23a is electrically connected to the non-inverting input terminal of the amplifier circuit 23e and the inverting input terminal of the amplifier circuit 23f. To the inverting input terminal of the amplifier circuit 23e is supplied the judge voltage Bias'. To the non-inverting input terminal of the amplifier circuit 23f is supplied the judge voltage Bias2. The output terminal of the amplifier circuit 23e is electrically connected to the first input terminal of the circuit 23g. The output terminal of the amplifier circuit 23f is electrically connected to the second input terminal of the circuit 23h. The output terminal of the circuit 23g is electrically connected to the terminal 21f of the current divider circuit through the first input terminal of the circuit 23h and the terminal 23c. The output terminal of the circuit 23h is electrically connected to the terminal 21e of the current divider circuit through the second input terminal of the circuit 23g and the terminal 23b. The terminal 23b is electrically connected to the output circuit 11 through the terminal 20e of the power gauge 20.

The anomalous current detection circuit 30 includes a memory 32a, a memory 32b, and an amplifier circuit 31a. The amplifier circuit 31a functions as the second comparator circuit. The memory 32a includes a switch 31b and a capacitor 31d. The memory 32b includes a switch 31c and a capacitor 31e.

The terminal 30a is electrically connected to the input terminal of the memory 32a and the input terminal of the memory 32b. The output terminal of the memory 32a is electrically connected to the inverting input terminal of the amplifier circuit 31a. The output terminal of the memory 32b is electrically connected to the non-inverting input terminal of the amplifier circuit 31a. The output terminal of the circuit 31a is electrically connected to the output circuit 12 through the terminal 30b. To the terminal 30a is supplied the detection signal generated by the integrator circuit 22 as a signal iout.

The anomalous current detection circuit 30 is described in more detail. The terminal 30a is electrically connected to one electrode of the switch 31b. The other electrode of the switch 31b is electrically connected to one electrode of the capacitor 31d and the inverting input terminal of the amplifier circuit 31a. The other electrode of the capacitor 31d is electrically connected to the wiring 54. The terminal 30a of the anomalous current detection circuit 30 is electrically connected to one electrode of the switch 31c. The other electrode of the switch 31c is electrically connected to one electrode of the capacitor 31e and the non-inverting input terminal of the amplifier circuit 31a. The other electrode of the capacitor 31e is electrically connected to the wiring 54.

The switch 31b is controlled by a signal SHN supplied from the circuit 40 through the terminal 10h. The switch 31c is controlled by a signal SHP supplied from the circuit 40 through the terminal 10f.

The switch 31b and the switch 31b are preferably OS transistors. An OS transistor can have an extremely low off-state current; an OS transistor is preferable for retaining a voltage supplied to a memory.

The off-state current of an OS transistor is less likely to increase in a high-temperature environment (e.g., under an environment of higher than or equal to 50° C. and lower than or equal to 150° C.). Therefore, the voltage (charge) supplied to the memory element (the memory 32a or the memory 32b) can be stored for a long time even under a high temperature environment.

In this manner, an OS transistor and a capacitor form a memory element. A memory element using an OS transistor as a transistor forming the memory element may be referred to as an "OS memory".

An output signal from the comparator 23 is supplied to the circuit 40, whereby the circuit 40 generates the signal SHP and the signal SHN using a time management function of the circuit 40.

The method of storing the detection voltage in the memory 32b using the signal SHP is described. The circuit 40 manages time based on the change moment of the output signal of the comparator 23 (the change from the off state to the on state of the output circuit 11); after a predetermined first period from the change moment, the circuit 40 changes the signal SHP to the "H" state. The memory 32b stores the detection voltage supplied to the terminal 30a during the period in which the signal SHP is "H".

The method of storing the detection voltage in the memory 32a using the signal SHN is described. The circuit 40 manages time based on the change moment of the output signal of the comparator 23 (the change from the off state to the on state of the output circuit 11); after a predetermined second period from the change moment, the circuit 40 changes the signal SHN to the "H" state. The memory 32a stores the detection voltage supplied to the terminal 30a during the period in which the signal SHN is "H".

The circuit 40 preferably outputs the signal SHP at a different timing from the signal SHN. Thus, the signal SHP and the signal SHN can detect the change of the detection voltage at the time when the signal SHP and the signal SHN are supplied. Thus, the time gap between the signal SHP and the signal SHN is preferably large. Within the time gap, change moments of a signal CCNT can be included. The time gap can be changed according to the number of charging cycles or the detection voltages of the secondary battery 42 at the beginning of charging.

When the detection voltage stored in the memory 32b is larger than the detection voltage stored in the memory 32a, the amplifier circuit 31a outputs the signal "H", and the signal is converted into the signal "L" at the output circuit 12 to be output to the circuit 40. As a different example, when the detection voltage stored in the memory 32a is larger than the detection voltage stored in the memory 32b, the amplifier circuit 31a outputs the signal "L", and the signal is converted into the signal "H" at the output circuit 12 to be output to the circuit 40. An output signal (signal ABNC) of the amplifier circuit 31a can be supplied to the circuit 40 through the terminal 10g. The circuit 40 judges a change in output of the secondary battery 42 using the signal ABNC.

The signal ABNC which is judged by the circuit 40 shows the slope of charging characteristics of the secondary battery 42. When the output of the signal ABNC is "H", the charging characteristics of the secondary battery 42 shows a change of a voltage increase. When the output of the signal ABNC is "L", the charging characteristics of the secondary battery 42 shows a change of a voltage decrease.

Next, the output circuit 11 is described. An output signal (signal CCTN) of the output circuit 11 can be supplied to the circuit 40 through the terminal 10e. Thus, the output signal of the comparator 23 can inform through the output circuit 11 the circuit 40 that a detection voltage is out of the hysteresis width. The period of "H" or the period of "L" of the signal CCNT changes depending on the slope of the charging characteristics of the secondary battery 42. For example, when a change of a voltage increase in the charging characteristics of the secondary battery 42 is shown, the period of the cycle becomes short depending on the amount of the increase. When a change of a voltage decrease in the charging characteristics of the secondary battery 42 is shown, the period of the cycle becomes short depending on the amount of the decrease.

Figure 6:
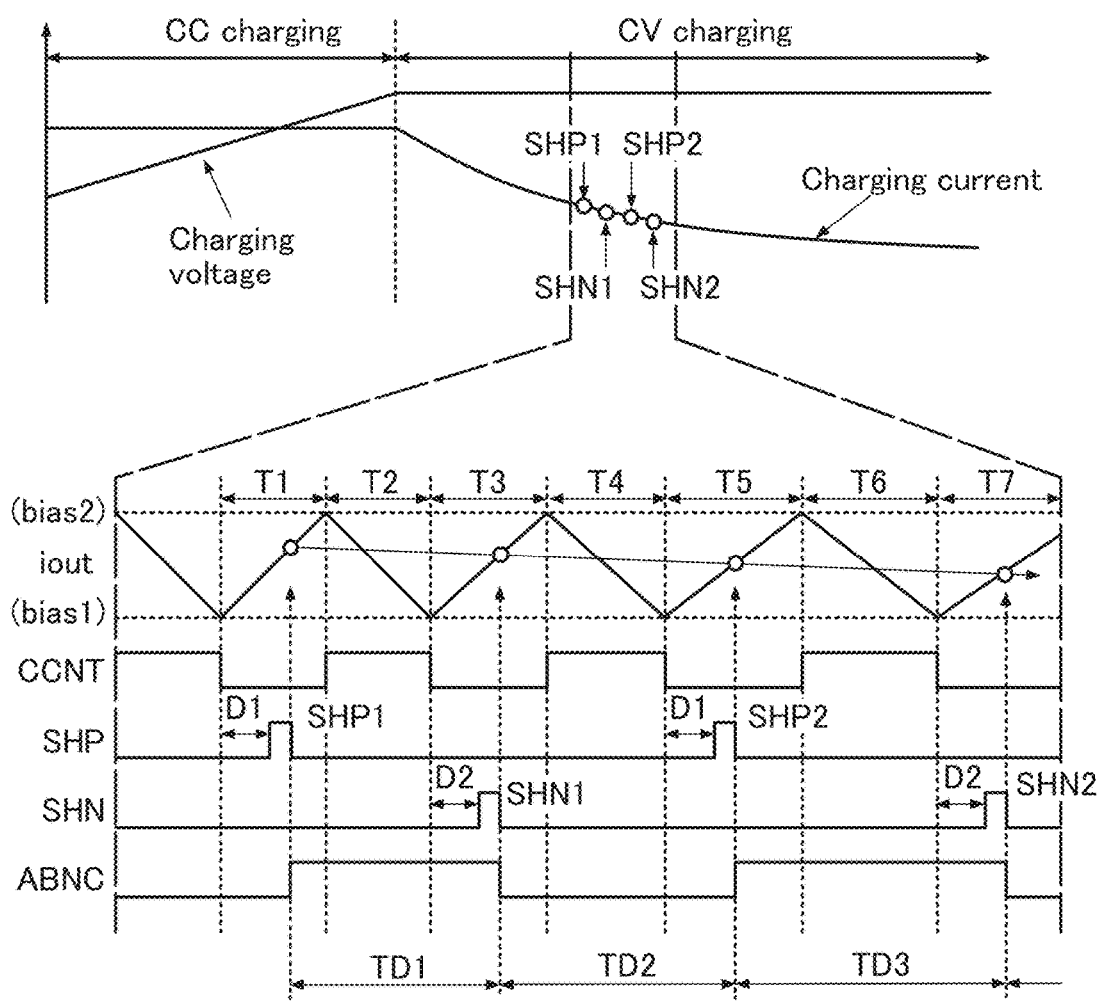
FIG. 6 is a diagram showing an operation example of a semiconductor device.

FIG. 6 shows an operation example of the case where the secondary battery 42 is charged normally. FIG. 6 shows the charging characteristics of the case where the secondary battery 42 is charged normally as an example. FIG. 6 shows charging characteristics of the case where the secondary battery 42 is charged by CCCV charging. It is important to manage a CC charging period and a CV charging period of a CCCV charging. In a CC charging period, the secondary battery 42 is charged by supplying a constant charging current from a constant power supply. A charging current is constant; thus, the voltage applied to the internal resistance of the secondary battery 42 is also constant according to the Ohm's law. In contrast, the voltage applied to the secondary battery capacitance increases over time. Accordingly, the charging voltage of the secondary battery 42 increases over time.

When the charging voltage of the secondary battery 42 reaches a predetermined voltage, the CC charging period changes to the CV charging period. In the CV charging period, a constant charging voltage is supplied from a constant voltage source to the secondary battery 42 to be charged. The voltage applied to the capacitance C in the secondary battery increases over time, and the voltage applied to the internal resistance of the secondary battery 42 decreases over time. As the voltage applied to the internal resistance decreases, the current flowing to the secondary battery 42 also decreases in accordance with the Ohm's law.

An operation of the semiconductor device is described using a timing chart in FIG. 6. The description uses a period in the CV charging in the timing chart.

The signal iout is a detection voltage generated by the integrator circuit 22. When the voltage of the signal iout is out of the range of the hysteresis width of the comparator 23, the output from the current divider circuit 21 is inverted, which inverts the change direction of the signal iout. The slope of the signal iout increases when the amount of change in the charging voltage of the secondary battery 42 detected by the current divider circuit 21, since the signal iout is generated by the integrator circuit 22. The slope of the signal iout decreases when the charging voltage of the secondary battery 42 detected by the current divider circuit 21 becomes small. That is, the durations of a cycle T1 to a cycle T7 of the output signal of the comparator 23 change depending on the slope of the signal iout. The change moment of the output signal of the comparator 23 corresponds to the change moment of the signal iout. Thus, the output signal of the comparator 23 is synchronized with the signal CCNT.

The circuit 40 (hereinafter described as control unit) generates the signal SHP and the signal SHN when a change moment of the signal CCNT is detected. The period from the change moment of the signal CCNT to the output of the signal SHP is a period D1. The period from the change moment of the signal CCNT to the output of the signal SHN is a period D2. As an example, the signal SHP1 turns a switch 31c on after a predetermined period D1 from the change moment of the signal CCNT. This changes the signal SHP1 to the "H" signal. The signal SHN1 turns a switch 31b on after a predetermined period D2 from the change moment of the signal CCNT. This changes the signal SHN1 to the "H" signal. The period D1 has preferably the same predetermined time as the period D2.

The memory 32b stores the detection voltage at the first time (change of signal SHP from "H" to "L"). The memory 32a stores the detection voltage at the second time (change of signal SHN from "H" to "L"). The amplifier circuit 31a of the anomalous current detection circuit 30 compares the detection voltage stored in the memory 32a and the detection voltage stored in the memory 32b. The detection voltages stored in the memory 32a and the memory 32b can show the slope of the amount of change of the detection voltages when the period D1 and the period D2 have the same predetermined time.

When the secondary battery 42 is normal, the secondary battery shows a property in which the charging current decreases during CV charging. Thus, the durations of the cycle T1 to the cycle T7 of the signal CCNT and the signal ABNC increases in this order. The signal SHP1 or the signal SHP2 shows the timing of storing the detection voltage in the memory 32b, and the signal SHN1 or the signal SHN2 shows the timing of storing the detection voltage in the memory 32a. The control unit uses the time of changing "H" to "L" or "L" to "H" of the signal ABNC to detect the lengths of periods of a cycle TD1 to a cycle TD3 and the like.

FIG. 6 is an example showing that the charging current tends to decrease during CV charging. The timing chart shows that the voltages of the signal iout stored in the memory become small in accordance with the signal SHP1, the signal SHN1, the signal SHP2, and the signal SHN2 in this order. The control unit can judge the decreasing tendency of the charging curve of the secondary battery 42 on the fact that the cycle TD1 to the cycle TD3 and the like at which the signal ABNC is output become long.

Figure 7:
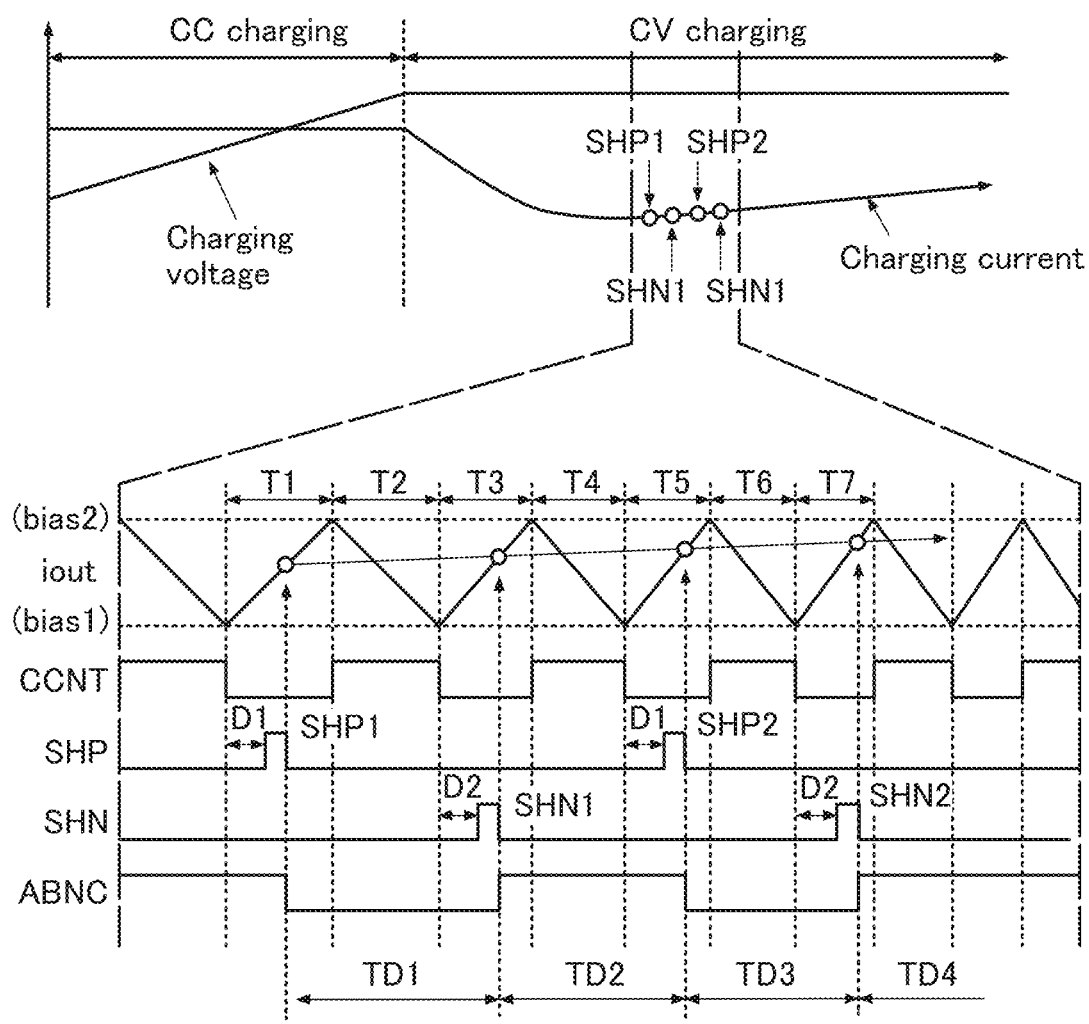
FIG. 7 is a diagram showing an operation example of a semiconductor device.

FIG. 7 is an example showing that the secondary battery 42 deteriorates and shows anomalous charging characteristics, which is different from the normal state in FIG. 6. FIG. 7 shows a characteristic in which the charging current increases during CV charging. The durations of the cycle T1 to the cycle T7 of the signal CCNT and the signal ABNC become short in this order.

FIG. 7 is an example showing an increasing tendency of the charging currents at the signal SHP1, the signal SHN1, the signal SHP2, and the signal SHN2 in this order during CV charging. The timing chart shows that the voltages of the signal iout which is stored in the memory increase at the signal SHP1, the signal SHN1, the signal SHP2, and the signal SHN2 in this order. The control unit can judge the increasing tendency of the charging curve of the secondary battery 42 on the fact that the cycle TD1 to the cycle TD3 and the like at which the signal ABNC is output become short.

Thus, the semiconductor device of one embodiment of the present invention can monitor the charging characteristics and control charging when the secondary battery 42 is charged. The semiconductor device can detect deterioration of the secondary battery 42 by controlling the slope of the charging current during CV charging, for example. Thus, the semiconductor device functions as an anomaly detection circuit of the secondary battery 42.

In the semiconductor device of one embodiment of the present invention, the circuit 40 can efficiently use the secondary battery 42 to drive various electronic devices as shown in Embodiment 3 or Embodiment 4. When processing function of electronic devices is used, the semiconductor device can be referred to as a secondary battery control system.

Figure 32:
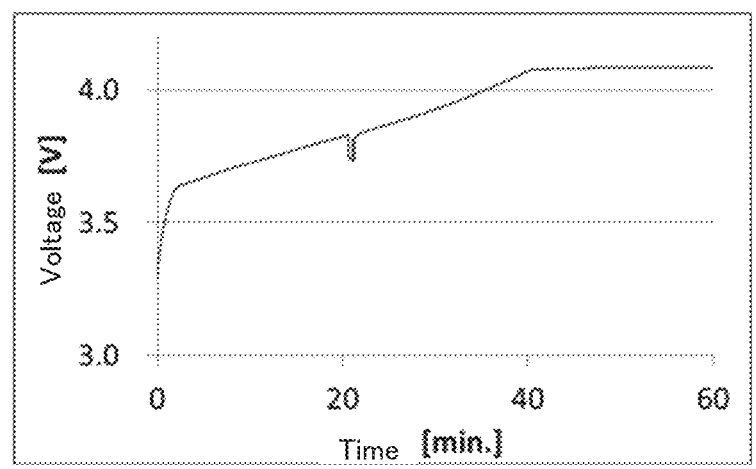
FIG. 32 is a graph showing a micro-short circuit.

The semiconductor device of one embodiment of the present invention can deal with a sharp change or a moderate change of the charging characteristics of the secondary battery 42. The sharp change of the charging characteristics of the secondary battery 42 includes a sharp change such as a micro-short circuit shown in FIG. 32. By monitoring the charging characteristics of the secondary battery 42, the electronic device can be stably driven. Furthermore, the power consumption can be reduced using OS transistors.

A charge control circuit, an anomaly detection circuit, a secondary battery control system, and the like, each including an OS transistor, may be referred to as BTOS (Battery operating system or Battery oxide semiconductor).

Note that the semiconductor device of one embodiment of the present invention is not interpreted as being limited to the circuit diagrams shown in this embodiment. The semiconductor device of one embodiment of the present invention also includes a semiconductor device having a circuit structure comparable to the circuit structure described in this embodiment.

This embodiment can be implemented in combination with any of the structures described in the other embodiments and the like, as appropriate.

Embodiment 2

In this embodiment, examples of shapes of a secondary battery used in the above embodiment are described.

[Coin Secondary Battery]

Figure 8A:
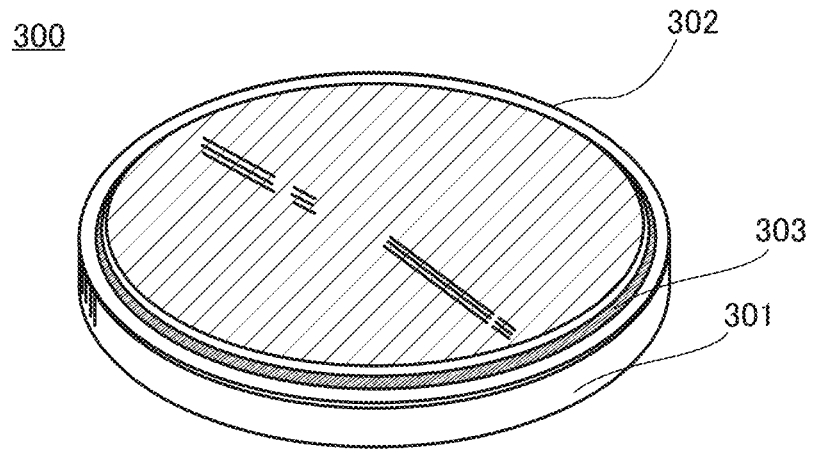
FIG. 8A to FIG. 8C are diagrams showing a coin secondary battery.
Figure 8B:
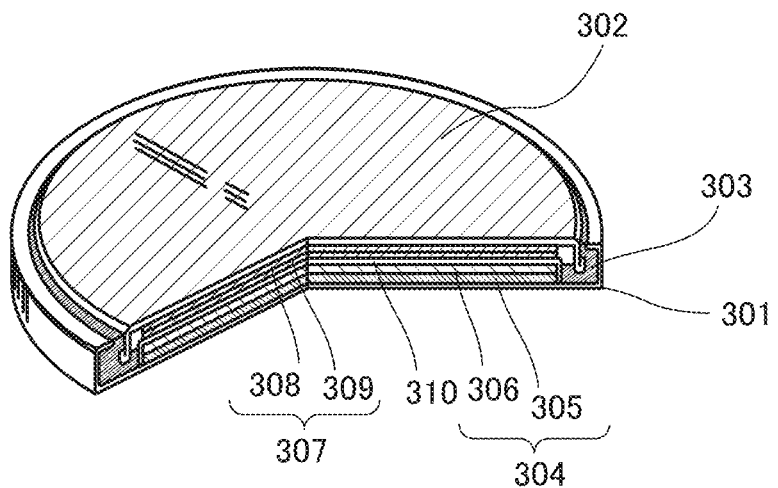

First, an example of a coin secondary battery is described. FIG. 8A is an external view of a coin (single-layer flat type) secondary battery, and FIG. 8B is a cross-sectional view thereof.

In a coin secondary battery 300, a positive electrode can 301 also serving as a positive electrode terminal and a negative electrode can 302 also serving as a negative electrode terminal are insulated and sealed by a gasket 303 made of polypropylene or the like. A positive electrode 304 includes a positive electrode current collector 305 and a positive electrode active material layer 306 provided in contact with the positive electrode current collector 305. A negative electrode 307 includes a negative electrode current collector 308 and a negative electrode active material layer 309 provided in contact with the negative electrode current collector 308.

Note that only one surface of each of the positive electrode 304 and the negative electrode 307 used for the coin secondary battery 300 is provided with an active material layer.

For the positive electrode can 301 and the negative electrode can 302, a metal having corrosion resistance to an electrolyte solution, such as nickel, aluminum, or titanium, an alloy of such a metal, or an alloy of such a metal and another metal (e.g., stainless steel) can be used. The positive electrode can 301 and the negative electrode can 302 are preferably covered with nickel, aluminum, or the like in order to prevent corrosion due to the electrolyte solution. The positive electrode can 301 and the negative electrode can 302 are electrically connected to the positive electrode 304 and the negative electrode 307, respectively.

The negative electrode 307, the positive electrode 304, and a separator 310 are immersed in the electrolyte solution; then, as shown in FIG. 8B, the positive electrode 304, the separator 310, the negative electrode 307, and the negative electrode can 302 are stacked in this order with the positive electrode can 301 positioned at the bottom, and the positive electrode can 301 and the negative electrode can 302 are subjected to pressure bonding with the gasket 303 located therebetween, whereby the coin secondary battery 300 is manufactured.

Here, a current flow on charging a secondary battery is described with reference to FIG. 8C. When a secondary battery using lithium is regarded as a closed circuit, lithium ions transfer and a current flows in the same direction. Note that in the secondary battery using lithium, an anode and a cathode change places on charge and discharge, and an oxidation reaction and a reduction reaction occur on the corresponding sides; hence, an electrode with a high reaction voltage is called a positive electrode and an electrode with a low reaction voltage is called a negative electrode. For this reason, in this specification, the positive electrode is referred to as a "positive electrode" or a "+ electrode (plus electrode)" and the negative electrode is referred to as a "negative electrode" or a "− electrode (minus electrode)" in all the cases where charging is performed, discharging is performed, a reverse pulse current is supplied, and a charging current is supplied. The use of terms an "anode" and a "cathode" related to oxidation reaction and reduction reaction might cause confusion because the anode and the cathode interchange on charging and on discharging. Thus, the terms "anode" and "cathode" are not used in this specification. If the term the "anode" or the "cathode" is used, it should be clearly mentioned that the anode or the cathode is which of the one on charging or on discharging and corresponds to which of the positive electrode (plus electrode) or the negative electrode (minus electrode).

Figure 8C:
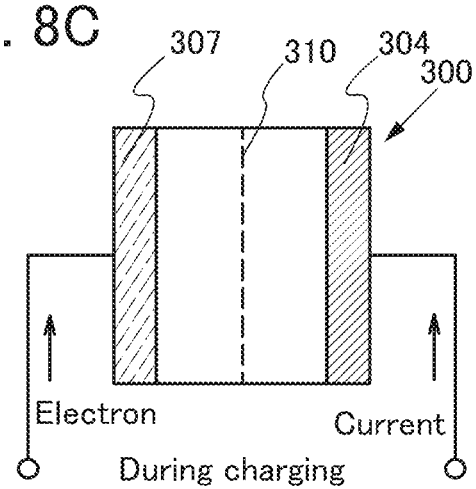

Two terminals shown in FIG. 8C are connected to a charger, and the secondary battery 300 is charged. As charging of the secondary battery 300 proceeds, a voltage difference between electrodes increases.

[Cylindrical Secondary Battery]

Figure 9A:
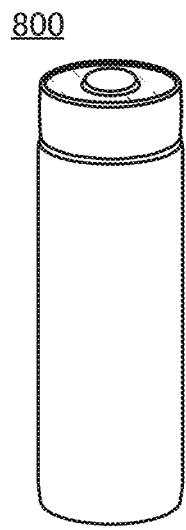
FIG. 9A to FIG. 9D are diagrams showing a cylindrical secondary battery.
Figure 9B:
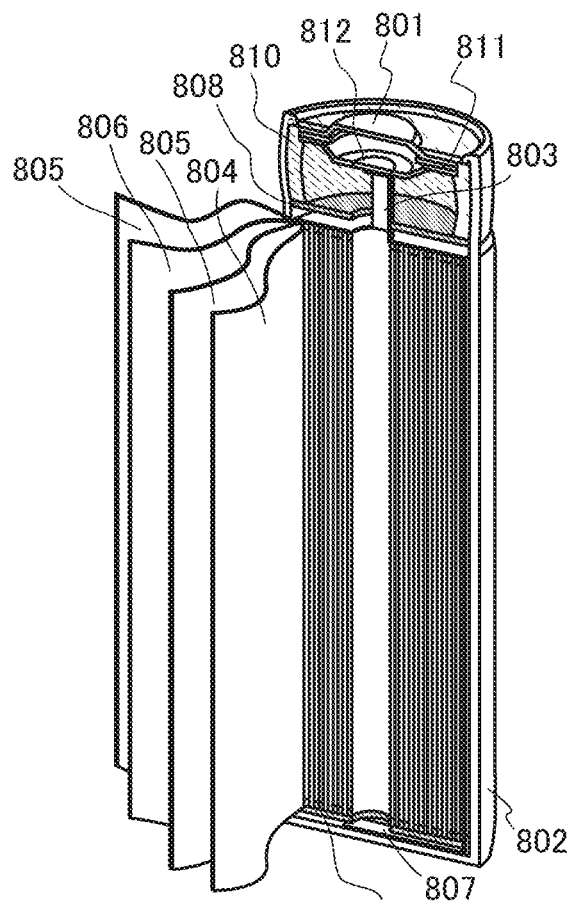

Next, an example of a cylindrical secondary battery is described with reference to FIG. 9. FIG. 9A shows an external view of a secondary battery 800. FIG. 9B schematically shows a cross section of the cylindrical secondary battery 800. As shown in FIG. 9B, the cylindrical secondary battery 800 includes a positive electrode cap (battery lid) 801 on a top surface and a battery can (outer can) 802 on a side surface and a bottom surface. The positive electrode cap and the battery can (outer can) 802 are insulated by a gasket (insulating gasket) 810.

Inside the battery can 802 having a hollow cylindrical shape, a battery element in which a belt-like positive electrode 804 and a belt-like negative electrode 806 are wound with a separator 805 therebetween is provided. Although not shown, the battery element is wound centering around a center pin. One end of the battery can 802 is closed and the other end thereof is opened. For the battery can 802, a metal having corrosion resistance to an electrolyte solution, such as nickel, aluminum, or titanium, an alloy of such a metal, or an alloy of such a metal and another metal (e.g., stainless steel or the like) can be used. Alternatively, the battery can 802 is preferably covered with nickel, aluminum, or the like in order to prevent corrosion due to the electrolyte solution. Inside the battery can 802, the battery element in which the positive electrode, the negative electrode, and the separator are wound is sandwiched between a pair of insulating plates 808 and 809 that face each other. Furthermore, a nonaqueous electrolyte solution (not illustrated) is injected inside the battery can 802 provided with the battery element. As the nonaqueous electrolyte, a nonaqueous electrolyte that is similar to that for a coin secondary battery can be used.

Since a positive electrode and a negative electrode that are used for a cylindrical storage battery are wound, active materials are preferably formed on both surfaces of a current collector. A positive electrode terminal (positive electrode current collector lead) 803 is connected to the positive electrode 804, and a negative electrode terminal (negative electrode current collector lead) 807 is connected to the negative electrode 806. For both the positive electrode terminal 803 and the negative electrode terminal 807, a metal material such as aluminum can be used. The positive electrode terminal 803 and the negative electrode terminal 807 are resistance-welded to a safety valve mechanism 812 and the bottom of the battery can 802, respectively. The safety valve mechanism 812 is electrically connected to a positive electrode cap 801 through a PTC element (Positive Temperature Coefficient) 811. The safety valve mechanism 812 cuts off electrical connection between the positive electrode cap 801 and the positive electrode 804 when the internal pressure of the battery exceeds a predetermined threshold. In addition, the PTC element 811 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

Figure 9C:
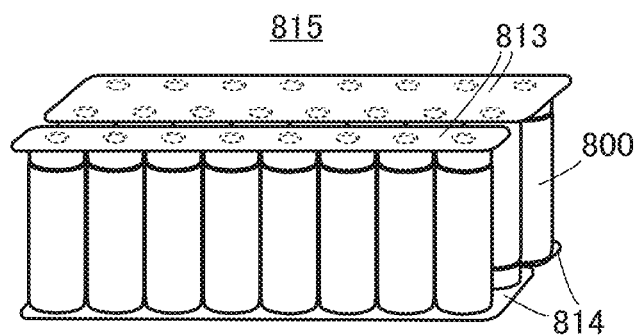

Alternatively, as shown in FIG. 9C, a plurality of secondary batteries 800 may be provided between a conductive plate 813 and a conductive plate 814 to form a module 815. The plurality of secondary batteries 800 may be connected parallel to each other, connected in series, or connected in series after being connected parallel to each other. With the module 815 including the plurality of secondary batteries 800, large electric power can be extracted.

Figure 9D:
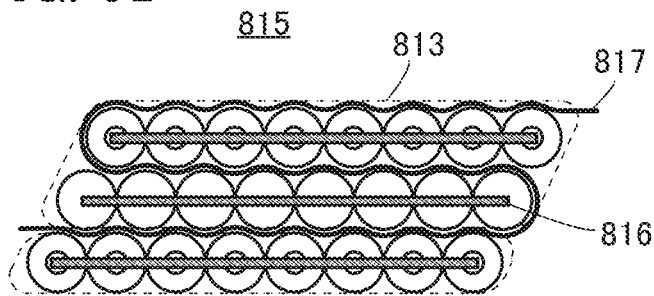

FIG. 9D is a top view of the module 815. The conductive plate 813 is shown by a dotted line for clarity of the drawing. As shown in FIG. 9D, the module 815 may include a wiring 816 electrically connecting the plurality of secondary batteries 800 with each other. It is possible to provide the conductive plate over the wiring 816 to overlap with each other. In addition, a temperature control device 817 may be provided between the plurality of secondary batteries 800. The secondary batteries 800 can be cooled with the temperature control device 817 when overheated, whereas the secondary batteries 800 can be heated with the temperature control device 817 when cooled too much. Thus, the performance of the module 815 is less likely to be influenced by the outside temperature. A heating medium included in the temperature control device 817 preferably has an insulating property and incombustibility.

[Structure Examples of Secondary Battery]

Other structural examples of secondary batteries are described with reference to FIG. 10 to FIG. 13.

Figure 10A:
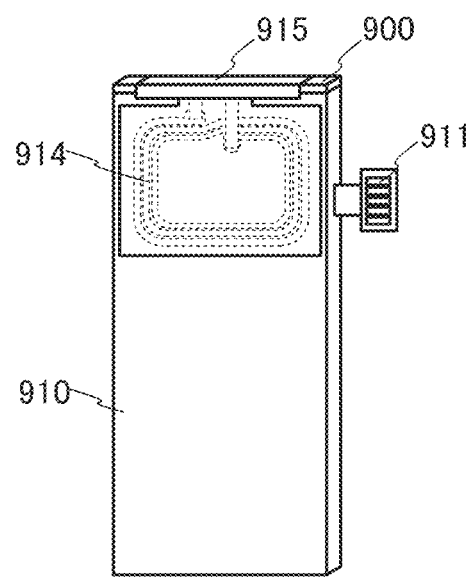
FIG. 10A and FIG. 10B are diagrams showing an example of a secondary battery.
Figure 10B:
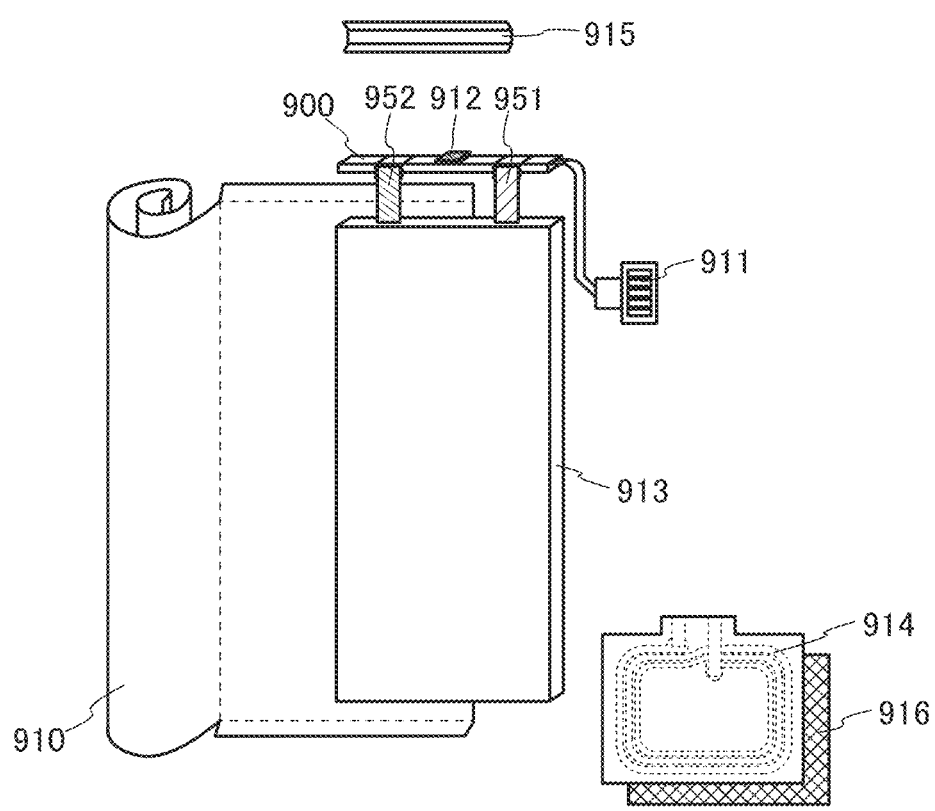

FIG. 10A and FIG. 10B are external views of a secondary battery. A secondary battery 913 is connected to an antenna 914 and an antenna 915 through a circuit board 900. A label 910 is attached to the secondary battery 913. Moreover, as shown in FIG. 10B, the secondary battery 913 is connected to a terminal 951 and a terminal 952.

The circuit board 900 includes terminals 911 and a circuit 912. The terminals 911 are connected to the terminal 951, the terminal 952, the antenna 914, the antenna 915, and the circuit 912. Note that a plurality of terminals 911 serving as a control signal input terminal, a power supply terminal, and the like may be provided.

The circuit 912 may be provided on the rear surface of the circuit board 900. Note that the shapes of the antenna 914 and the antenna 915 are not limited to coil shapes, and may be linear shapes or plate shapes, for example. An antenna such as a planar antenna, an aperture antenna, a traveling-wave antenna, an EH antenna, a magnetic-field antenna, or a dielectric antenna may be used. Alternatively, the antenna 914 or the antenna 915 may be a flat-plate conductor. This flat-plate conductor can serve as one of conductors for electric field coupling. That is, the antenna 914 or the antenna 915 can serve as one of the two conductors included in a capacitor. Thus, electric power can be transmitted and received not only by an electromagnetic field or a magnetic field but also by an electric field.

The line width of the antenna 914 is preferably larger than the line width of the antenna 915. This makes it possible to increase the amount of power received by the antenna 914.

The secondary battery includes a layer 916 between the antenna 914 and the antenna 915, and the secondary battery 913. The layer 916 has a function of preventing an influence on an electromagnetic field by the secondary battery 913, for example. As the layer 916, for example, a magnetic body can be used.

Note that the structure of the secondary battery is not limited to that in FIG. 10.

Figure 11A:
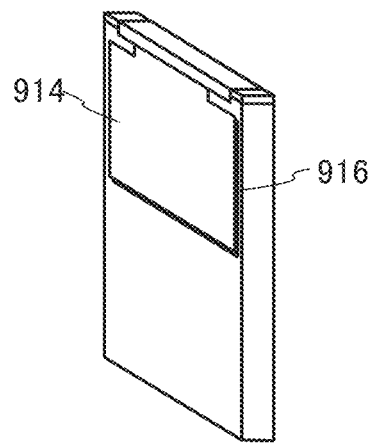
FIG. 11A to FIG. 11D are diagrams showing an example of a secondary battery.
Figure 11B:
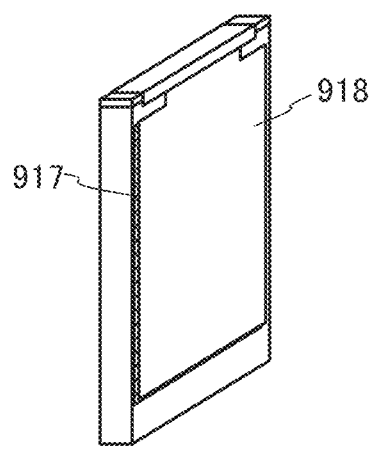

For example, as shown in FIG. 11A and FIG. 11B, opposing surfaces of the secondary battery 913 in FIG. 10A and FIG. 10B may be provided with respective antennas. FIG. 11A is an external view seen from one side of the opposing surfaces, and FIG. 11B is an external view seen from the other side of the opposing surfaces. For portions similar to those in FIG. 10A and FIG. 10B, refer to the description of the secondary battery shown in FIG. 10A and FIG. 10B as appropriate.

As shown in FIG. 11A, the antenna 914 is provided on one of the opposing surfaces of the secondary battery 913 with the layer 916 located therebetween, and as shown in FIG. 11B, an antenna 918 is provided on the other of the opposing surfaces of the secondary battery 913 with a layer 917 located therebetween. The layer 917 has a function of preventing an influence on an electromagnetic field by the secondary battery 913, for example. As the layer 917, for example, a magnetic body can be used.

With the above structure, both of the antenna 914 and the antenna 918 can be increased in size. The antenna 918 has a function of communicating data with an external device, for example. An antenna with a shape that can be used to the antenna 914, for example, can be used as the antenna 918. As a system for communication using the antenna 918 between the secondary battery and another device, a response method that can be used between the secondary battery and another device, such as near field communication (NFC), can be employed.

Figure 11C:
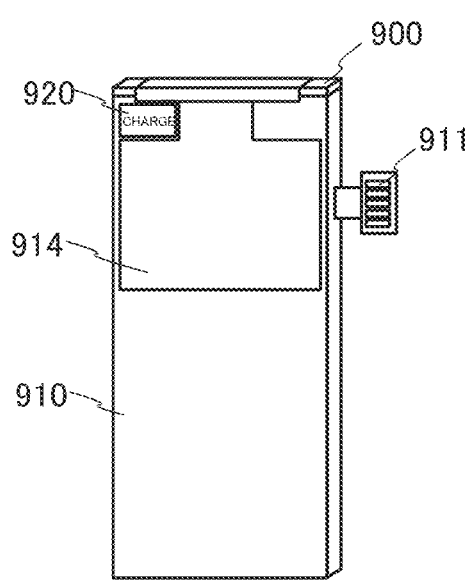

Alternatively, as shown in FIG. 11C, the secondary battery 913 in FIG. 10A and FIG. 10B may be provided with a display device 920. The display device 920 is electrically connected to the terminal 911. Note that the label 910 is not necessarily provided in a portion where the display device 920 is provided. For portions similar to those in FIG. 10A and FIG. 10B, refer to the description of the secondary battery shown in FIG. 10A and FIG. 10B as appropriate.

The display device 920 can display, for example, an image showing whether charging is being carried out, an image showing the amount of stored power, or the like. As the display device 920, electronic paper, a liquid crystal display device, an electroluminescent (EL) display device, or the like can be used. For example, the use of electronic paper can reduce power consumption of the display device 920.

Figure 11D:
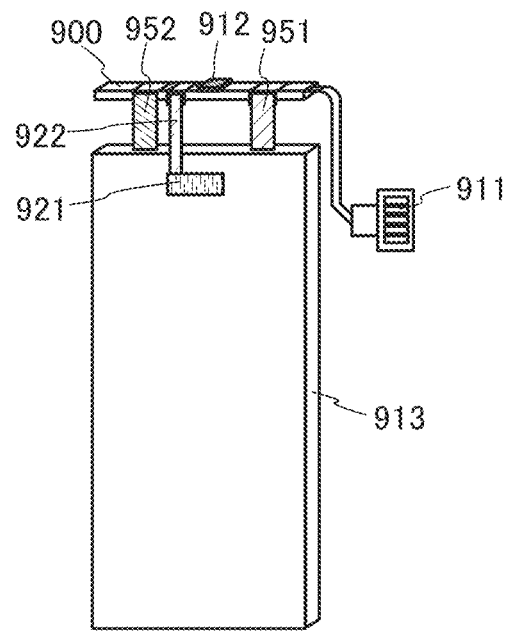

Alternatively, as shown in FIG. 11D, the secondary battery 913 shown in FIG. 10A and FIG. 10B may be provided with a sensor 921. The sensor 921 is electrically connected to the terminal 911 through a terminal 922. For portions similar to those in FIG. 10A and FIG. 10B, refer to the description of the secondary battery shown in FIG. 10A and FIG. 10B as appropriate.

The sensor 921 has a function of measuring, for example, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays. With the sensor 921, for example, data on an environment (e.g., temperature) where the secondary battery is placed can be acquired and stored in a memory inside the circuit 912.

Furthermore, a structure example of the secondary battery 913 is described with reference to FIG. 12 and FIG. 13.

Figure 12A:
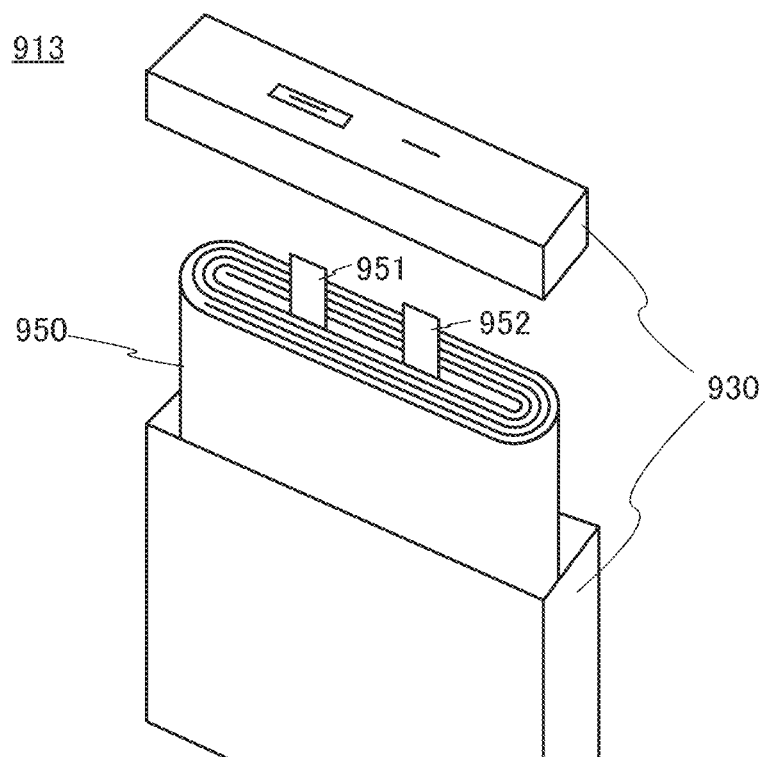
FIG. 12A and FIG. 12B are diagrams showing an example of a secondary battery.

The secondary battery 913 shown in FIG. 12A includes a wound body 950 provided with the terminal 951 and the terminal 952 inside a housing 930. The wound body 950 is immersed in an electrolyte solution inside the housing 930. The terminal 952 is in contact with the housing 930. An insulator or the like inhibits contact between the terminal 951 and the housing 930. In FIG. 12A, the housing 930 divided into two pieces is shown for convenience; however, in the actual structure, the wound body 950 is covered with the housing 930 and the terminal 951 and the terminal 952 extend to the outside of the housing 930. For the housing 930, a metal material (e.g., aluminum) or a resin material can be used.

Figure 12B:
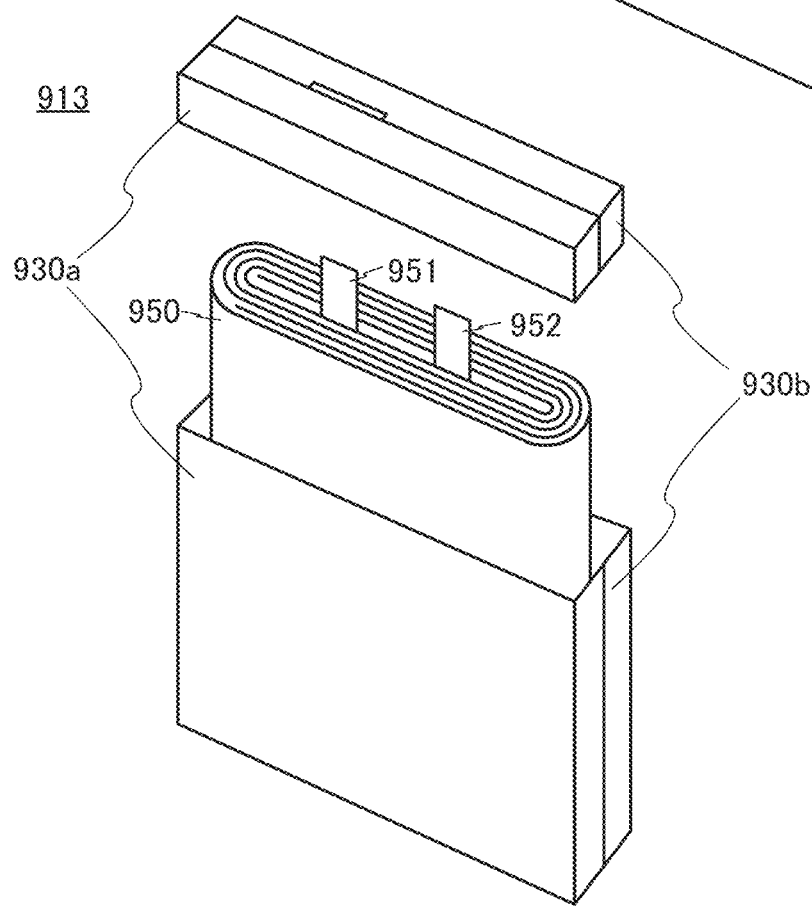

Note that as shown in FIG. 12B, the housing 930 in FIG. 12A may be formed using a plurality of materials. For example, in the secondary battery 913 in FIG. 12B, a housing 930a and a housing 930b are bonded to each other, and the wound body 950 is provided in a region surrounded by the housing 930a and the housing 930b.

For the housing 930a, an insulating material such as an organic resin can be used. In particular, when a material such as an organic resin is used for the side on which an antenna is formed, blocking of an electric field from the secondary battery 913 can be inhibited. When an electric field is not significantly blocked by the housing 930a, an antenna such as the antenna 914 and the antenna 915 may be provided inside the housing 930a. For the housing 930b, a metal material can be used, for example.

Figure 13:
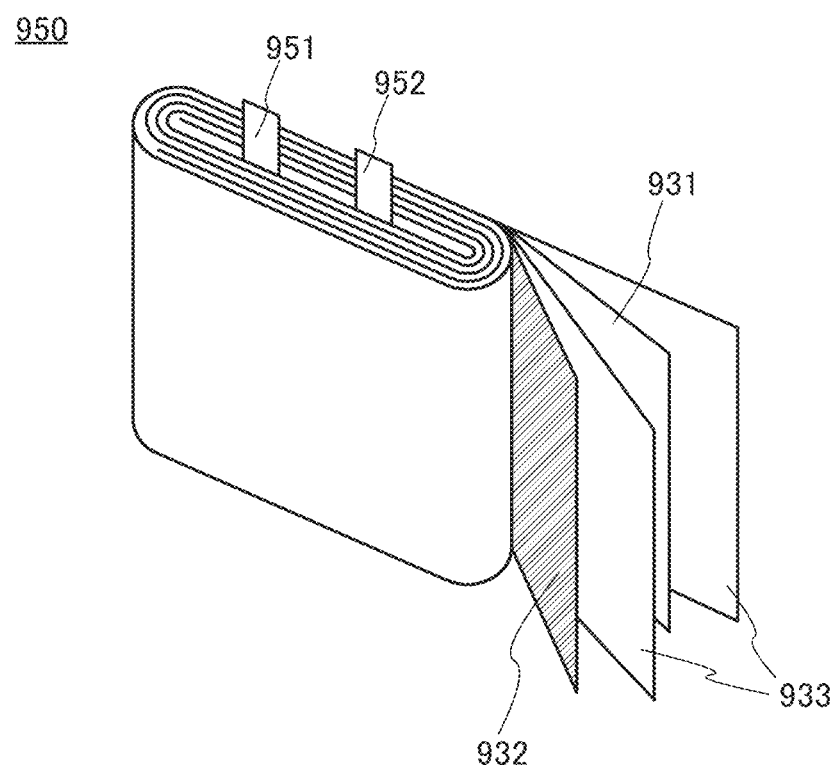
FIG. 13 is a diagram showing an example of a secondary battery.

FIG. 13 shows the structure of the wound body 950. The wound body 950 includes a negative electrode 931, a positive electrode 932, and separators 933. The wound body 950 is obtained by winding a sheet of a stack in which the negative electrode 931 overlaps with the positive electrode 932 with the separator 933 provided therebetween. Note that a plurality of stacks each including the negative electrode 931, the positive electrode 932, and the separator 933 may be stacked.

The negative electrode 931 is connected to the terminal 911 shown in FIG. 10 through one of the terminal 951 and the terminal 952. The positive electrode 932 is connected to the terminal 911 in FIG. 10 through the other of the terminal 951 and the terminal 952.

[Laminated Secondary Battery]

Next, examples of a laminated secondary battery are described with reference to FIG. 14 to FIG. 20. When the laminated secondary battery has flexibility and is used in an electronic device at least part of which is flexible, the secondary battery can be bent as the electronic device is bent.

Figure 14A:
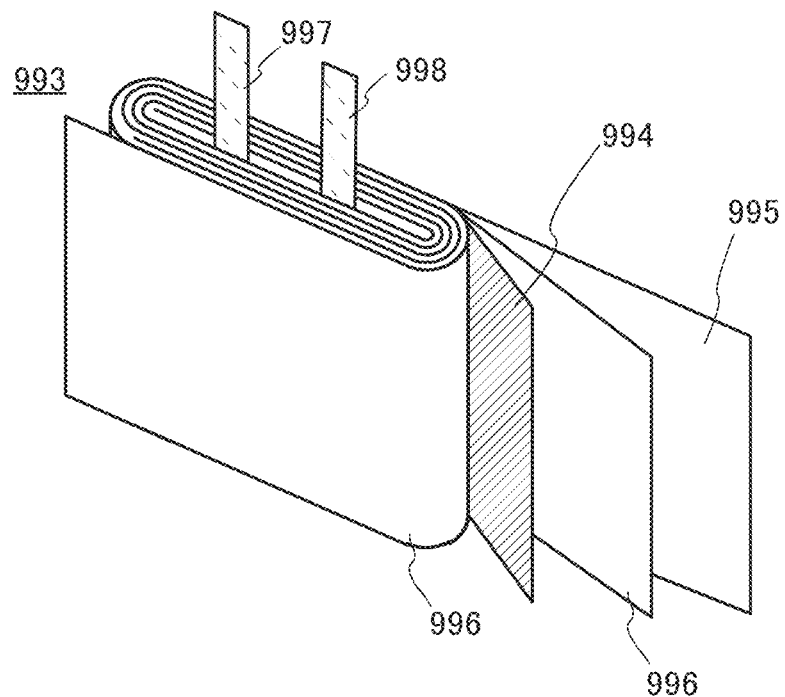
FIG. 14A to FIG. 14C are diagrams showing a laminated secondary battery.

A laminated secondary battery 980 is described using FIG. 14. The laminated secondary battery 980 includes a wound body 993 shown in FIG. 14A. The wound body 993 includes a negative electrode 994, a positive electrode 995, and a separator 996. The wound body 993 is, like the wound body 950 shown in FIG. 13, obtained by winding a sheet of a stack in which the negative electrode 994 overlaps with the positive electrode 995 with the separator 996 provided therebetween.

Note that the number of stacks each including the negative electrode 994, the positive electrode 995, and the separator 996 may be determined as appropriate depending on required capacity and element volume. The negative electrode 994 is connected to a negative electrode current collector (not shown) through one of a lead electrode 997 and a lead electrode 998. The positive electrode 995 is connected to a positive electrode current collector (not shown) through the other of the lead electrode 997 and the lead electrode 998.

Figure 14B:
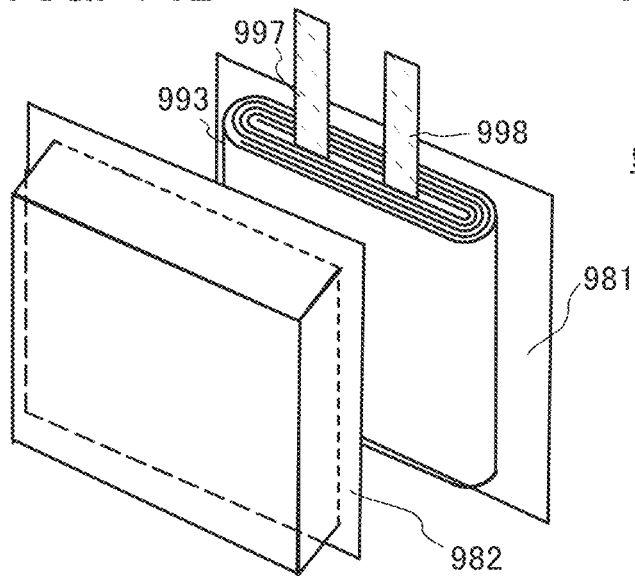
Figure 14C:
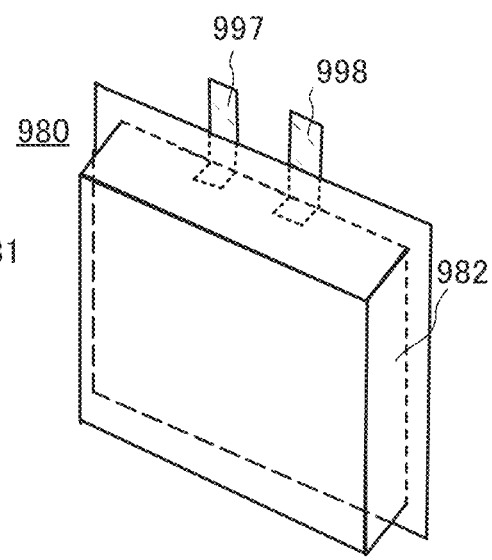

As shown in FIG. 14B, the wound body 993 is packed in a space formed by bonding a film 981 and a film 982 having a depressed portion that serve as exterior bodies by thermocompression bonding or the like, whereby the secondary battery 980 shown in FIG. 14C can be formed. The wound body 993 includes the lead electrode 997 and the lead electrode 998, and is immersed in an electrolyte solution inside a space surrounded by the film 981 and the film 982 having a depressed portion.

For the film 981 and the film 982 having a depressed portion, a metal material such as aluminum or a resin material can be used, for example. With the use of a resin material for the film 981 and the film 982 having a depressed portion, the film 981 and the film 982 having a depressed portion can be changed in their forms when external force is applied; thus, a flexible storage battery can be formed.

FIG. 14B and FIG. 14C show an example where a space is formed by two films; the wound body 993 may be placed in a space formed by bending one film.

In addition, FIG. 14 shows an example in which the secondary battery 980 includes a wound body in a space formed by films serving as exterior bodies; as shown in FIG. 15, for example, a secondary battery may include a plurality of strip-shaped positive electrodes, separators, and negative electrodes in a space formed by films serving as exterior bodies.

Figure 15A:
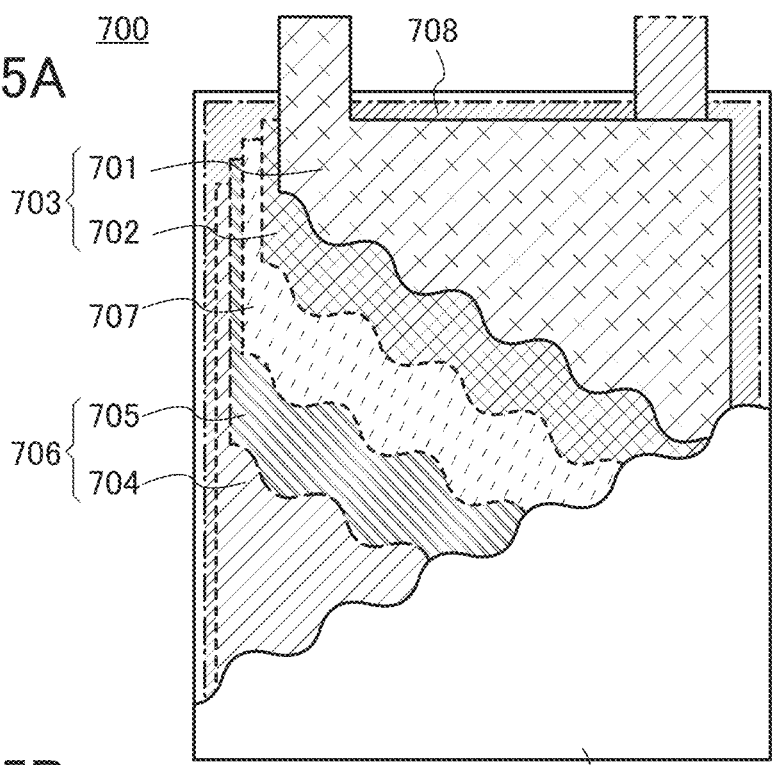
FIG. 15A and FIG. 15B are diagrams showing a laminated secondary battery.

A laminated secondary battery 700 shown in FIG. 15A includes a positive electrode 703 including a positive electrode current collector 701 and a positive electrode active material layer 702, a negative electrode 706 including a negative electrode current collector 704 and a negative electrode active material layer 705, a separator 707, an electrolyte solution 708, and an exterior body 709. The separator 707 is provided between the positive electrode 703 and the negative electrode 706 in the exterior body 709. The exterior body 709 is filled with the electrolyte solution 708. The electrolyte solution described in Embodiment 2 can be used as the electrolyte solution 708.

In the laminated secondary battery 700 shown in FIG. 15A, the positive electrode current collector 701 and the negative electrode current collector 704 also serve as terminals for electrical contact with the outside. For this reason, the positive electrode current collector 701 and the negative electrode current collector 704 may be arranged so that part of the positive electrode current collector 701 and part of the negative electrode current collector 704 are exposed to the outside of the exterior body 709. Alternatively, a lead electrode and the positive electrode current collector 701 or the negative electrode current collector 704 may be bonded to each other by ultrasonic welding, and instead of the positive electrode current collector 701 and the negative electrode current collector 704, the lead electrode may be exposed to the outside of the exterior body 709.

As the exterior body 709 of the laminated secondary battery 700, for example, a laminated film having a three-layer structure can be employed in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided over the metal thin film as the outer surface of the exterior body.

Figure 15B:
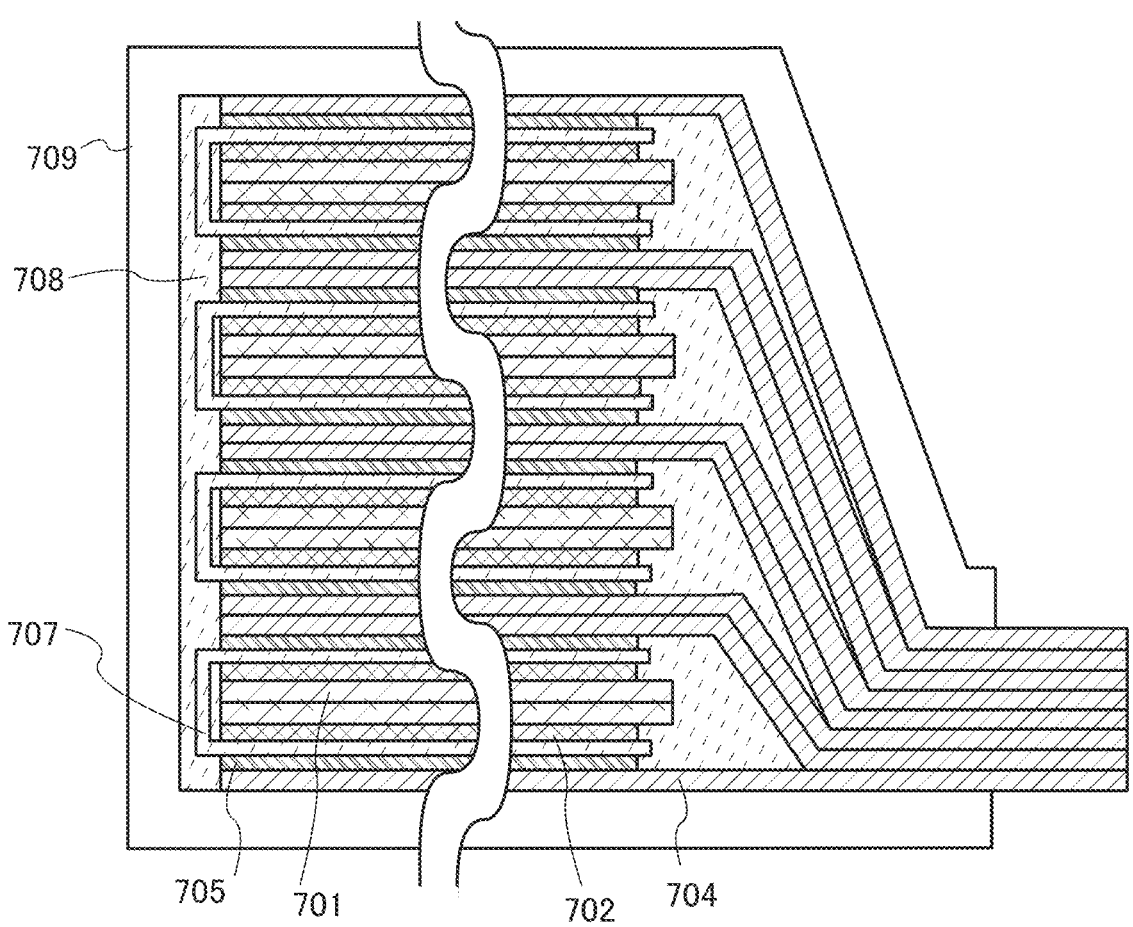

FIG. 15B shows a cross section example of the laminated secondary battery 700. FIG. 15A shows an example in which only two current collectors are included for simplicity; an actual battery includes a plurality of electrode layers as shown in FIG. 15B.

In FIG. 15B, the number of electrode layers is 16, for example. The secondary battery 700 has flexibility even though the secondary battery 700 includes 16 electrode layers. FIG. 15B shows a structure including 8 layers of negative electrode current collectors 704 and 8 layers of positive electrode current collectors 701, i.e., 16 layers in total. Note that FIG. 15B shows a cross section of the extraction portion of the negative electrode, and the 8 layers of the negative electrode current collectors 704 are bonded to each other by ultrasonic welding. It is needless to say that the number of electrode layers is not limited to 16, and may be more than 16 or less than 16. The larger the number of electrode layers becomes, the larger capacity the secondary battery can have. By contrast, with a small number of electrode layers, the secondary battery can have small thickness and high flexibility.

Figure 16:
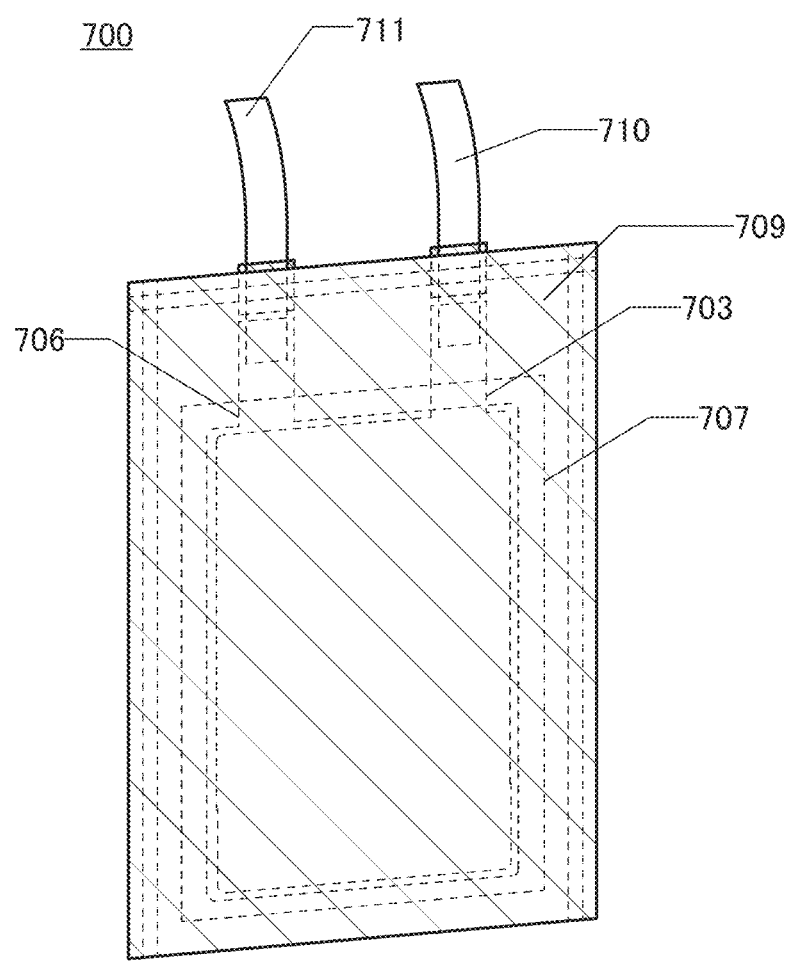
FIG. 16 is an external view of a secondary battery.
Figure 17:
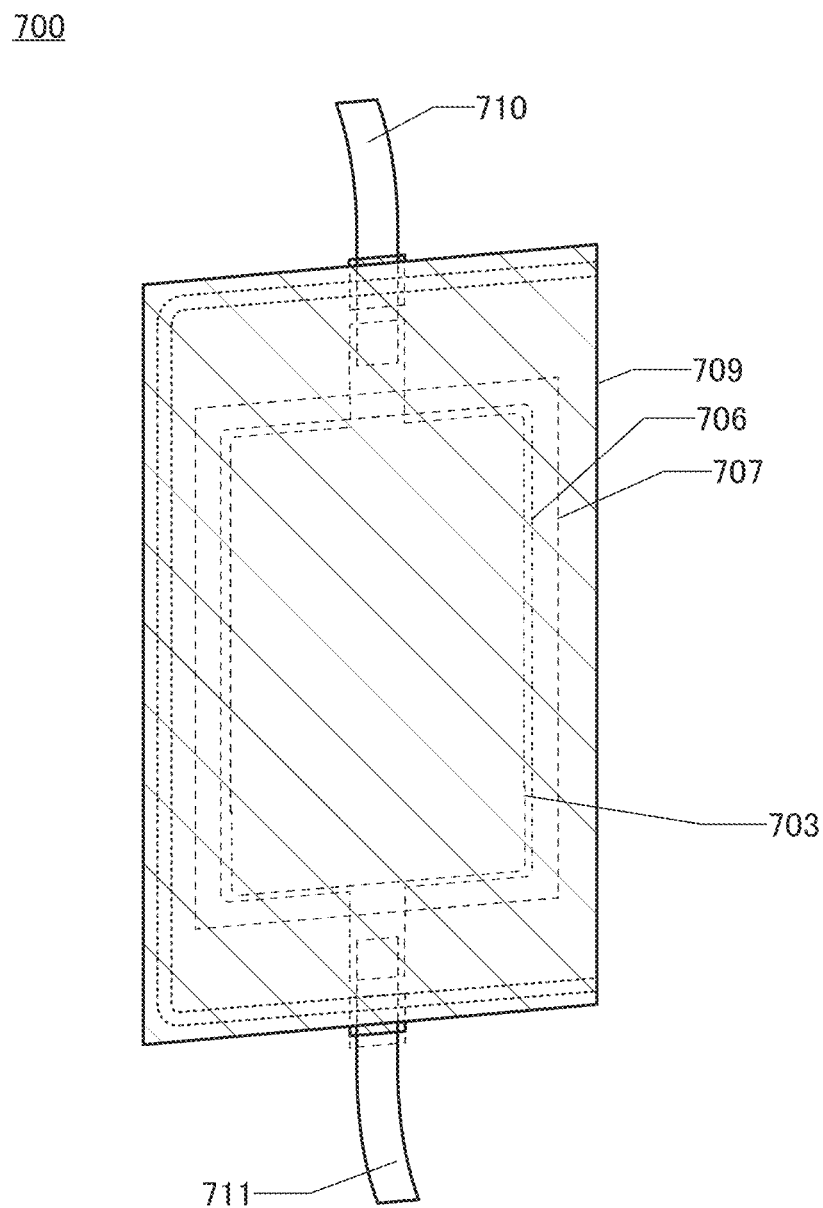
FIG. 17 is an external view of a secondary battery.

FIG. 16 and FIG. 17 show examples of external views of the laminated secondary batteries 700. In FIG. 16 and FIG. 17, the positive electrode 703, the negative electrode 706, the separator 707, the exterior body 709, a positive electrode lead electrode 710, and a negative electrode lead electrode 711 are included.

Figure 18A:
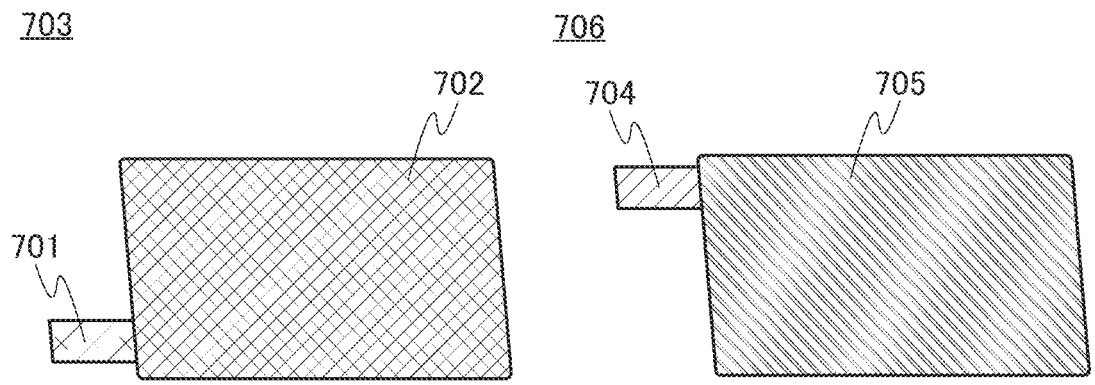
FIG. 18A to FIG. 18C are diagrams showing a making method of a secondary battery.

FIG. 18A shows external views of the positive electrode 703 and the negative electrode 706. The positive electrode 703 includes the positive electrode current collector 701, and the positive electrode active material layer 702 is formed on a surface of the positive electrode current collector 701. The positive electrode 703 also includes a region where the positive electrode current collector 701 is partly exposed (hereinafter, referred to as a tab region). The negative electrode 706 includes the negative electrode current collector 704, and the negative electrode active material layer 705 is formed on a surface of the negative electrode current collector 704. The negative electrode 706 also includes a region where the negative electrode current collector 704 is partly exposed, that is, a tab region. The areas and the shapes of the tab regions included in the positive electrode and the negative electrode are not limited to those shown in FIG. 18A.

[Method of Making Laminated Secondary Battery]

Figure 18B:
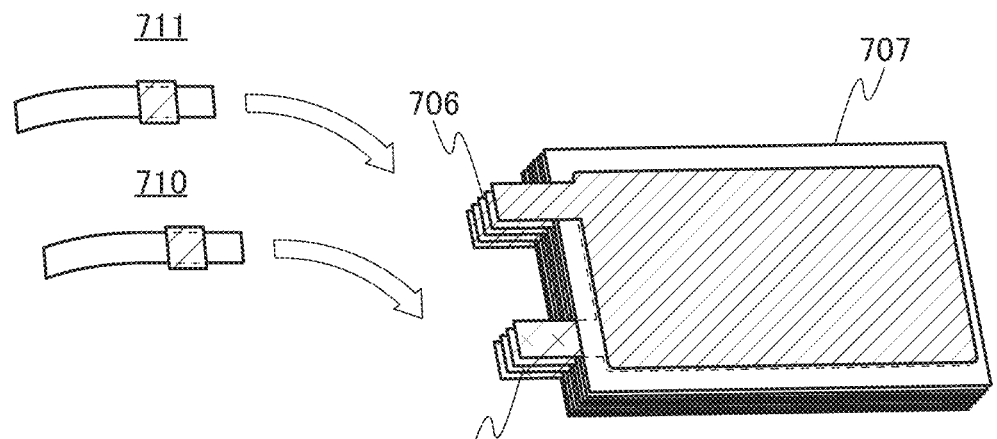
Figure 18C:
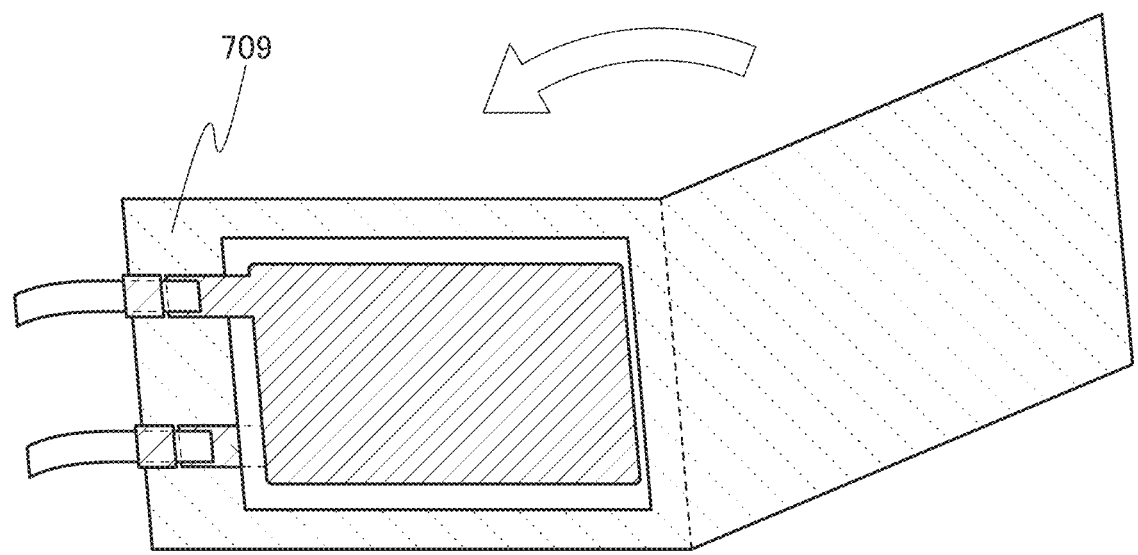

An example of a making method of the laminated secondary battery whose external view is shown in FIG. 16 is described using FIG. 18B and FIG. 18C.

First, the negative electrode 706, the separator 707, and the positive electrode 703 are stacked. FIG. 18B shows a stack including the negative electrode 706, the separator 707, and the positive electrode 703. The secondary battery described here as an example includes 5 negative electrodes and 4 positive electrodes. Next, the tab regions of the positive electrodes 703 are bonded to each other, and the tab region of the positive electrode on the outermost surface and the positive electrode lead electrode 710 are bonded to each other. The bonding can be performed by ultrasonic welding, for example. In a similar manner, the tab regions of the negative electrodes 706 are bonded to each other, and the tab region of the negative electrode on the outermost surface and the negative electrode lead electrode 711 are bonded to each other.

After that, the negative electrode 706, the separator 707, and the positive electrode 703 are placed over the exterior body 709.

Subsequently, the exterior body 709 is folded along a dashed line as shown in FIG. 18C. Then, the outer edges of the exterior body 709 are bonded to each other. The bonding can be performed by thermocompression, for example. At this time, a part (or one side) of the exterior body 709 is left unbonded (to provide an inlet) so that the electrolyte solution 708 can be introduced later.

Next, the electrolyte solution 708 (not shown) is introduced into the exterior body 709 from the inlet of the exterior body 709. The electrolyte solution 708 is preferably introduced in a reduced pressure atmosphere or in an inert gas atmosphere. Lastly, the inlet is sealed. In the above manner, the laminated secondary battery 700 can be made.

[Bendable Secondary Battery]

Next, an example of a bendable secondary battery is described with reference to FIG. 19 and FIG. 20.

Figure 19A:
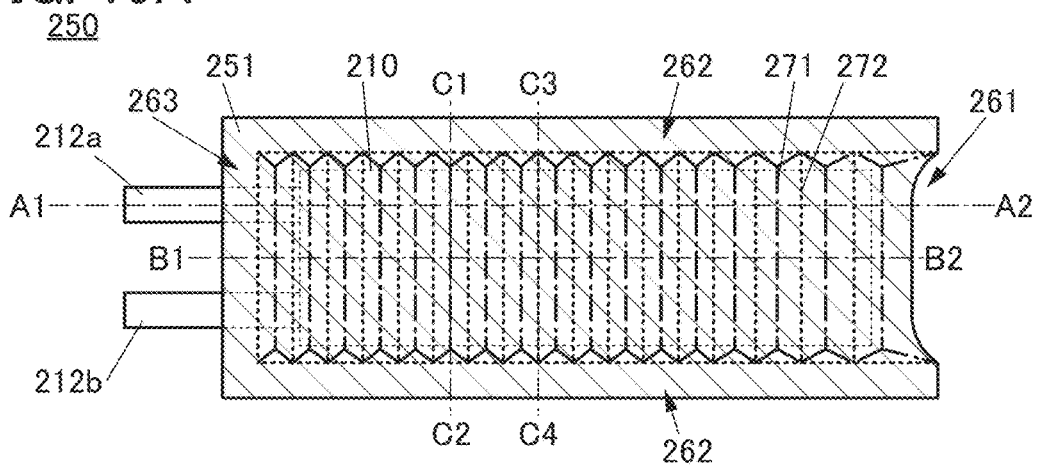
FIG. 19A to FIG. 19E are diagrams showing a bendable secondary battery.
Figure 19B:
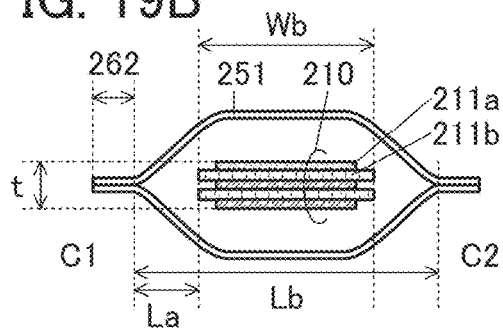
Figure 19C:
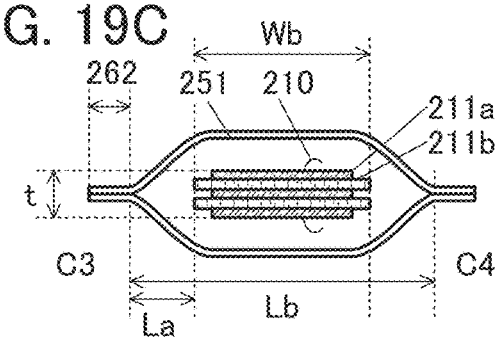
Figure 19D:
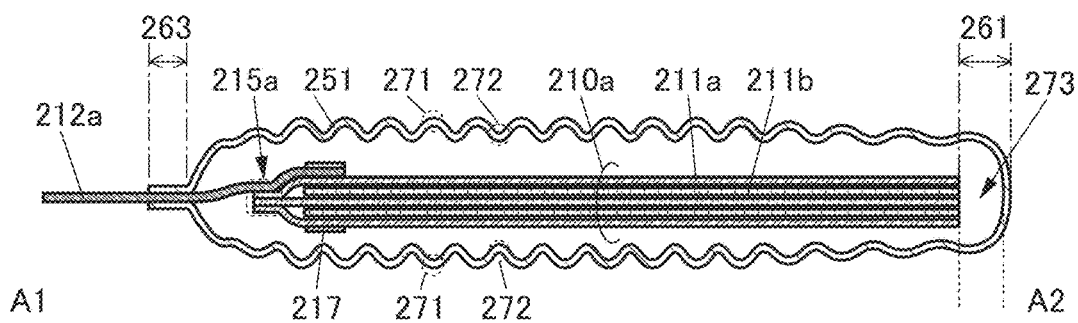

FIG. 19A is a schematic top view of a bendable secondary battery 250. FIG. 19B, FIG. 19C, and FIG. 19D are schematic cross-sectional views taken along the cut line C1-C2, the cut line C3-C4, and the cut line A1-A2, respectively, in FIG. 19A. The secondary battery 250 includes an exterior body 251 and a positive electrode 211a and a negative electrode 211b held in the exterior body 251. A lead 212a electrically connected to the positive electrode 211a and a lead 212b electrically connected to the negative electrode 211b are extended to the outside of the exterior body 251. In addition to the positive electrode 211a and the negative electrode 211*b*, an electrolyte solution (not shown) is enclosed in a region surrounded by the exterior body 251.

Figure 20A:
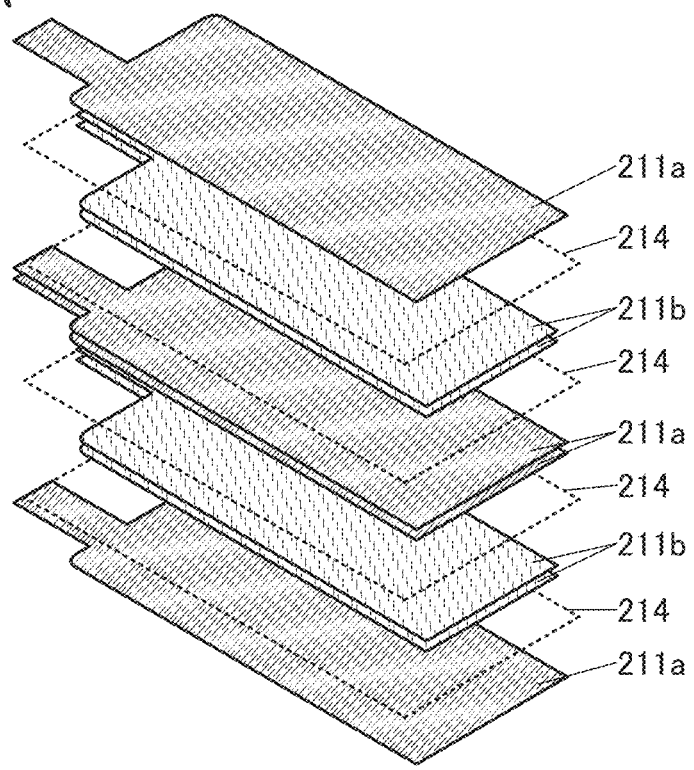
FIG. 20A and FIG. 20B are diagrams showing a bendable secondary battery.
Figure 20B:
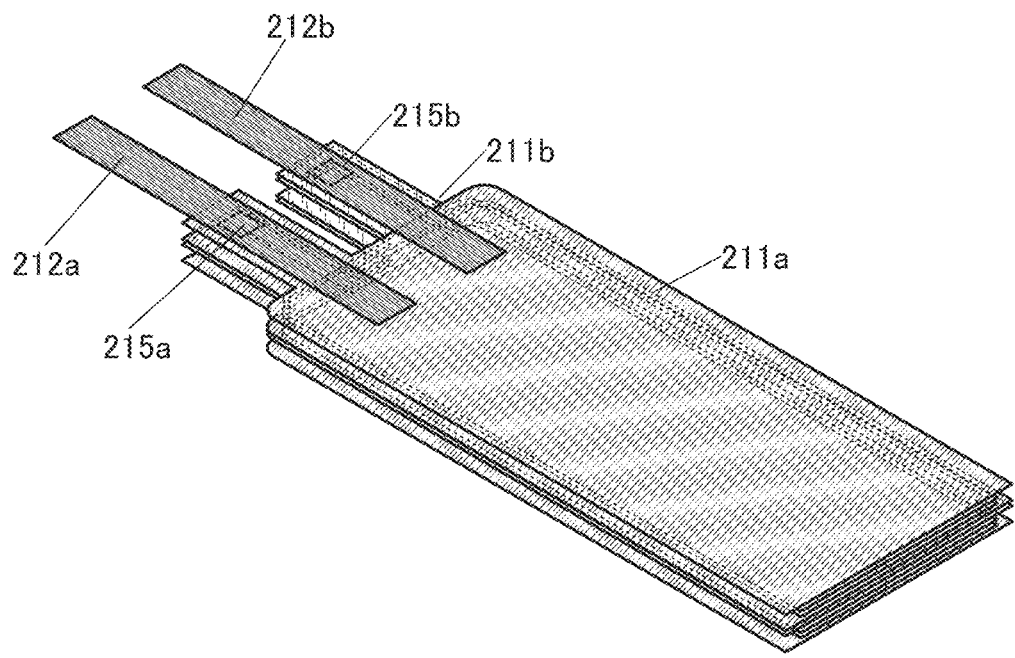

The positive electrode 211*a* and the negative electrode 211*b* that are included in the secondary battery 250 are described using FIG. 20. FIG. 20A is a perspective view showing the stacking order of the positive electrode 211*a*, the negative electrode 211*b*, and a separator 214. FIG. 20B is a perspective view showing the lead 212*a* and the lead 212*b* in addition to the positive electrode 211*a* and the negative electrode 211*b*.

As shown in FIG. 20A, the secondary battery 250 includes a plurality of strip-shaped positive electrodes 211*a*, a plurality of strip-shaped negative electrodes 211*b*, and a plurality of separators 214. The positive electrode 211*a* and the negative electrode 211*b* each include a protruding tab portion and a portion other than the tab portion. A positive electrode active material layer is formed on one surface of the positive electrode 211*a* other than the tab portion, and a negative electrode active material layer is formed on one surface of the negative electrode 211*b* other than the tab portion.

The positive electrodes 211*a* and the negative electrodes 211*b* are stacked so that surfaces of the positive electrodes 211*a* on each of which the positive electrode active material layer is not formed are in contact with each other and that surfaces of the negative electrodes 211*b* on each of which the negative electrode active material layer is not formed are in contact with each other.

Furthermore, the separator 214 is provided between the surface of the positive electrode 211*a* on which the positive electrode active material layer is formed and the surface of the negative electrode 211*b* on which the negative electrode active material layer is formed. In FIG. 20A, the separator 214 is shown by a dotted line for easy viewing.

In addition, as shown in FIG. 20B, the plurality of positive electrodes 211*a* are electrically connected to the lead 212*a* in a bonding portion 215*a*. The plurality of negative electrodes 211*b* are electrically connected to the lead 212*b* in a bonding portion 215*b*.

Next, the exterior body 251 is described using FIG. 19B, FIG. 19C, FIG. 19D, and FIG. 19E.

The exterior body 251 has a film-like shape and is folded in half with the positive electrodes 211*a* and the negative electrodes 211*b* between facing portions of the exterior body 251. The exterior body 251 includes a folded portion 261, a pair of seal portions 262, and a seal portion 263. The pair of seal portions 262 is provided with the positive electrodes 211*a* and the negative electrodes 211*b* positioned therebetween and thus can also be referred to as side seals. The seal portion 263 includes portions overlapping with the lead 212*a* and the lead 212*b* and can also be referred to as a top seal.

Part of the exterior body 251 that overlaps with the positive electrodes 211*a* and the negative electrodes 211*b* preferably has a wave shape in which crest lines 271 and trough lines 272 are alternately arranged. The seal portions 262 and the seal portion 263 of the exterior body 251 are preferably flat.

FIG. 19B shows a cross section along the part overlapping with the crest line 271. FIG. 19C shows a cross section along the part overlapping with the trough line 272. FIG. 19B and FIG. 19C correspond to cross sections of the secondary battery 250, the positive electrodes 211*a*, and the negative electrodes 211*b* in the width direction.

Here, the distance between end portions of the positive electrode 211*a* and the negative electrode 211*b* in the width direction and the seal portion 262, that is, the distance between the end portions of the positive electrode 211*a* and the negative electrode 211*b* and the seal portion 262 is referred to as a distance La. When the secondary battery 250 changes in shape, for example, is bent, the positive electrode 211*a* and the negative electrode 211*b* change in shape such that the positions thereof are shifted from each other in the length direction as described later. At the time, if the distance La is too short, the exterior body 251 and the positive electrode 211*a* and the negative electrode 211*b* are rubbed hard against each other, so that the exterior body 251 is damaged in some cases. In particular, when a metal film of the exterior body 251 is exposed, the metal film might be corroded by the electrolyte solution. Therefore, the distance La is preferably set as long as possible. However, if the distance La is too long, the volume of the secondary battery 250 is increased.

The distance La between the positive and negative electrodes 211*a* and 211*b* and the seal portion 262 is preferably increased as the total thickness of the stacked positive electrodes 211*a* and negative electrodes 211*b* is increased.

Specifically, when the total thickness of the stacked positive electrodes 211*a*, negative electrodes 211*b*, and separators 214 (not shown) is referred to as a thickness t, the distance La is preferably 0.8 times or more and 3.0 times or less, further preferably 0.9 times or more and 2.5 times or less, still further preferably 1.0 times or more and 2.0 times or less as large as the thickness t. When the distance La is in the above range, a compact battery highly reliable for bending can be obtained.

Furthermore, when the distance between the pair of seal portions 262 is referred to as a distance Lb, it is preferred that the distance Lb be sufficiently longer than the widths of the positive electrode 211*a* and the negative electrode 211*b* (here, a width Wb of the negative electrode 211*b*). In that case, even when the positive electrode 211*a* and the negative electrode 211*b* come into contact with the exterior body 251 by change in the shape of the secondary battery 250, such as repeated bending, the position of part of the positive electrode 211*a* and the negative electrode 211*b* can be shifted in the width direction; thus, the positive and negative electrodes 211*a* and 211*b* and the exterior body 251 can be effectively prevented from being rubbed against each other.

For example, the difference between the distance Lb (i.e., the distance between the pair of seal portions 262) and the width Wb of the negative electrode 211*b* is preferably 1.6 times or more and 6.0 times or less, further preferably 1.8 times or more and 5.0 times or less, and still further preferably 2.0 times or more and 4.0 times or less as large as the thickness t of the positive electrode 211*a* and the negative electrode 211*b*.

In other words, the distance Lb, the width Wb, and the thickness t preferably satisfy the relationship of Formula 1 below.

[Formula 1]

$$\frac{Lb - Wb}{2t} \geq a \tag{1}$$

In the formula, a is 0.8 or more and 3.0 or less, preferably 0.9 or more and 2.5 or less, further preferably 1.0 or more and 2.0 or less.

FIG. 19D shows a cross section including the lead 212*a* and corresponds to a cross section of the secondary battery 250, the positive electrode 211*a*, and the negative electrode 211*b* in the length direction. As shown in FIG. 19D, a space 273 is preferably provided between the end portions of the positive electrode 211a and the negative electrode 211b in the length direction and the exterior body 251 in the folded portion 261.

Figure 19E:
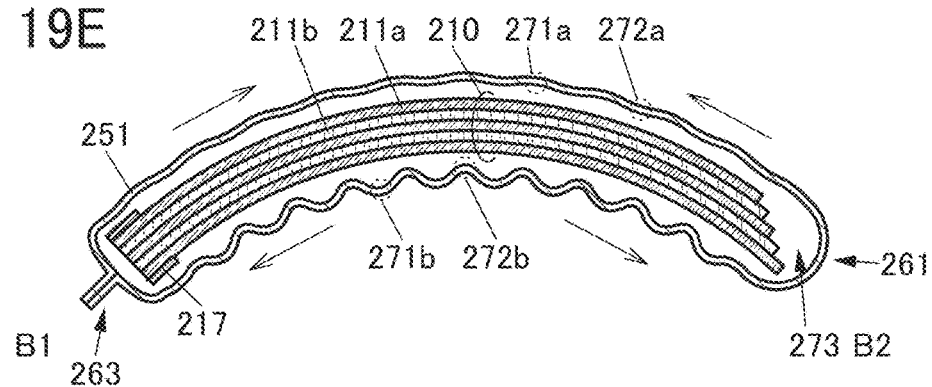

FIG. 19E is a schematic cross-sectional view of the secondary battery 250 which is bent. FIG. 19E corresponds to a cross section along the cut line B1-B2 in FIG. 19A.

When the secondary battery 250 is bent, part of the exterior body 251 positioned on the outer side in bending is stretched and the other part positioned on the inner side changes its shape as it is squashed. More specifically, the part of the exterior body 251 positioned on the outer side in bending changes its shape such that the wave amplitude becomes smaller and the length of the wave period becomes larger. By contrast, the part of the exterior body 251 positioned on the inner side changes its shape such that the wave amplitude becomes larger and the length of the wave period becomes smaller. When the exterior body 251 changes its shape in this manner, stress applied to the exterior body 251 with bending is relieved, so that a material itself of the exterior body 251 does not need to be stretched or squashed. Thus, the secondary battery 250 can be bent with a small force without damage to the exterior body 251.

Furthermore, as shown in FIG. 19E, when the secondary battery 250 is bent, the positions of the positive electrode 211a and the negative electrode 211b are shifted relatively. At this time, ends of the stacked positive electrodes 211a and negative electrodes 211b on the seal portion 263 side are fixed by a fixing member 217. Thus, the plurality of positive electrodes 211a and the plurality of negative electrodes 211b are more shifted at a position closer to the folded portion 261. Therefore, stress applied to the positive electrode 211a and the negative electrode 211b is relieved, and the positive electrode 211a and the negative electrode 211b themselves do not need to be stretched or squashed. Consequently, the secondary battery 250 can be bent without damage to the positive electrode 211a and the negative electrode 211b.

Furthermore, the space 273 is provided between the positive electrode 211a and the negative electrode 211b, whereby the relative positions of the positive electrode 211a and the negative electrode 211b can be shifted while the positive electrode 211a and the negative electrode 211b located on an inner side when the secondary battery 250 is bent do not come in contact with the exterior body 251.

In the secondary battery 250 shown in FIG. 19A to FIG. 19E, FIG. 20A, and FIG. 20B, the exterior body, the positive electrode 211a, and the negative electrode 211b are less likely to be damaged and the battery characteristics are less likely to deteriorate even when the secondary battery 250 is repeatedly bent and unbent.

Embodiment 3

In this embodiment, examples of electronic devices each including the secondary battery of one embodiment of the present invention are described.

First, FIGS. 21A to 21H show examples of electronic devices including the bendable secondary battery described in Embodiment 2. Examples of electronic devices each including a bendable secondary battery include television sets (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, and large game machines such as pachinko machines.

In addition, a flexible secondary battery can be incorporated along a curved inside/outside wall surface of a house or a building or a curved interior/exterior surface of an automobile.

Figure 21A:
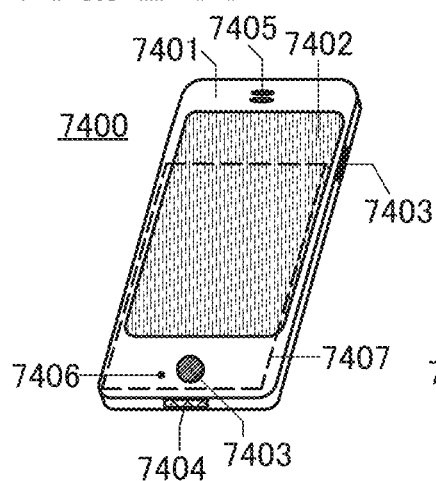
FIG. 21A to FIG. 21H are diagrams showing examples of electronic devices.

FIG. 21A shows an example of a mobile phone. A mobile phone 7400 includes an operation button 7403, an external connection port 7404, a speaker 7405, a microphone 7406, and the like in addition to a display portion 7402 incorporated in a housing 7401. Note that the mobile phone 7400 includes a secondary battery 7407. When the secondary battery of one embodiment of the present invention is used as the secondary battery 7407, a lightweight mobile phone with a long lifetime can be provided.

Figure 21B:
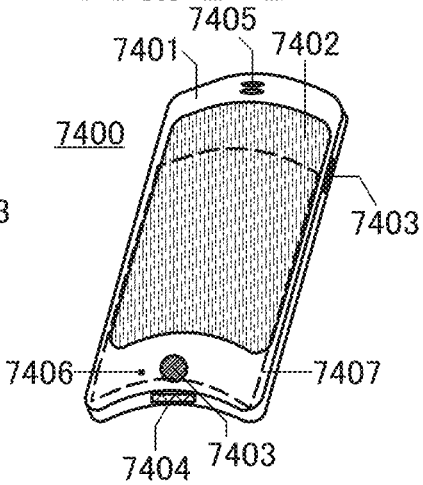
Figure 21C:
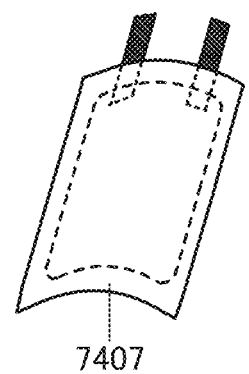

FIG. 21B shows the state where the mobile phone 7400 is curved. When the whole mobile phone 7400 is bent by the external force, the secondary battery 7407 included in the mobile phone 7400 is also bent. FIG. 21C shows the bent secondary battery 7407. The secondary battery 7407 is a thin storage battery. The secondary battery 7407 is fixed in a state of being bent. Note that the secondary battery 7407 includes a lead electrode electrically connected to a current collector. The current collector is, for example, copper foil, and partly alloyed with gallium; thus, adhesion between the current collector and an active material layer in contact with the current collector is improved and the secondary battery 7407 can have high reliability even in a state of being bent.

Figure 21D:
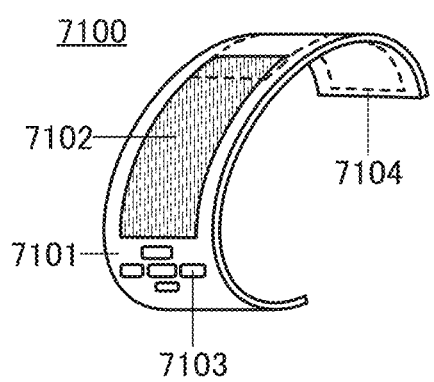
Figure 21E:

FIG. 21D shows an example of a bangle-type display device. A portable display device 7100 includes a housing 7101, a display portion 7102, operation buttons 7103, and a secondary battery 7104. FIG. 21E shows the bent secondary battery 7104. When the display device is worn on a user's arm while the secondary battery 7104 is bent, the housing changes in its shape and the curvature of part or the whole of the secondary battery 7104 is changed. Note that the radius of curvature of a curve at a point refers to the radius of the circular arc that best approximates the curve at that point. The reciprocal of the radius of curvature is curvature. Specifically, part or the whole of the housing or the main surface of the secondary battery 7104 is changed in the range of radius of curvature from 40 mm to 150 mm inclusive. When the radius of curvature at the main surface of the secondary battery 7104 is greater than or equal to 40 mm and less than or equal to 150 mm, the reliability can be kept high. When the secondary battery of one embodiment of the present invention is used as the secondary battery 7104, a lightweight portable display device with a long lifetime can be provided.

Figure 21F:
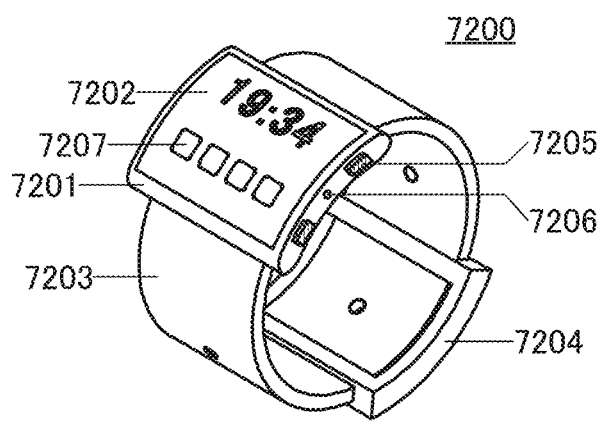

FIG. 21F shows an example of a watch-type portable information terminal. A portable information terminal 7200 includes a housing 7201, a display portion 7202, a band 7203, a buckle 7204, an operation button 7205, an input output terminal 7206, and the like.

The portable information terminal 7200 is capable of executing a variety of applications such as mobile phone calls, e-mailing, viewing and editing texts, music reproduction, Internet communication, and a computer game.

The display surface of the display portion 7202 is curved, and images can be displayed on the curved display surface. The display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as time setting, power on/off operations, on/off operations of wireless communication, setting and cancellation of a silent mode, and setting and cancellation of a power saving mode can be performed. For example, the functions of the operation button 7205 can be set freely by setting the operation system incorporated in the portable information terminal 7200.

The portable information terminal 7200 can employ near field communication based on an existing communication standard. For example, mutual communication between the portable information terminal and a headset capable of wireless communication can be performed, and thus hands-free calling is possible.

The portable information terminal 7200 includes the input output terminal 7206, and data can be directly transmitted to and received from another information terminal through a connector. In addition, charging through the input output terminal 7206 is possible. The charging operation may be performed through wireless power feeding without using the input output terminal 7206.

The display portion 7202 of the portable information terminal 7200 includes the secondary battery of one embodiment of the present invention. When the secondary battery of one embodiment of the present invention is used, a lightweight portable information terminal with a long lifetime can be provided. For example, the secondary battery 7104 shown in FIG. 21E that is in the state of being curved can be provided in the housing 7201. Alternatively, the secondary battery 7104 shown in FIG. 21E can be provided in the band 7203 such that it can be curved.

The portable information terminal 7200 preferably includes a sensor. As the sensor, for example, a human body sensor such as a fingerprint sensor, a pulse sensor, or a temperature sensor, a touch sensor, a pressure sensitive sensor, an acceleration sensor, or the like is preferably mounted.

Figure 21G:
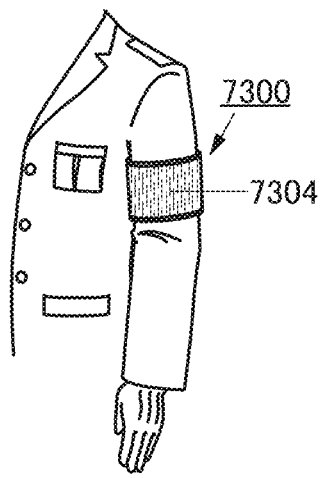

FIG. 21G shows an example of an armband display device. A display device 7300 includes a display portion 7304 and the secondary battery of one embodiment of the present invention. The display device 7300 can include a touch sensor in the display portion 7304 and can serve as a portable information terminal.

The display surface of the display portion 7304 is curved, and images can be displayed on the curved display surface. A display state of the display device 7300 can be changed by, for example, near field communication, which is a communication method based on an existing communication standard.

The display device 7300 includes an input/output terminal, and data can be directly transmitted to and received from another information terminal through a connector. In addition, charging through the input/output terminal is possible. Note that a charging operation may be performed by wireless power feeding without using the input/output terminal.

When the secondary battery of one embodiment of the present invention is used as the secondary battery included in the display device 7300, a lightweight display device with a long lifetime can be provided.

Figure 21H:
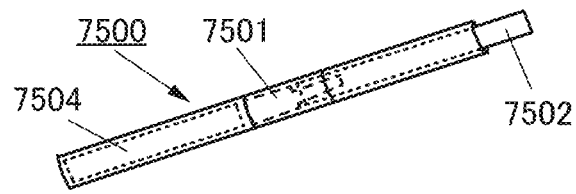

Examples of mounting the secondary battery on electronic devices are described using FIG. 21H, FIG. 22 and FIG. 23.

When the secondary battery of one embodiment of the present invention is used as a secondary battery of a daily electronic device, a lightweight product with a long lifetime can be provided. Examples of the daily electronic device include an electric toothbrush, an electric shaver, and electric beauty equipment. As secondary batteries of these products, small and lightweight stick type secondary batteries with high capacity are desired in consideration of easy handling for users.

FIG. 21H is a perspective view of a device called a vaporizer (electronic cigarette). In FIG. 21H, an electronic cigarette 7500 includes an atomizer 7501 including a heating element, a secondary battery 7504 that supplies power to the atomizer, and a cartridge 7502 including a liquid supply bottle, a sensor, and the like. To improve safety, a protection circuit that prevents overcharge and overdischarge of the secondary battery 7504 may be electrically connected to the secondary battery 7504. The secondary battery 7504 in FIG. 21H includes an external terminal to be connected to a charger. When the electronic cigarette 7500 is held by a user, the secondary battery 7504 becomes a tip portion; thus, it is preferred that the secondary battery 7504 have a short total length and be lightweight. With the secondary battery of one embodiment of the present invention, which has high capacity and excellent cycle performance, the small and lightweight electronic cigarette 7500 that can be used for a long time over a long period can be provided.

Figure 22A:
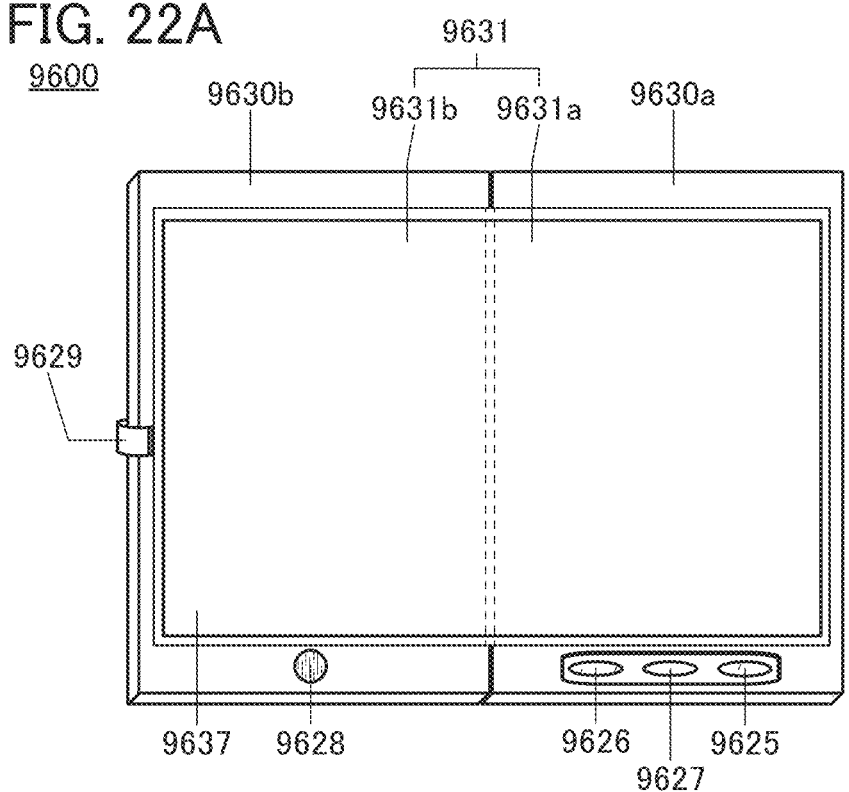
FIG. 22A and FIG. 22B are diagrams showing an example of an electronic device.
Figure 22B:
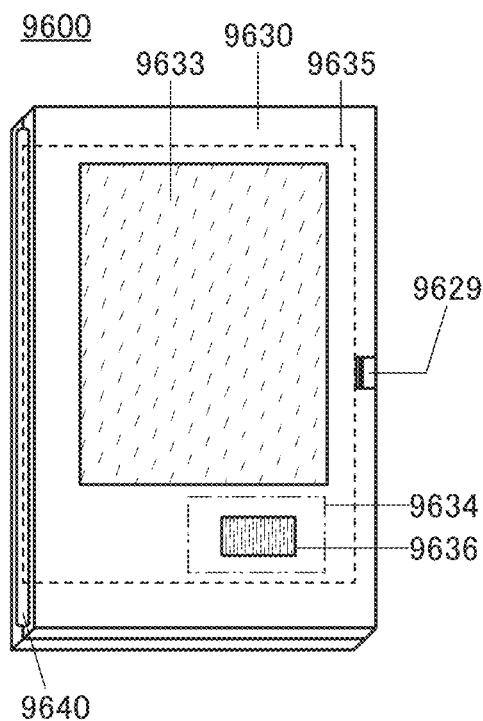

Next, FIGS. 22A and 22B show an example of a tablet terminal that can be folded in half. A tablet terminal 9600 shown in FIGS. 22A and 22B includes a housing 9630*a*, a housing 9630*b*, a movable portion 9640 connecting the housings 9630*a* and 9630*b* to each other, a display portion 9631 including a display portion 9631*a* and a display portion 9631*b*, a switch 9625 to a switch 9627, a fastener 9629, and an operation switch 9628. A flexible panel is used for the display portion 9631, whereby a tablet terminal with a larger display portion can be provided. FIG. 22A shows the tablet terminal 9600 that opens, and FIG. 22B shows the tablet terminal 9600 that is closed.

The tablet terminal 9600 includes a power storage unit 9635 inside the housing 9630*a* and the housing 9630*b*. The power storage unit 9635 is provided across the housing 9630*a* and the housing 9630*b*, passing through the movable portion 9640.

Part of or the entire display portion 9631 can be a touch panel region, and data can be input by touching text, an input form, an image including an icon, and the like displayed on the region. For example, it is possible that keyboard buttons are displayed on the entire display portion 9631*a* on the housing 9630*a* side, and data such as text or an image is displayed on the display portion 9631*b* on the housing 9630*b* side.

In addition, it is possible that a keyboard is displayed on the display portion 9631*b* on the housing 9630*b* side, and data such as text or an image is displayed on the display portion 9631*a* on the housing 9630*a* side. Furthermore, it is possible that a switching button for showing/hiding a keyboard on a touch panel is displayed on the display portion 9631 and the button is touched with a finger, a stylus, or the like to display keyboard buttons on the display portion 9631.

In addition, touch input can be performed concurrently in a touch panel region in the display portion 9631*a* on the housing 9630*a* side and a touch panel region in the display portion 9631*b* on the housing 9630*b* side.

The switches 9625 to 9627 may function not only as an interface for operating the tablet terminal 9600 but also as an interface that can switch various functions. For example, at least one of the switches 9625 to 9627 may have a function of switching on/off of the tablet terminal 9600. For another example, at least one of the switches 9625 to 9627 may have a function of switching display between a portrait mode and a landscape mode and a function of switching display between monochrome display and color display. For another example, at least one of the switches 9625 to 9627 may have a function of adjusting the luminance of the display portion 9631. The display luminance of the display portion 9631 can be controlled in accordance with the amount of external light in use of the tablet terminal 9600 detected by an optical sensor incorporated in the tablet terminal 9600. Note that another sensing device including a sensor for measuring inclination, such as a gyroscope sensor or an acceleration sensor, may be incorporated in the tablet terminal, in addition to the optical sensor.

The display portion 9631*a* on the housing 9630*a* side and the display portion 9631*b* on the housing 9630*b* side have substantially the same display area in FIG. 22A; however, there is no particular limitation on the display areas of the display portions 9631*a* and 9631*b*, and the display portions may have different areas or different display quality. For example, one of the display portions 9631*a* and 9631*b* may display higher definition images than the other.

The tablet terminal 9600 is folded in half in FIG. 22B. The tablet terminal 9600 includes a housing 9630, a solar cell 9633, and a charge and discharge control circuit 9634 including a DCDC converter 9636. The power storage unit of one embodiment of the present invention is used as the power storage unit 9635.

The tablet terminal 9600 can be folded in half, as described above, such that the housings 9630*a* and 9630*b* overlap with each other when not in use. Thus, the display portion 9631 can be protected, which increases the durability of the tablet terminal 9600. With the power storage unit 9635 including the secondary battery of one embodiment of the present invention, which has high capacity and excellent cycle performance, the tablet terminal 9600 that can be used for a long time over a long period can be provided.

The tablet terminal 9600 shown in FIG. 22A and FIG. 22B can also have a function of displaying various kinds of data (e.g., a still image, a moving image, and a text image), a function of displaying a calendar, a date, or the time on the display portion, a touch-input function of operating or editing data displayed on the display portion by touch input, a function of controlling processing by various kinds of software (programs), and the like.

The solar cell 9633, which is attached on the surface of the tablet terminal 9600, supplies electric power to a touch panel, a display portion, a video signal processing portion, and the like. Note that the solar cell 9633 can be provided on one or both surfaces of the housing 9630 and the power storage unit 9635 can be charged efficiently. The use of a lithium-ion battery as the power storage unit 9635 brings an advantage such as a reduction in size.

Figure 22C:
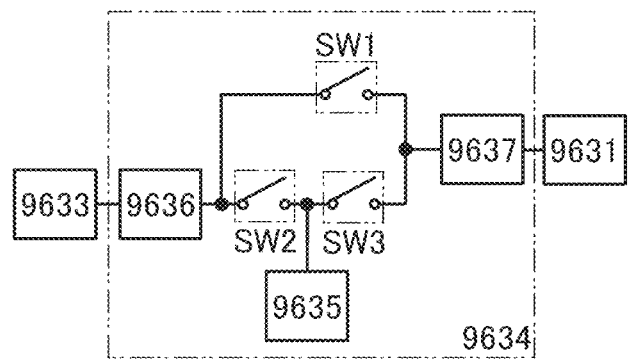
FIG. 22C is a block diagram showing a charge and discharge control circuit of an electronic device.

The structure and operation of the charge and discharge control circuit 9634 shown in FIG. 22B are described with reference to a block diagram in FIG. 22C. The solar cell 9633, the power storage unit 9635, the DCDC converter 9636, a converter 9637, switches SW1 to SW3, and the display portion 9631 are shown in FIG. 22C, and the power storage unit 9635, the DCDC converter 9636, the converter 9637, and the switches SW1 to SW3 correspond to the charge and discharge control circuit 9634 in FIG. 22B.

First, an operation example in which electric power is generated by the solar cell 9633 using external light is described. The voltage of electric power generated by the solar cell is raised or lowered by the DCDC converter 9636 to a voltage for charging the power storage unit 9635. Then, when the power from the solar cell 9633 is used for the operation of the display portion 9631, the switch SW1 is turned on and the voltage is raised or lowered by the converter 9637 so as to be a voltage needed for the display portion 9631. When display on the display portion 9631 is not performed, the switch SW1 is turned off and the switch SW2 is turned on, so that the power storage unit 9635 can be charged.

Note that the solar cell 9633 is described as an example of a power generation unit; however, one embodiment of the present invention is not limited to this example. The power storage unit 9635 may be charged using another power generation unit such as a piezoelectric element or a thermoelectric conversion element (Peltier element). For example, the power storage unit 9635 may be charged with a non-contact power transmission module that transmits and receives power wirelessly (without contact), or with a combination of other charge units.

FIG. 23 shows other examples of electronic devices. In FIG. 23, a display device 8000 is an example of an electronic device including a secondary battery 8004 of one embodiment of the present invention. Specifically, the display device 8000 corresponds to a display device for TV broadcast reception and includes a housing 8001, a display portion 8002, speaker portions 8003, the secondary battery 8004, and the like. The secondary battery 8004 of one embodiment of the present invention is provided in the housing 8001. The display device 8000 can receive electric power from a commercial power supply. Alternatively, the display device 8000 can use electric power stored in the secondary battery 8004. Thus, the display device 8000 can be operated with the use of the secondary battery 8004 of one embodiment of the present invention as an uninterruptible power supply even when electric power cannot be supplied from a commercial power supply due to power failure or the like.

A semiconductor display device such as a liquid crystal display device, a light-emitting device in which a light-emitting element such as an organic EL element is provided in each pixel, an electrophoretic display device, a DMD (Digital Micromirror Device), a PDP (Plasma Display Panel), or an FED (Field Emission Display) can be used for the display portion 8002.

Note that the display device includes, in its category, all of information display devices for personal computers, advertisement displays, and the like besides information display devices for TV broadcast reception.

In FIG. 23, an installation lighting device 8100 is an example of an electronic device including a secondary battery 8103 of one embodiment of the present invention. Specifically, the lighting device 8100 includes a housing 8101, a light source 8102, the secondary battery 8103, and the like. Although FIG. 23 shows the case where the secondary battery 8103 is provided in a ceiling 8104 on which the housing 8101 and the light source 8102 are installed, the secondary battery 8103 may be provided in the housing 8101. The lighting device 8100 can receive electric power from a commercial power supply. Alternatively, the lighting device 8100 can use electric power stored in the secondary battery 8103. Thus, the lighting device 8100 can be operated with the use of the secondary battery 8103 of one embodiment of the present invention as an uninterruptible power supply even when electric power cannot be supplied from a commercial power supply due to power failure or the like.

Note that although the installation lighting device 8100 provided in the ceiling 8104 is shown in FIG. 23 as an example, the secondary battery of one embodiment of the present invention can be used in an installation lighting device provided in, for example, a wall 8105, a floor 8106, or a window 8107 other than the ceiling 8104. Alternatively, the secondary battery of one embodiment of the present invention can be used in a tabletop lighting device or the like.

As the light source 8102, an artificial light source which emits light artificially by using power can be used. Specifically, an incandescent lamp, a discharge lamp such as a fluorescent lamp, and a light-emitting element such as an LED or an organic EL element are given as examples of the artificial light source.

In FIG. 23, an air conditioner including an indoor unit 8200 and an outdoor unit 8204 is an example of an electronic device including a secondary battery 8203 of one embodiment of the present invention. Specifically, the indoor unit 8200 includes a housing 8201, an air outlet 8202, the secondary battery 8203, and the like. Although FIG. 23 shows the case where the secondary battery 8203 is provided in the indoor unit 8200, the secondary battery 8203 may be provided in the outdoor unit 8204. Alternatively, the secondary batteries 8203 may be provided in both the indoor unit 8200 and the outdoor unit 8204. The air conditioner can receive electric power from a commercial power supply. Alternatively, the air conditioner can use electric power stored in the secondary battery 8203. Particularly in the case where the secondary batteries 8203 are provided in both the indoor unit 8200 and the outdoor unit 8204, the air conditioner can be operated with the use of the secondary battery 8203 of one embodiment of the present invention as an uninterruptible power supply even when electric power cannot be supplied from a commercial power supply due to power failure or the like.

Note that although the split-type air conditioner including the indoor unit and the outdoor unit is shown in FIG. 23 as an example, the secondary battery of one embodiment of the present invention can be used in an air conditioner in which the functions of an indoor unit and an outdoor unit are integrated in one housing.

In FIG. 23, an electric refrigerator-freezer 8300 is an example of an electronic device including a secondary battery 8304 of one embodiment of the present invention. Specifically, the electric refrigerator-freezer 8300 includes a housing 8301, a door for refrigerator compartment 8302, a door for freezer compartment 8303, the secondary battery 8304, and the like. The secondary battery 8304 is provided in the housing 8301 in FIG. 23. The electric refrigerator-freezer 8300 can receive electric power from a commercial power supply. Alternatively, the electric refrigerator-freezer 8300 can use electric power stored in the secondary battery 8304. Thus, the electric refrigerator-freezer 8300 can be operated with the use of the secondary battery 8304 of one embodiment of the present invention as an uninterruptible power supply even when electric power cannot be supplied from a commercial power supply due to power failure or the like.

Other than the electronic devices described above, a high-frequency heating apparatus such as a microwave oven and an electronic device such as an electric rice cooker require high power in a short time. The tripping of a breaker of a commercial power supply in use of the electronic device can be prevented by using the secondary battery of one embodiment of the present invention as an auxiliary power supply for supplying electric power which cannot be supplied enough by a commercial power supply.

In addition, in a time period when electronic devices are not used, particularly in a time period when the proportion of the amount of electric power which is actually used to the total amount of electric power which can be supplied from a commercial power source (such a proportion referred to as a usage rate of electric power) is low, electric power can be stored in the secondary battery, whereby an increase in the usage rate of electric power can be inhibited in a time period other than the above time period. For example, in the case of the electric refrigerator-freezer 8300, electric power can be stored in the secondary battery 8304 in night time when the temperature is low and the door for refrigerator compartment 8302 and the door for freezer compartment 8303 are not opened and closed. In daytime when the temperature is high and the door for refrigerator compartment 8302 and the door for freezer compartment 8303 are opened and closed, the secondary battery 8304 is used as an auxiliary power source; thus, the usage rate of electric power in daytime can be reduced.

According to one embodiment of the present invention, the secondary battery can have excellent cycle performance and improved reliability. Furthermore, according to one embodiment of the present invention, a secondary battery with high capacity can be obtained; thus, the secondary battery itself can be made more compact and lightweight as a result of improved characteristics of the secondary battery. Thus, the secondary battery of one embodiment of the present invention is used in the electronic device described in this embodiment, whereby a more lightweight electronic device with a longer lifetime can be obtained. This embodiment can be implemented in an appropriate combination with the other embodiments.

Embodiment 4

In this embodiment, examples of vehicles each including the secondary battery of one embodiment of the present invention are described.

The use of secondary batteries in vehicles enables production of next-generation clean energy vehicles such as hybrid electric vehicles (HEVs), electric vehicles (EVs), and plug-in hybrid electric vehicles (PHEVs).

Figure 24A:
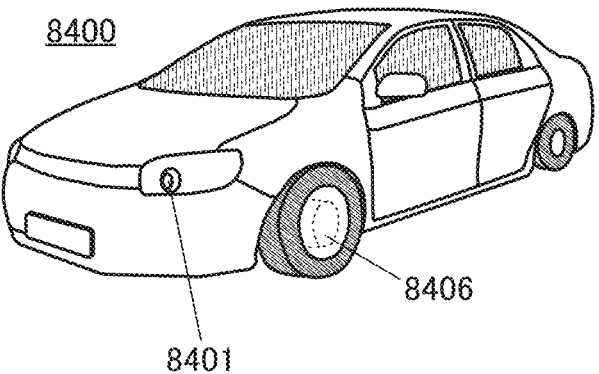
FIG. 24A to FIG. 24C are diagrams showing examples of vehicles.

FIG. 24 shows examples of a vehicle using the secondary battery of one embodiment of the present invention. An automobile 8400 shown in FIG. 24A is an electric vehicle that runs on an electric motor as a power source. Alternatively, the automobile 8400 is a hybrid electric vehicle capable of driving appropriately using either an electric motor or an engine. The use of one embodiment of the present invention can achieve a high-mileage vehicle. The automobile 8400 includes the secondary battery. As the secondary battery, the modules of the secondary batteries shown in FIG. 9C and FIG. 9D may be arranged to be used in a floor portion in the automobile. Alternatively, a battery pack in which a plurality of secondary batteries shown in FIG. 12 are combined may be placed in the floor portion in the automobile. The secondary battery is used not only for driving an electric motor 8406, but also for supplying electric power to a light-emitting device such as a headlight 8401 or a room light (not shown).

The secondary battery can also supply electric power to a display device included in the automobile 8400, such as a speedometer or a tachometer. Furthermore, the secondary battery can supply electric power to a semiconductor device included in the automobile 8400, such as a navigation system.

Figure 24B:
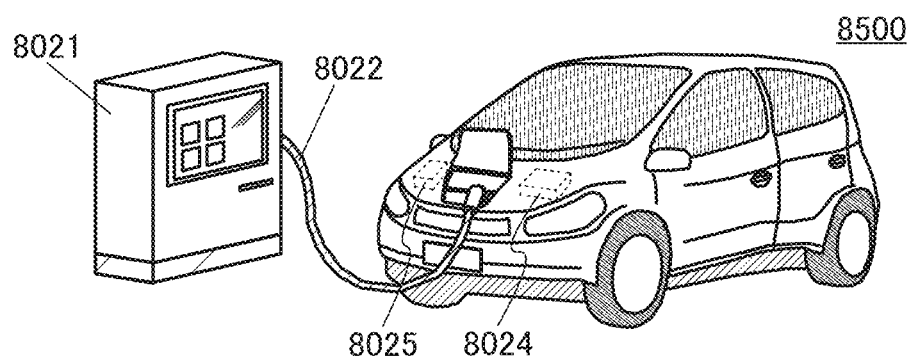

An automobile 8500 shown in FIG. 24B can be charged when a secondary battery included in the automobile 8500 is supplied with power through external charging equipment by a plug-in system, a contactless power feeding system, or the like. FIG. 24B shows a state where the secondary battery 8024 incorporated in the automobile 8500 is charged from a ground installation type charging device 8021 through a cable 8022. On charge, a given method such as CHAdeMO (registered trademark) or Combined Charging System may be employed as a charging method, the standard of a connector, or the like as appropriate. The charging device 8021 may be a charging station provided in a commerce facility or a power source in a house. For example, with a plug-in technique, the secondary battery 8024 incorporated in the automobile 8500 can be charged by power supply from the outside. The charge can be performed by converting AC electric power into DC electric power through a converter, such as an ACDC converter.

Although not shown, the vehicle may include a power-receiving device so that it can be charged by being supplied with electric power from an aboveground power-transmitting device in a contactless manner. In the case of the contactless power feeding system, by fitting a power transmitting device in a road or an exterior wall, charge can be performed not only when the vehicle is stopped but also when driven. In addition, this contactless power feeding system may be utilized to transmit and receive power between vehicles. Furthermore, a solar cell may be provided in the exterior of the vehicle to charge the secondary battery while the vehicle is stopped or while the vehicle is running. To supply electric power in such a contactless manner, an electromagnetic induction method or a magnetic resonance method can be used.

Figure 24C:
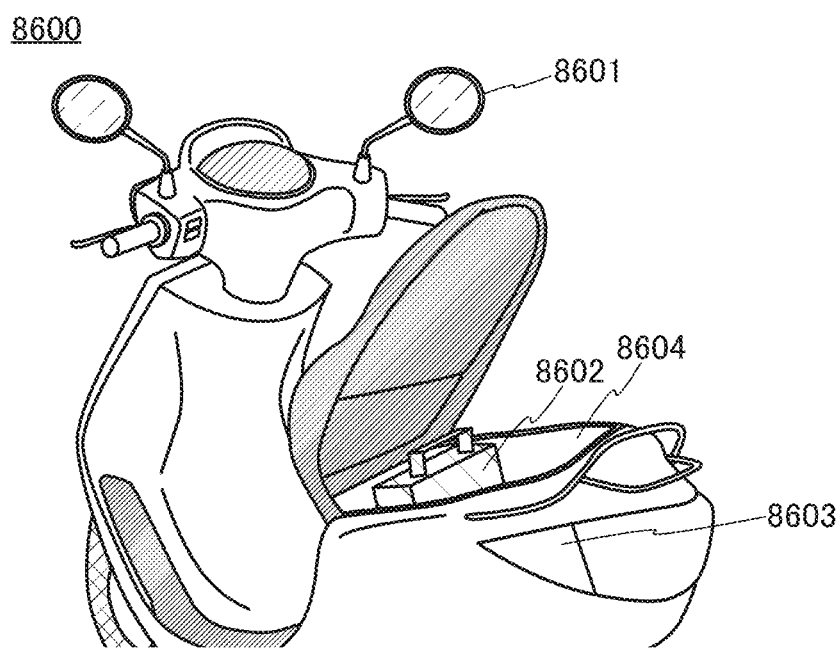

In addition, FIG. 24C is an example of a motorcycle using the secondary battery of one embodiment of the present invention. A scooter 8600 shown in FIG. 24C includes a secondary battery 8602, side mirrors 8601, and direction indicators 8603. The secondary battery 8602 can supply electricity to the direction indicators 8603.

In the scooter 8600 shown in FIG. 24C, the secondary battery 8602 can be stored in an under-seat storage 8604. The secondary battery 8602 can be stored in the under-seat storage 8604 even when the under-seat storage 8604 is small. The secondary battery 8602 is detachable; thus, the secondary battery 8602 is carried indoors when charged, and is stored before the motor scooter is driven.

According to one embodiment of the present invention, the secondary battery can have improved cycle performance and the capacity of the secondary battery can be increased. Thus, the secondary battery itself can be made more compact and lightweight. The compact and lightweight secondary battery contributes to a reduction in the weight of a vehicle, and thus increases the mileage. Furthermore, the secondary battery included in the vehicle can be used as a power source for supplying electric power to products other than the vehicle. In such a case, the use of a commercial power supply can be avoided at peak time of electric power demand, for example. Avoiding the use of a commercial power supply at peak time of electric power demand can contribute to energy saving and a reduction in carbon dioxide emissions. Moreover, the secondary battery with excellent cycle performance can be used over a long period; thus, the use amount of rare metals such as cobalt can be reduced.

This embodiment can be implemented in an appropriate combination with the other embodiments.

Embodiment 5

In this embodiment, structures of a transistor that can be used in the semiconductor device described in the above embodiments are described. Specifically, a structure in which transistors having different electrical characteristics are stacked is described. With the structure, the degree of freedom in design of the semiconductor device can be increased. Stacking transistors having different electrical characteristics can increase the integration degree of the semiconductor device.

Figure 25:
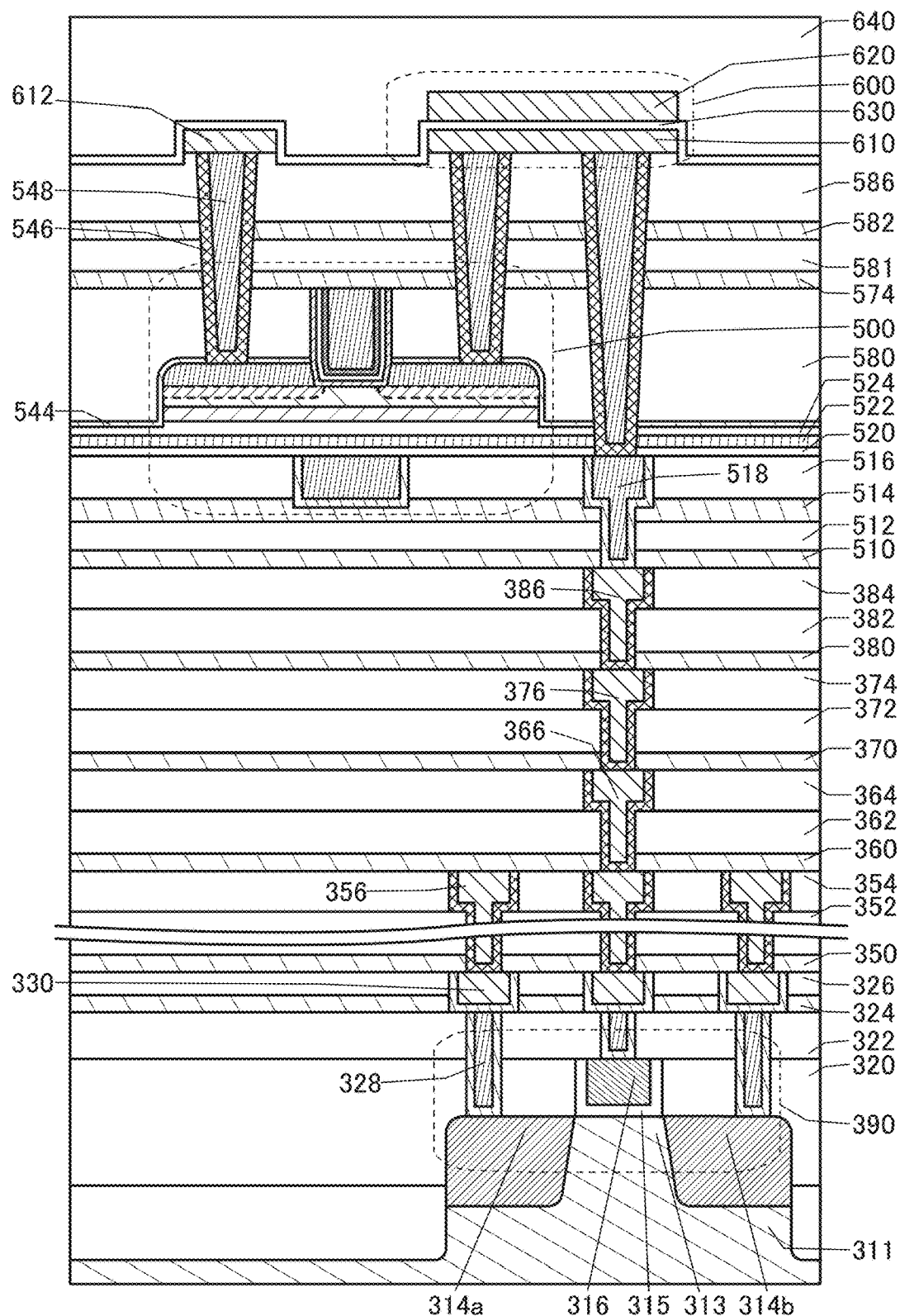
FIG. 25 is a diagram showing a structure example of a semiconductor device.
Figure 27A:
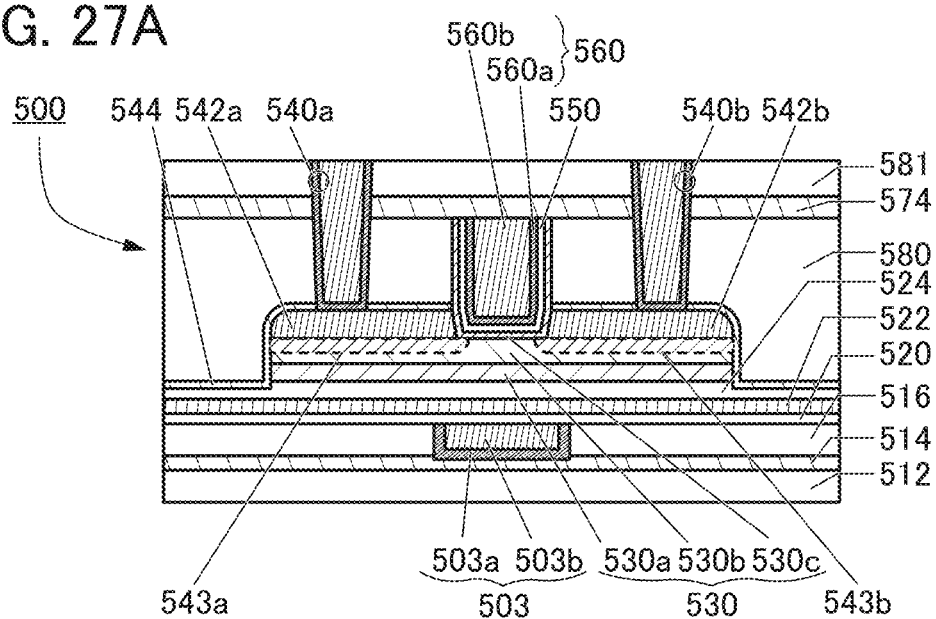
FIG. 27A to FIG. 27C are diagrams showing a structure example of a transistor.
Figure 27B:
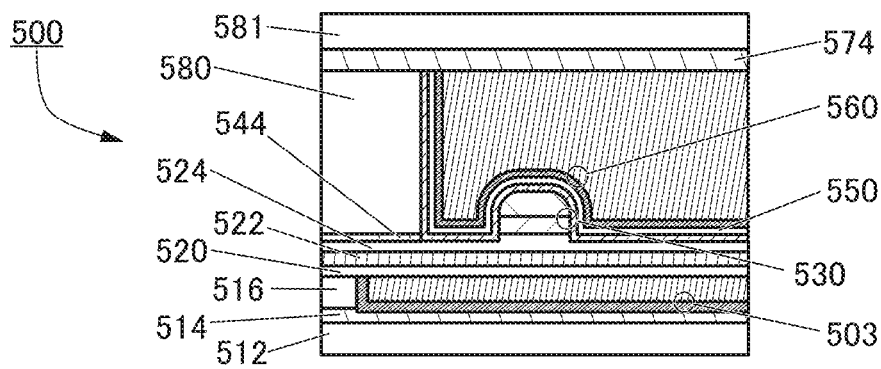
Figure 27C:
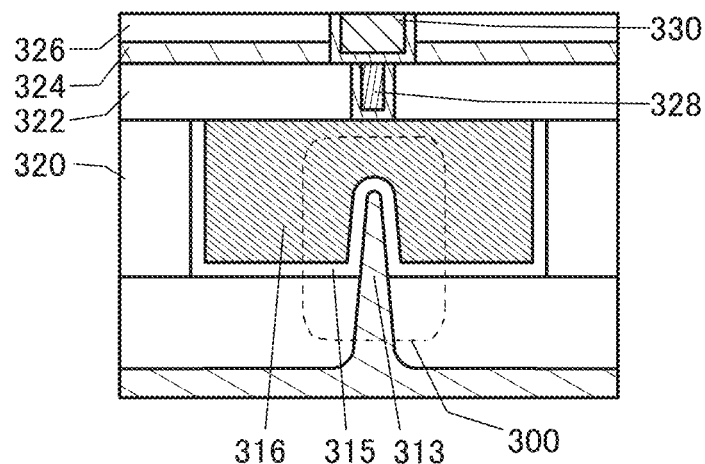

A semiconductor device shown in FIG. 25 includes a transistor 390, a transistor 500, and a capacitor 600. FIG. 27A is a cross-sectional view of the transistor 500 in the channel length direction, FIG. 27B is a cross-sectional view of the transistor 500 in the channel width direction, and FIG. 27C is a cross-sectional view of the transistor 390 in the channel width direction.

The transistor 500 is an OS transistor. The off-state current of the OS transistor 500 is low. When the OS transistor described in the above embodiment has a structure similar to that of the transistor 500, for example, a voltage can be stored for a long time.

The semiconductor device described in this embodiment includes the transistor 390, the transistor 500, and the capacitor 600 as shown in FIG. 25. The transistor 500 is provided above the transistor 390, and the capacitor 600 is provided above the transistor 390 and the transistor 500. For example, the structure of the transistor described in the above embodiment can have a structure similar to that of the transistor 390, and the structure of the capacitor can have a structure similar to that of the capacitor 600.

The transistor 390 is provided over a substrate 311 and includes a conductor 316, an insulator 315, a semiconductor region 313 that is part of the substrate 311, and a low-resistance region 314*a* and a low-resistance region 314*b* each functioning as a source region or a drain region.

As shown in FIG. 27C, in the transistor 390, the top surface and side surfaces in the channel width direction of the semiconductor region 313 are covered with the conductor 316 with the insulator 315 therebetween. In this manner, making the Fin-type transistor 390 increases the effective channel width. Thus, the on-state characteristics of the transistor 390 can be improved. In addition, since contribution of an electric field of a gate electrode can be increased, the off-state characteristics of the transistor 390 can be improved.

Note that the transistor 390 can be either a p-channel transistor or an n-channel transistor.

A region of the semiconductor region 313 where a channel is formed, a region in the vicinity thereof, the low-resistance region 314*a* and the low-resistance region 314*b* functioning as the source region or the drain region, and the like preferably contain a semiconductor such as a silicon-based semiconductor, and preferably contain single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 390 may be an HEMT (High Electron Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 26:
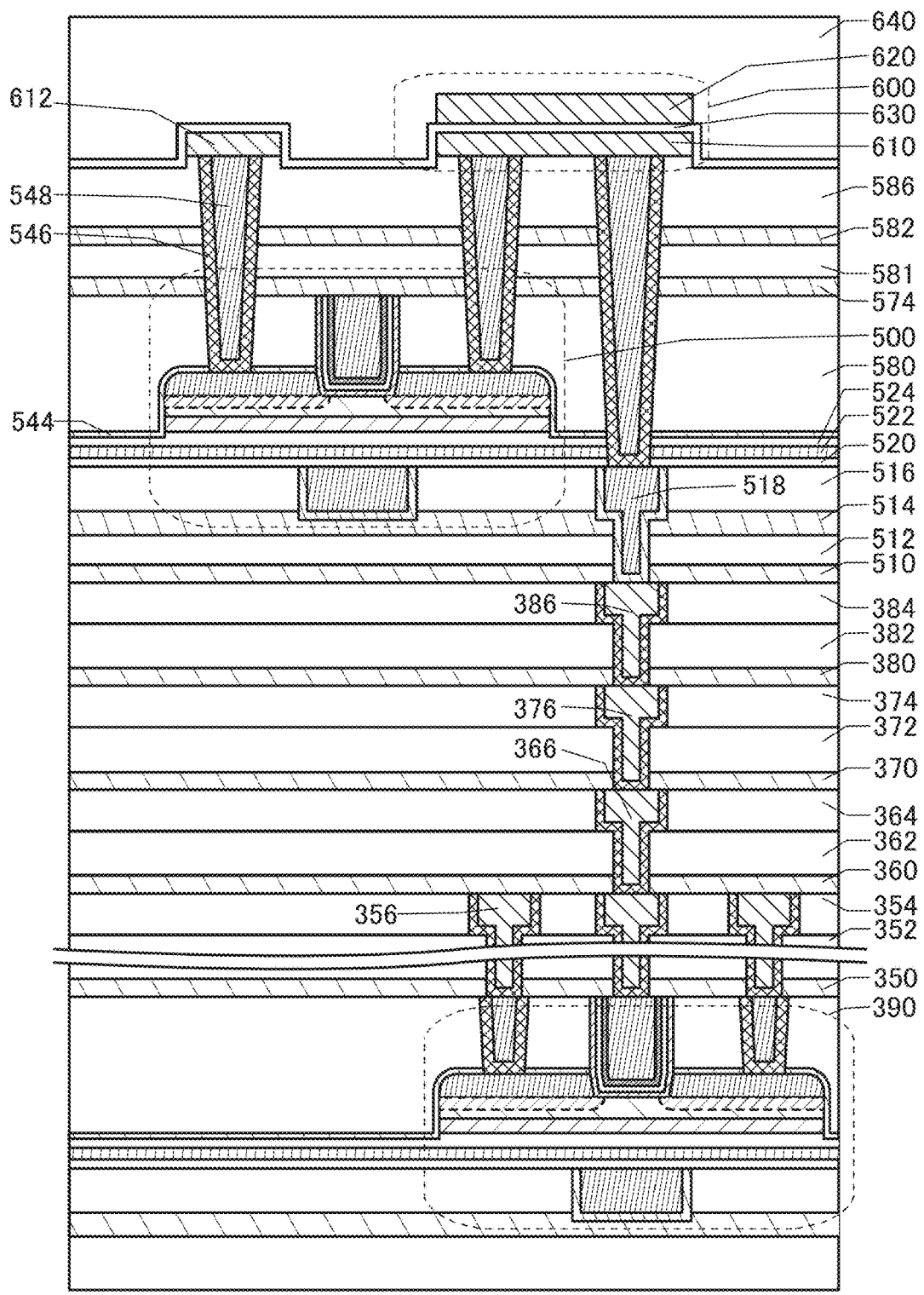
FIG. 26 is a diagram showing a structure example of a semiconductor device.

Note that the transistor 390 shown in FIG. 25 is an example and the structure is not limited thereto; an appropriate transistor is used in accordance with a circuit configuration or a driving method. For example, when a semiconductor device is configured as a single-polarity circuit using only OS transistors, the transistor 390 employs a structure similar to that of the transistor 500, which is an OS transistor, as shown in FIG. 26. Note that the details of the transistor 500 are described later. The transistor 390 in FIG. 26 can be an n-channel transistor as shown in FIG. 26.

In this specification and the like, a single-polarity circuit is a circuit in which all the transistors included have the same polarity, for example. For example, a circuit in which all the transistors included are n-channel transistors can be referred to as a single-polarity circuit.

An insulator 320, an insulator 322, an insulator 324, and an insulator 326 are stacked in this order to cover the transistor 390.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

Note that in this specification and the like, silicon oxynitride refers to a material that contains oxygen at a higher proportion than nitrogen, and silicon nitride oxide refers to a material that contains nitrogen at a higher proportion than oxygen. Furthermore, in this specification and the like, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 390 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 390, or the like into the region where the transistor 500 is provided.

As the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 390. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used as an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 25, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 390. Note that the conductor 356 can be provided using a material similar to those for the conductor 328 or the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 390 and the transistor 500 can be separated by the barrier layer, so that diffusion of hydrogen from the transistor 390 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 390 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 25, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 or the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 390 and the transistor 500 can be separated by the barrier layer, so that diffusion of hydrogen from the transistor 390 into the transistor 500 can be inhibited.

A wiring layer may be provided over the insulator 364 and the conductor 366. For example, in FIG. 25, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 or the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 390 and the transistor 500 can be separated by the barrier layer, so that diffusion of hydrogen from the transistor 390 into the transistor 500 can be inhibited.

A wiring layer may be provided over the insulator 374 and the conductor 376. For example, in FIG. 25, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 or the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 390 and the transistor 500 can be separated by the barrier layer, so that diffusion of hydrogen from the transistor 390 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used as any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 390 is provided, or the like into the region where the transistor 500 is provided. Thus, a material similar to that to the insulator 324 is preferably used.

As the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 390. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has an excellent blocking effect that prevents the passage of both oxygen and impurities such as hydrogen and moisture which are factors in a change in electrical characteristics of the transistor. Thus, aluminum oxide can prevent the entry of impurities such as hydrogen and moisture into the transistor 500 in the fabrication process and after the fabrication of the transistor. In addition, release of oxygen from the metal oxide included in the transistor 500 can be inhibited. Therefore, aluminum oxide is suitably used for a protective film of the transistor 500.

The insulator 512 and the insulator 516 can be formed using a material similar to that to the insulator 320, for example. Furthermore, when a material with a comparatively low permittivity is used as these insulators, parasitic capacitance generated between wirings can be reduced. Silicon oxide films, silicon oxynitride films, or the like can be used as the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 390. The conductor 518 can be provided using a material similar to those for the conductor 328 or the conductor 330.

In particular, the conductor 518 in a region in contact with the insulator 510 and the insulator 514 is preferably a conductor having a barrier property against oxygen, hydrogen, and water. With this structure, the transistor 390 and the transistor 500 can be separated by the layer having a barrier property against oxygen, hydrogen, and water; thus, the diffusion of hydrogen from the transistor 390 into the transistor 500 can be inhibited.

The transistor 500 is provided above the insulator 514.

As shown in FIG. 27A and FIG. 27B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an oxide 530c positioned on a bottom and a side surface of the opening; an insulator 550 positioned on a formation surface of the oxide 530c; and a conductor 560 positioned on a formation surface of the insulator 550.

As shown in FIG. 27A and FIG. 27B, an insulator 544 is preferably positioned between the insulator 580 and the oxide 530a, the oxide 530b, the conductor 542a, and the conductor 542b. In addition, as shown in FIG. 27A and FIG. 27B, the conductor 560 preferably includes a conductor 560a provided inside the insulator 550 and a conductor 560b embedded inside the conductor 560a. Moreover, as shown in FIG. 27A and FIG. 27B, an insulator 574 is preferably positioned over the oxide 530c, the insulator 580, the conductor 560, and the insulator 550.

Hereinafter, the oxide 530a, the oxide 530b, and the oxide 530c may be collectively referred to as an oxide 530.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 shown in FIG. 25, FIG. 26, FIG. 27A, and FIG. 27B is an example, and the structure is not limited thereto; an appropriate transistor can be used in accordance with a circuit configuration or a driving method.

Here, the conductor 560 functions as a gate electrode of the transistor 500, and the conductor 542a and the conductor 542b function as its source electrode and its drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a voltage applied to the conductor 503 independently of a voltage applied to the conductor 560. In particular, the threshold voltage of the transistor 500 can be higher than 0 V and the off-state current can be reduced by applying a negative voltage to the conductor 503. Thus, a drain current at the time when a potential applied to the conductor 560 is 0 V can be lower in the case where a negative voltage is applied to the conductor 503 than in the case where a negative voltage is not applied to the conductor 503.

The conductor 503 is positioned to have a region overlapping with the oxide 530 and the conductor 560. Thus, when voltages are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (s-channel) structure.

The conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, as the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification and the like, a function of inhibiting diffusion of impurities or oxygen means a function of inhibiting diffusion of any one or all of the above impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used as the conductor 503b. In that case, the conductor 503a is not necessarily provided. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of VoH→Vo+H occurs. Part of hydrogen generated at this time is bonded to oxygen to be H$_2$O, and removed from the oxide 530 or an insulator near the oxide 530 in some cases. Part of hydrogen is diffused into or gettered (also referred to as gettering) by the conductor 542 (the conductor 542a and the conductor 542b) in some cases.

For the microwave treatment, for example, an apparatus including a power supply that generates high-density plasma or an apparatus including a power supply that applies RF to the substrate side is suitably used. High-density oxygen radicals can be generated with use of a gas containing oxygen and high-density plasma, for example. By applying RF to the substrate side, the oxygen radicals generated by high-density plasma can be introduced into the oxide 530 or the insulator near the oxide 530 efficiently. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate (O$_2$/(O$_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at within the range of 100° C. to 450° C., preferably within the range of 350° C. to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under a reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of Vo+O→null. Furthermore, hydrogen remaining in the oxide 530 reacts with oxygen supplied to the oxide 530, so that the hydrogen can be removed as H$_2$O (dehydration). This can inhibit recombination of hydrogen remaining in the oxide 530 with oxygen vacancies and formation of VoH.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

As the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. With miniaturization and high integration of transistors, a problem such as leakage current may arise because of a thinner gate insulating film. When a high-k material is used as the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high dielectric constant can be obtained.

Note that in the transistor 500 in FIG. 27A and FIG. 27B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used as the oxide 530 is preferably a CAAC-OS (C-Axis Aligned Crystalline Oxide Semiconductor) or a CAC-OS (Cloud-Aligned Composite Oxide Semiconductor). Furthermore, as the oxide 530, an In—Ga oxide or an In—Zn oxide may be used. The CAAC-OS and the CAC-OS are described later.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates electrons serving as carriers. Thus, a transistor using a metal oxide containing much hydrogen is likely to have normally-on characteristics. Moreover, hydrogen in a metal oxide is easily transferred by a stress such as heat or an electric field; thus, a large amount of hydrogen in a metal oxide might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is effective to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) in order to obtain a metal oxide whose VoH is sufficiently reduced. When a metal oxide with a sufficiently low concentration of impurities such as VoH is used for a channel formation region of a transistor, the transistor can have stable electrical characteristics.

A defect in which hydrogen has entered an oxygen vacancy can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used to a channel formation region of a transistor, the transistor can have stable electrical characteristics.

When a metal oxide is used as the oxide 530, the carrier density of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, still further preferably lower than $1\times10^{13}$ cm$^{-3}$, still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used as the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

Note that the layer is not limited to be formed between the conductor 542 and the oxide 530b. For example, the layer is formed between the conductor 542 and the oxide 530c in some cases. Alternatively, the layer is formed between the conductor 542 and the oxide 530b and between the conductor 542 and the oxide 530c in some cases.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic proportion of the element M in the constituent elements in the metal oxide used as the oxide 530a is preferably greater than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 1:1:1 [atomic ratio] is used. As the oxide 530c, a metal oxide with In:Ga:Zn=1:3:4 [atomic ratio], Ga:Zn=2:1 [atomic ratio], or Ga:Zn=2:5 [atomic ratio] is used. Specific examples of the oxide 530c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio], and a stacked-layer structure of gallium oxide and In:Ga:Zn=4:2:3 [atomic ratio].

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

Note that semiconductor materials that can be used as the oxide 530 is not limited to the above metal oxides. A semiconductor material which has a band gap (a semiconductor material that is not a zero-gap semiconductor) can be used as the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

In this specification and the like, the layered material is a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used as a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used as the oxide 530 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), zirconium selenide ($ZrSe_2$).

The conductor 542a and the conductor 542b functioning as the source electrode and the drain electrode are provided over the oxide 530b. As the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 27, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as shown in FIG. 27A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used as the insulator 544.

As the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as the first gate insulating film. The insulator 550 is preferably positioned in contact with the inner side (the top surface and a side surface) of the metal oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably within the range of 1 nm to 20 nm.

To efficiently supply excess oxygen contained in the insulator 550 to the oxide 530, a metal oxide may be provided between the insulator 550 and the conductor 560. The metal oxide preferably has a function of inhibiting oxygen diffusion from the insulator 550 into the conductor 560. Providing the metal oxide that has a function of inhibiting diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. As the metal oxide, a material that can be used as the insulator 544 is used.

Note that the insulator 550 may have a stacked-layer structure like the second gate insulating film. With miniaturization and high integration of transistors, a problem such as leakage current may arise because of a thinner gate insulating film. When the insulator functioning as the gate insulating film has a stacked-layer structure of a high-k material and a thermally stable material, a gate voltage at the time when the transistor operates can be reduced while the physical thickness is maintained. Furthermore, the stacked-layer structure can be thermally stable and have a high dielectric constant.

Although the conductor 560 functioning as the first gate electrode has a two-layer structure in FIG. 27A and FIG. 27B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. As the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used as the conductor 560b. Furthermore, the conductor 560b also functions as a wiring and thus is preferably a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided to have a region which is in contact with the oxide 530c, oxygen in the insulator 580 can be efficiently supplied to the oxide 530a and the oxide 530b through the oxide 530c. Note that the concentration of impurities such as water or hydrogen in the insulator 580 is preferably lowered.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness within the range of 0.5 nm to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that are described later.

An insulator 582 is provided over the insulator 581. A substance having a barrier property against oxygen or hydrogen is preferably used as the insulator 582. Therefore, a material similar to that to the insulator 514 can be used as the insulator 582. As the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used as a protective film of the transistor 500.

An insulator 586 is provided over the insulator 582. As the insulator 586, a material similar to that to the insulator 320 can be used. Furthermore, when a material with a comparatively low permittivity is used as these insulators, parasitic capacitance generated between wirings can be reduced. A silicon oxide film, a silicon oxynitride film, or the like can be used as the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 390. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that to the insulator 522, for example.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 25, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that to the insulator 320. In addition, the insulator 640 may function as a planarization film that covers an uneven shape therebelow.

With the use of this structure, a semiconductor device using a transistor including an oxide semiconductor can be miniaturized or highly integrated.

Figure 28A:
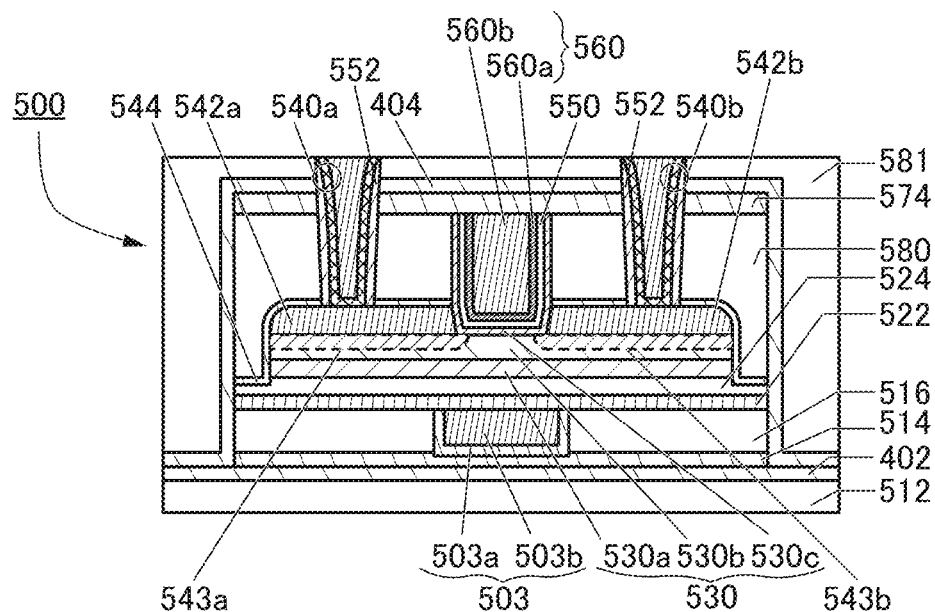
FIG. 28A and FIG. 28B are diagrams showing a structure example of a transistor.
Figure 28B:
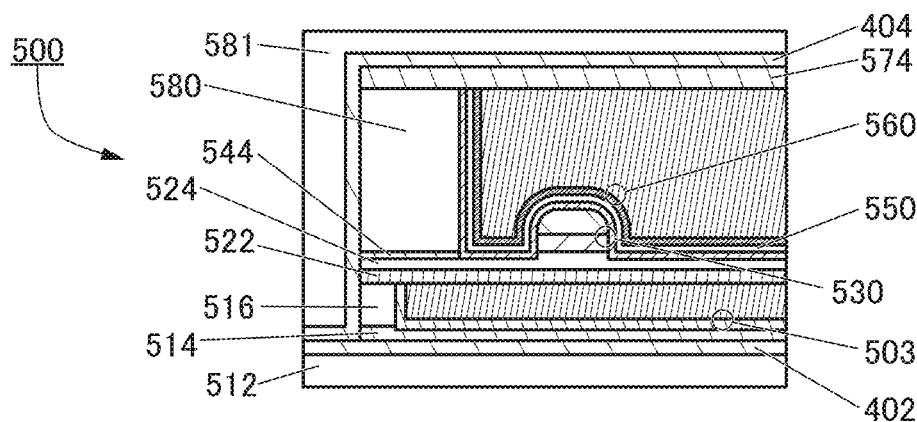

FIG. 28A and FIG. 28B are modified examples of the transistor 500 shown in FIG. 27A and FIG. 27B. FIG. 27A is a cross-sectional view of the transistor 500 in the channel length direction and FIG. 27B is a cross-sectional view of the transistor 500 in the channel width direction. Note that the structure shown in FIG. 28A and FIG. 28B can also be employed to other transistors, such as the transistor 390, included in the semiconductor device of one embodiment of the present invention.

FIG. 28A is a cross-sectional view in the channel length direction of the transistor 500, and FIG. 28B is a cross-sectional view in the channel width direction of the transistor 500. The transistor shown in FIG. 28A and FIG. 28B includes the insulator 402 and the insulator 404, which is different from the transistor 500 in FIG. 27A and FIG. 27B. Furthermore, the transistor 500 in FIG. 28A and FIG. 28B has an insulator 552 provided to be in contact with a side surface of the conductor 540a and an insulator 552 provided to be in contact with a side surface of the conductor 540b, which is different from the transistor 500 in FIG. 27A and FIG. 27B. Moreover, the transistor 500 in FIG. 28A and FIG. 28B does not include the insulator 520, which is different from the transistor 500 in FIG. 27A and FIG. 27B.

The transistor 500 in FIG. 28A and FIG. 28B has the insulator 402 provided over the insulator 512. The insulator 404 is provided over the insulator 574 and the insulator 402.

In the transistor 500 having the structure in FIG. 28A and FIG. 28B, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 402. Thus, the oxide 530 and the like are isolated from the outside by the insulator 404 and the insulator 402.

The insulator 402 and the insulator 404 preferably have high capability of inhibiting diffusion of hydrogen (e.g., at least one of a hydrogen atom, a hydrogen molecule, and the like) or a water molecule. For example, as the insulator 402 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used as the insulator 552 because of its high hydrogen barrier property. The use of a material having a high hydrogen barrier property as the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Figure 29:
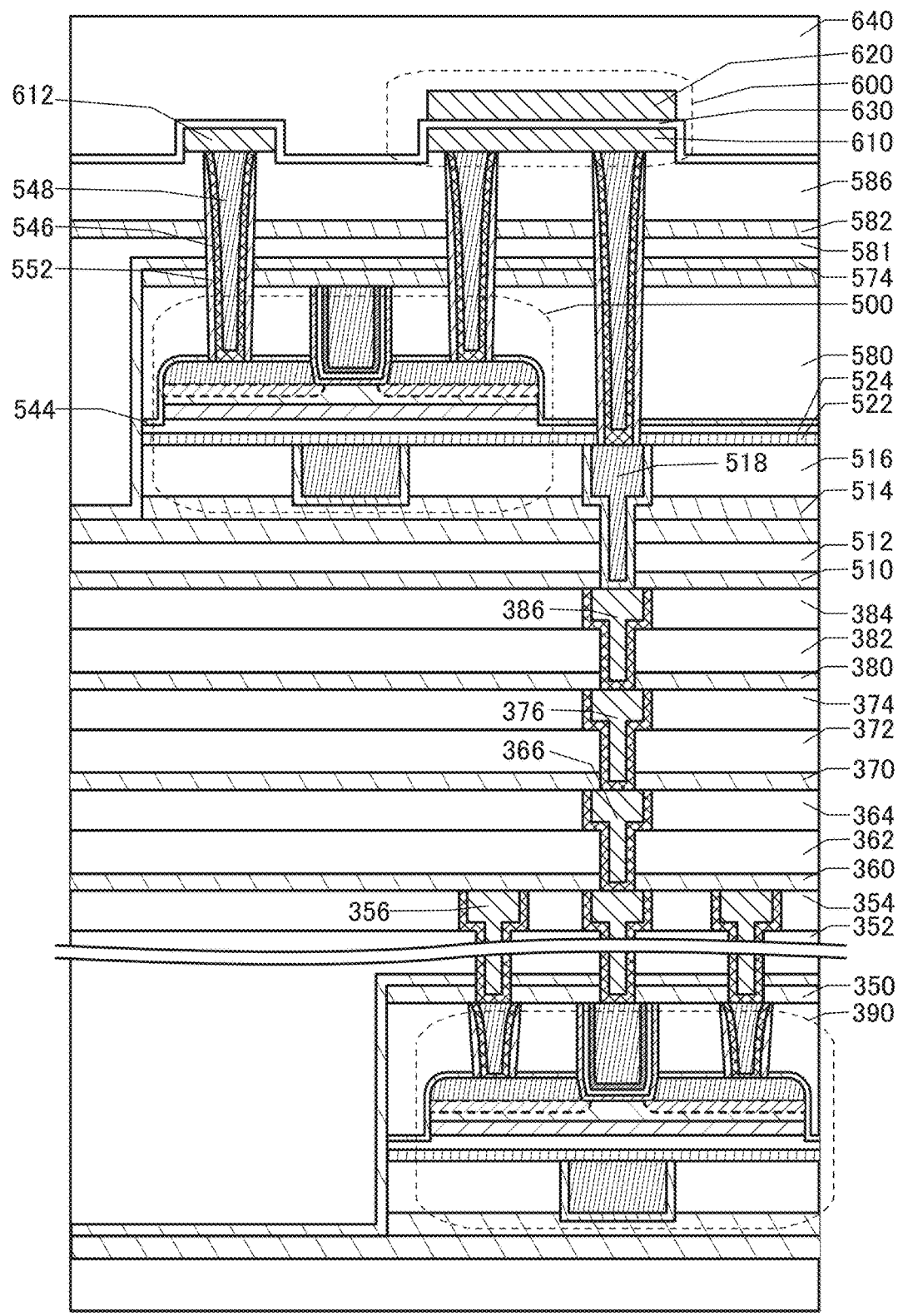
FIG. 29 is a diagram showing a structure example of a semiconductor device.

FIG. 29 is a cross-sectional view showing a structure example of the semiconductor device in the case where the transistors 500 and 390 have the structure shown in FIG. 28A and FIG. 28B. The insulator 552 is provided on a side surface of the conductor 546.

Figure 30A:
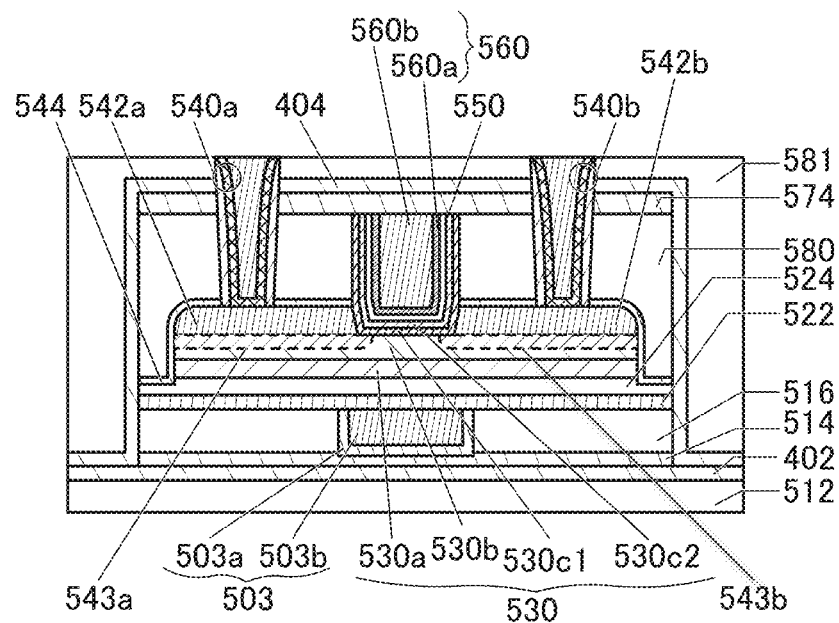
FIG. 30A and FIG. 30B are diagrams showing a structural example of a transistor.
Figure 30B:
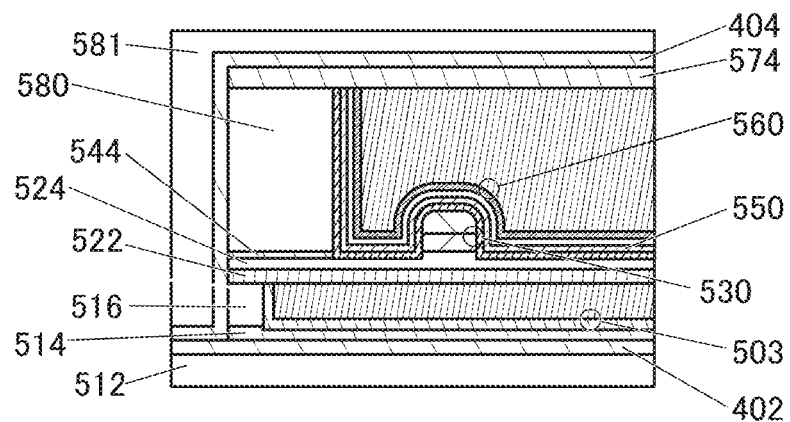

FIG. 30A and FIG. 30B are modified examples of the transistor shown in FIG. 28A and FIG. 28B. FIG. 30A shows a cross-sectional view of the transistor in the channel length direction and FIG. 30B shows a cross-sectional view of the transistor in the channel width direction. The transistor shown in FIG. 30A and FIG. 30B includes the oxide 530c which has a two-layer structure of the oxide 530c1 and the oxide 530c2, which is different from the transistor shown in FIG. 28A and FIG. 28B.

The oxide 530c1 is in contact with the top surface of the insulator 524, a side surface of the oxide 530a, the top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. As the oxide 530c2, it is possible to use a material similar to a material used as the oxide 530c when the oxide 530c has a single-layer structure. As the oxide 530c2, a metal oxide with In:Ga:Zn=1:3:4 [atomic ratio], Ga:Zn=2:1 [atomic ratio], or Ga:Zn=2:5 [atomic ratio] can be used, for example.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor shown in FIG. 27A and FIG. 27B can also be a two-layer structure of the oxide 530c1 and the oxide 530c2.

The transistor shown in FIG. 30A and FIG. 30B can be used as the transistor 390, for example. As described above, the OS transistor shown in FIG. 26 in the above embodiment can be used as the transistor 390. When the transistor has a function of an output transistor, the on-state current of the OS transistor can be increased, which can increase the accuracy of the output voltage from the semiconductor device of one embodiment of the present invention. Note that the structure shown in FIG. 30A and FIG. 30B can also be employed for other transistors than the transistor 390, such as the transistor 500, included in the semiconductor device of one embodiment of the present invention.

Figure 31:
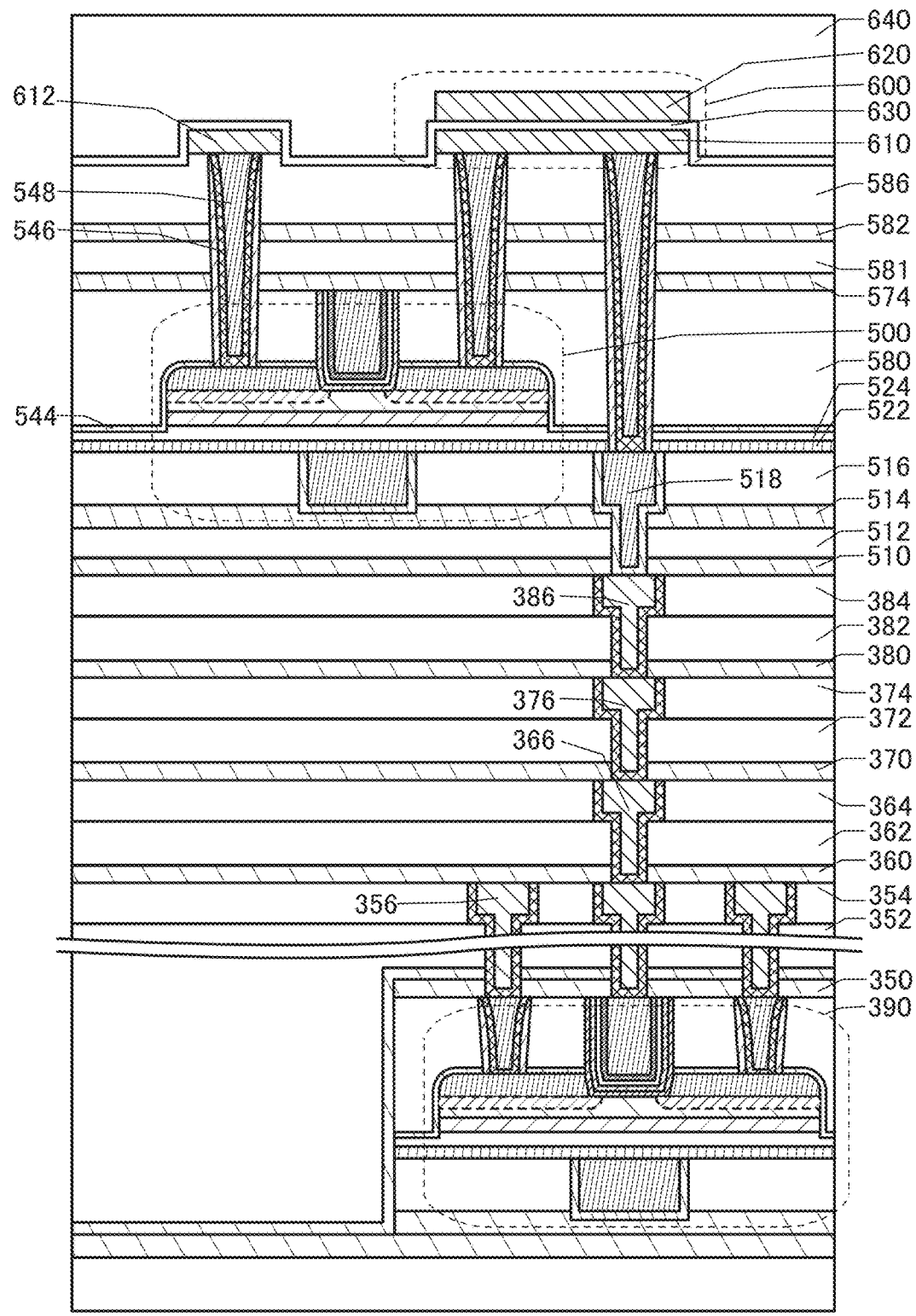
FIG. 31 is a diagram showing a structure example of a semiconductor device.

FIG. 31 is a cross-sectional view of the structure example of a semiconductor device showing the transistor 500 whose structure is the structure shown in FIG. 27A and FIG. 27B, and the transistor 390 whose structure is the structure shown in FIG. 30A and FIG. 30B. The insulators 552 are provided on a side surface of the conductor 546, which is the same as FIG. 29. As shown in FIG. 31, both of the transistor 390 and the transistor 500 can be OS transistors, and the transistor 390 and the transistor 500 can have different structures with each other.

This embodiment can be implemented in an appropriate combination with the structures described in the other embodiments and the like.

Example

In this example, a transistor was formed using a technology of a 360 nm Top-gate self-aligned CAAC-IGZO FET stacked on a Si wafer. The top-gate self-aligned structure reduced an overlap between a top gate and a source or a drain and reduced parasitic capacitance due to an overlap. This smaller parasitic capacitance can reduce charge injection and feedthrough and increase the sampling accuracy of a sample-and-hold circuit. As a control method of a gate of a CAAC-IGZO transistor, a Dual-gate type or a Back-gate type was used, and the gates were fabricated within the same substrate. The front gate at the top and the back gate at the bottom are connected in the dual-gate type. The dual-gate type has better gate controllability than a single-gate type, i.e., higher on-state current and lower off-state current than a single-gate type. The back-gate type can control the voltages of the front gate and the back gate independently. A negative voltage is applied to the back gate of the back-gate type, whereby the threshold voltage can be shifted positively, that is, a low off-state current can be exhibited. The dual-gate transistor was used in a circuit other than a sample-and-hold circuit, such as a comparator circuit to achieve high gain due to its high on-state current. The back-gate transistor was used in the sample-and-hold circuit to achieve long holding time.

Figure 33A:
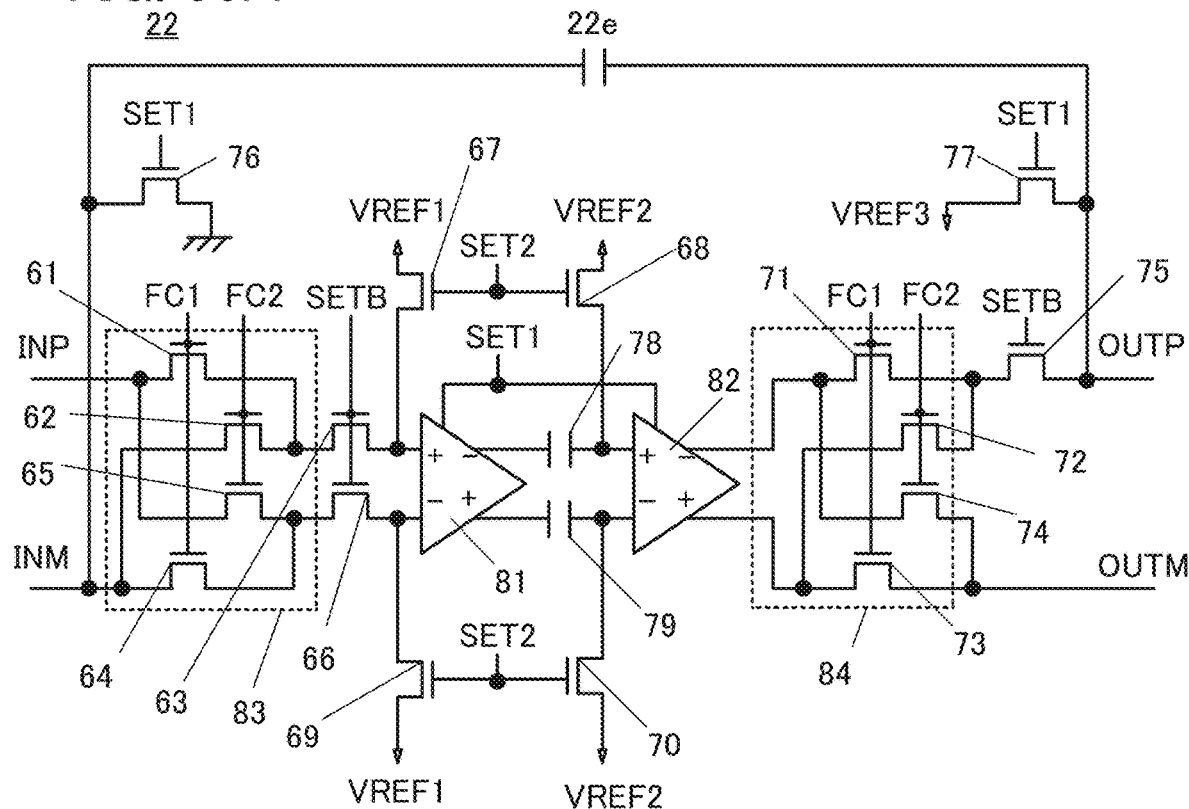
FIG. 33A is a circuit diagram showing an amplifier circuit.

FIG. 33A is a circuit diagram showing in detail the amplifier circuit 22c which corresponds to the made integrated circuit 22. The amplifier circuit 22c includes a transconductance amplifier 81, a transconductance amplifier 82, a transistor 61 to a transistor 77, a capacitor 78, and a capacitor 79. A chopper circuit 83 includes the transistor 61, the transistor 62, the transistor 64, and the transistor 65, and a chopper circuit 84 includes the transistor 71 to the transistor 74.

The amplifier circuit 22c has an offset-cancel function. An offset-correcting voltage is supplied to the capacitor 78 and the capacitor 79 in the period when VREF1 is supplied to the input of the transconductance amplifier 81 at the first stage, whereby the offset component of the transconductance amplifier 81 can be canceled. In addition, chopper circuits are provided to the input of the transconductance amplifier 81 and the output of transconductance amplifier 82 in order to add a function of canceling the offset component of the amplifier circuit 22c.

Electrical connections of the amplifier circuit 22c are described. The amplifier circuit 22c includes an input terminal INP (an input terminal 22a in FIG. 5), an input terminal INM (an input terminal 22f in FIG. 5), an output terminal OUTP (an input terminal 22b in FIG. 5), and an output terminal OUTM. The input terminal INP is electrically connected to one of the source and the drain of the transistor 61 and one of the source and the drain of the transistor 65. The input terminal INM is electrically connected to one of the source and the drain of the transistor 64 and one of the source and the drain of the transistor 62. The other of the source and the drain of the transistor 61 is electrically connected to one of the source and the drain of a transistor 63 and one of the source and the drain of the transistor 62. The other of the source and the drain of the transistor 64 is electrically connected to one of the source and the drain of a transistor 66 and one of the source and the drain of the transistor 65. The wiring FC1 is electrically connected to the gate of the transistor 61 and the gate of the transistor 64. The wiring FC2 is electrically connected to the gate of the transistor 62 and the gate of the transistor 65. A wiring SETB is electrically connected to the gate of the transistor 63 and the gate of the transistor 66.

The other of the source and the drain of the transistor 63 is electrically connected to the non-inverting input terminal of the transconductance amplifier 81 and one of the source and the drain of the transistor 67. The other of the source and the drain of the transistor 66 is electrically connected to the inverting input terminal of the transconductance amplifier 81 and one of the source and the drain of the transistor 69. The inverting output terminal of the transconductance amplifier 81 is electrically connected to the non-inverting input terminal of the transconductance amplifier 82 and one of the source and the drain of the transistor 68 through the capacitor 78. The non-inverting output terminal of the transconductance amplifier 81 is electrically connected to the inverting input terminal of the transconductance amplifier 82 and one of the source and the drain of the transistor 70 through the capacitor 79. A wiring SET2 is electrically connected to the gates of the transistor 67 to the transistor 70. A wiring VREF1 is electrically connected to the other of the source and the drain of the transistor 67 and the other of the source and the drain of the transistor 69. A wiring VREF2 is electrically connected to the other of the source and the drain of the transistor 68 and the other of the source and the drain of the transistor 70.

The inverting output terminal of the transconductance amplifier 82 is electrically connected to one of the source and the drain of the transistor 71 and one of the source and the drain of the transistor 74. The non-inverting output terminal of the transconductance amplifier 82 is electrically connected to one of the source and the drain of the transistor 72 and one of the source and the drain of the transistor 73. The other of the source and the drain of the transistor 71 is electrically connected to the other of the source and the drain of the transistor 72 and one of the source and the drain of the transistor 75. The other of the source and the drain of the transistor 73 is electrically connected to the other of the source and the drain of the transistor 74 and the output terminal OUTM. The wiring FC1 is electrically connected to the gate of the transistor 71 and the gate of the transistor 73. The wiring FC2 is electrically connected to the gate of the transistor 72 and the gate of the transistor 74. The wiring SETB is electrically connected to the gate of the transistor 75.

The other of the source and the drain of the transistor 75 is electrically connected to the output terminal OUTP, one of the source and the drain of the transistor 77 and one electrode of the capacitor 22e. The other of the source and the drain of the transistor 77 is electrically connected to the wiring VREF3. The other electrode of the capacitor 22e is electrically connected to one of the source and the drain of the transistor 76 and the input terminal INM. The other of the source and the drain of the transistor 76 is electrically connected to a common wiring GND. A wiring SET1 is electrically connected to the gate of the transistor 76 and the gate of the transistor 77.

Figure 33B:
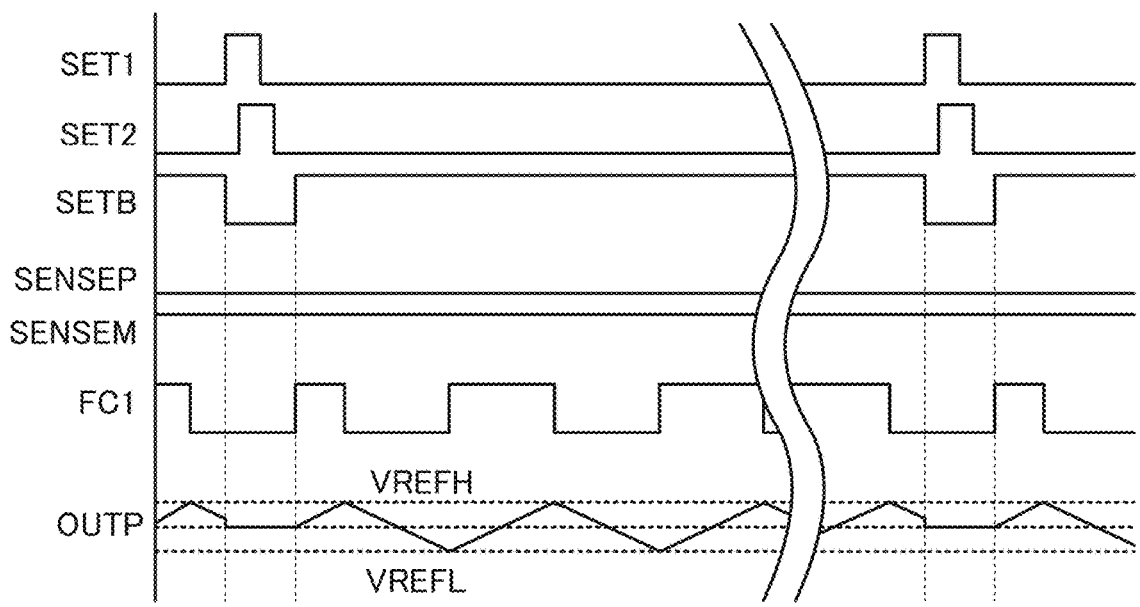
FIG. 33B is a diagram showing a timing chart.

FIG. 33B is a timing chart describing operations of the amplifier circuit 22c in FIG. 33A. The signal supplied to the wiring SET1 initializes the capacitor 22a. The signal supplied to the wiring SET1 also supplies certain voltages to sample hold circuits of the transconductance amplifier 81 and the transconductance amplifier 82. Thus, the signal supplied to the wiring SET1 writes to a sample hold circuit the current value in the period when the transconductance amplifier 81 and the transconductance amplifier 82 output High. A voltage generated at one electrode of the resistor 41 shown in FIG. 3 is supplied through the terminal 10a to the terminal INP (terminal 10a in FIG. 3) as a signal SENSEP. A voltage generated at the other electrode of the resistor 41 shown in FIG. 3 is supplied through the terminal 10d to the terminal INM (terminal 10d in FIG. 3) as a signal SENSEM.

A wiring SET2 is supplied with a signal which is delayed from the signal supplied to the wiring SET1. With the signal supplied to the wiring SET2, the offset component of the transconductance amplifier 81 is written to the capacitor 78 or the capacitor 79. Thus, the signal supplied to the wiring SETB is preferably LOW in the period when the offset component of the transconductance amplifier 81 is written to the capacitor 78 or the capacitor 79.

The wiring FC1 is supplied with the inverted signal of the signal supplied to the wiring FC2 (not shown in the timing chart in FIG. 33B). When the signal supplied to the wiring FC1 is LOW, the amplifier circuit 22c functions as an integrator circuit in which the voltage stored in the capacitor 22e gradually decreases. When the signal supplied to the wiring FC1 is HIGH, the amplifier circuit 22c functions as an integrator circuit in which the voltage stored in the capacitor 22e gradually increases. The integrator circuit 22 is initialized by the signals supplied to the wiring SET1, the wiring SET2, and the wiring SETB.

Figure 34A:
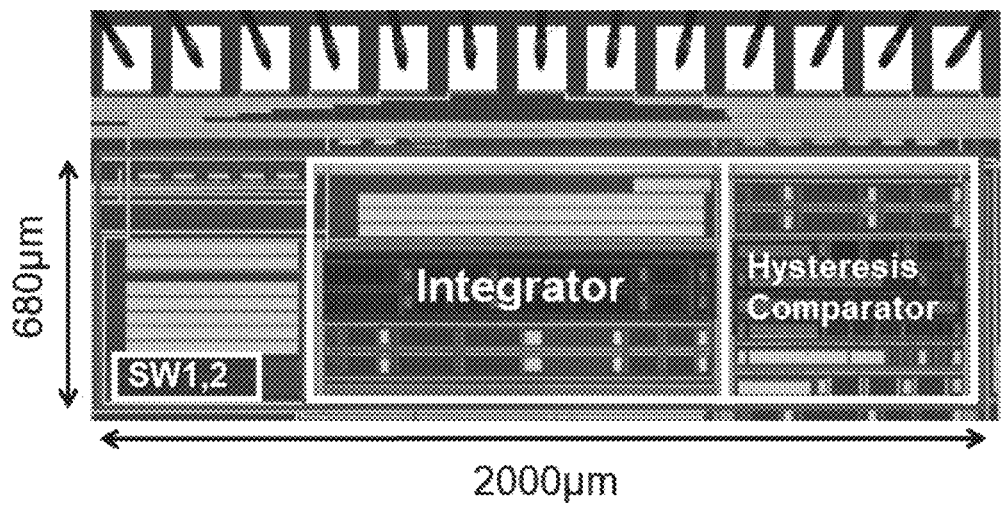
FIG. 34A is a photograph of a chip.
Figure 34B:
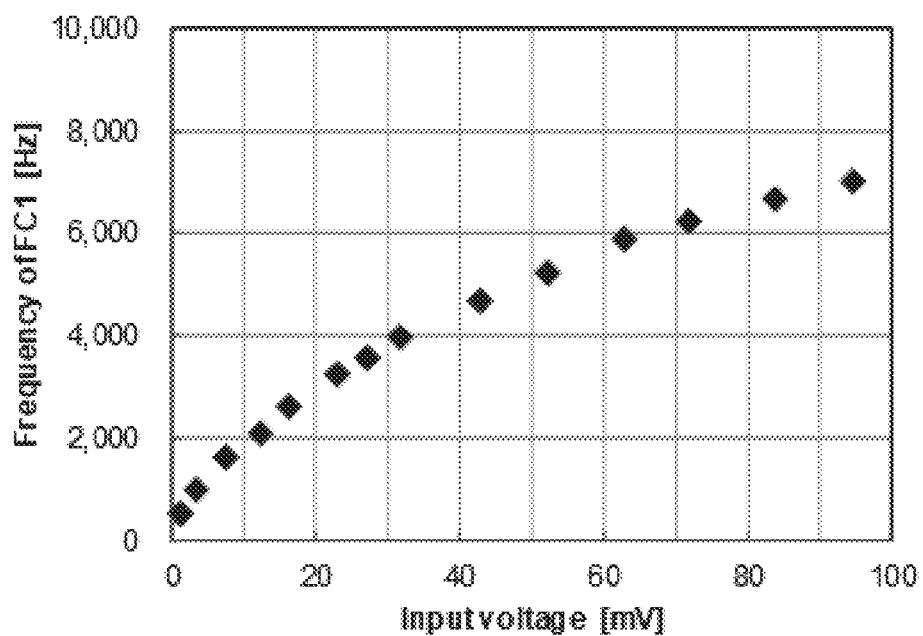
FIG. 34B is a diagram showing electrical characteristics of a semiconductor device.

FIG. 34A is a photograph of a chip. The chip is the actually made semiconductor device detecting deterioration of a secondary battery. FIG. 34B shows the output frequency (Frequency of FC1) with respect to the input voltage (Input voltage). The output frequency was confirmed to increase monotonically in accordance with the input voltage. When the input voltage becomes high, the linear property might be lost; when correction data is obtained in advance, a digital circuit can correct it. By making a current monitor circuit including only OS transistors, an amplifier with a high amplification factor including a sample hold circuit with a small leak current was achieved and the GND-level signal was detected.

REFERENCE NUMERALS

Bias1: judge voltage, Bias2: judge voltage, R1: resistor, R2: resistor, R3: resistor, R4: resistor, S1: switch, S2: switch, SW1: switch, SW3: switch, 10: circuit, 11: output circuit, 12: output circuit, 15: capacitor, 20: power gauge, 21: current divider circuit, 22: integrator circuit, 22c: amplifier circuit, 22d: resistor, 22e: capacitor, 23: comparator, 23e: amplifier circuit, 23f: amplifier circuit, 23g: circuit, 23h: circuit, 30: anomalous current detection circuit, 31a: amplifier circuit, 31b: switch, 31c: switch, 31d: capacitor, 31e: capacitor, 32a: memory, 32b: memory, 40: circuit, 41: resistor, 42: secondary battery, 43: resistor, 44: resistor, 52: wiring, 53: wiring, 54: wiring, 100: positive electrode active material, 211a: positive electrode, 211b: negative electrode, 212a: lead, 212b: lead, 214: separator, 215a: bonding portion, 215b: bonding portion, 217: fixing member, 250: secondary battery, 251: exterior body, 262: seal portion, 263: seal portion, 300: secondary battery, 301: positive electrode can, 302: negative electrode can, 303: gasket, 304: positive electrode, 305: positive electrode current collector, 306: positive electrode active material layer, 307: negative electrode, 308: negative electrode current collector, 309: negative electrode active material layer, 310: separator, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 390: transistor, 402: insulator, 404: insulator, 500: transistor, 503: conductor, 503a: conductor, 503b: conductor, 510: insulator, 512: insulator, 514: insulator, 516: insulator, 518: conductor, 520: insulator, 522: insulator, 524: insulator, 526: insulator, 530: oxide, 530a: oxide, 530b: oxide, 530c: oxide, 530c1: oxide, 530c2: oxide, 540a: conductor, 540b: conductor, 542: conductor, 542a: conductor, 542b: conductor, 543a: region, 543b: region, 544: insulator, 546: conductor, 548: conductor, 550: insulator, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 700: secondary battery, 701: positive electrode current collector, 702: positive electrode active material layer, 703: positive electrode, 704: negative electrode current collector, 705: negative electrode active material layer, 706: negative electrode, 707: separator, 708: electrolyte, 709: exterior body, 710: positive electrode lead electrode, 711: negative electrode lead electrode, 800: secondary battery, 801: positive electrode cap, 802: battery can, 803: positive electrode terminal, 804: positive electrode, 805: separator, 806: negative electrode, 807: negative electrode terminal, 808: insulating plate, 809: insulating plate, 811: PTC element, 812: safety valve mechanism, 813: conductive plate, 814: conductive plate, 815: module, 816: wiring, 817: temperature control device, 900: circuit board, 910: label, 911: terminal, 912: circuit, 913: secondary battery, 914: antenna, 915: antenna, 918: antenna, 920: display device, 921: sensor, 922: terminal, 930: housing, 930$a$: housing, 930$b$: housing, 931: negative electrode, 932: positive electrode, 933: separator, 950: wound body, 951: terminal, 952: terminal, 980: secondary battery, 981: film, 982: film, 993: wound body, 994: negative electrode, 995: positive electrode, 996: separator, 997: lead electrode, 998: lead electrode, 7100: portable display device, 7101: housing, 7102: display portion, 7103: operation button, 7104: secondary battery, 7200: portable information terminal, 7201: housing, 7202: display portion, 7203: band, 7204: buckle, 7205: operation button, 7206: input output terminal, 7207: icon, 7300: display device, 7304: display portion, 7400: mobile phone, 7401: housing, 7402: display portion, 7403: operation button, 7404: external connection port, 7405: speaker, 7406: microphone, 7407: secondary battery, 7500: electric cigarette, 7501: atomizer, 7502: cartridge, 7504: secondary battery, 8000: display device, 8001: housing, 8002: display portion, 8003: speaker portion, 8004: secondary battery, 8021: charging device, 8022: cable, 8024: secondary battery, 8100: lighting device, 8101: housing, 8102: light source, 8103: secondary battery, 8200: indoor unit, 8201: housing, 8202: air outlet, 8203: secondary battery, 8204: outdoor unit, 8300: electric refrigerator-freezer, 8301: housing, 8302: door for refrigerator compartment, 8303: door for freezer compartment, 8304: secondary battery, 8400: automobile, 8401: headlight, 8406: electric motor, 8500: automobile, 8600: scooter, 8601: side mirror, 8602: secondary battery, 8603: direction indicator, 8604: underseat storage, 9600: tablet terminal, 9625: switch, 9627: switch, 9628: operation switch, 9630: housing, 9630$a$: housing, 9630$b$: housing, 9631: display portion, 9631$a$: display portion, 9631$b$: display portion, 9633: solar cell, 9634: charge and discharge control circuit, 9635: power storage unit, 9636: DCDC converter, 9637: converter, 9640: movable portion

The invention claimed is:

1. A semiconductor device comprising a first circuit and a second circuit,
   wherein the first circuit comprises a power gauge and an anomalous current detection circuit,
   wherein the power gauge comprises a current divider circuit and an integrator circuit,
   wherein the anomalous current detection circuit comprises a first memory, a second memory, and a first comparator,
   wherein the integrator circuit is configured to convert a detection current detected at the current divider circuit into a detection voltage by integrating the detection current,
   wherein the anomalous current detection circuit is configured to be supplied with the detection voltage, a first signal at a first time, and a second signal at a second time,
   wherein the anomalous current detection circuit is configured to store the detection voltage at the first time in the first memory using the first signal,
   wherein the anomalous current detection circuit is configured to store the detection voltage at the second time in the second memory using the second signal, and
   wherein the first comparator is configured to output a change from the detection voltage at the first time to the detection voltage at the second time as a first output signal to the second circuit.

2. The semiconductor device according to claim 1,
   wherein the first comparator is configured to output the first output signal to the second circuit when the detection voltage stored in the first memory is larger than the detection voltage stored in the second memory, and
   wherein the first comparator is configured to invert the first output signal to output it to the second circuit when the detection voltage stored in the second memory is larger than the detection voltage stored in the first memory.

3. The semiconductor device according to claim 1,
   wherein the power gauge comprises a second comparator having a hysteresis property,
   wherein the second comparator is configured to judge the detection voltage using a first judge voltage and a second judge voltage,
   wherein an output signal of the second comparator is configured to invert an output polarity of the current divider circuit when the detection voltage is smaller than the first judge voltage,
   wherein the output signal of the second comparator is configured to invert the output polarity of the current divider circuit when the detection voltage is larger than the second judge voltage, and
   wherein the output signal of the second comparator is output to the second circuit.

4. The semiconductor device according to claim 3, wherein the second circuit is configured to generate the first signal and the second signal from the output signal of the second comparator.

5. The semiconductor device according to claim 3,
   wherein the second circuit is configured to set a predetermined time, and
   wherein the second circuit is configured to output the first signal or the second signal after the predetermined time from a change moment of the output signal of the second comparator.

6. The semiconductor device according to claim 1, wherein the second circuit is one of a control circuit and a processor.

7. The semiconductor device according to claim 1,
   wherein the semiconductor device comprises a transistor, and
   wherein the transistor comprises an oxide semiconductor in its channel formation region.

8. A battery pack comprising:
   the semiconductor device according to claim 1, provided over a flexible substrate, and
   a secondary battery.

* * * * *